US008338998B2

(12) United States Patent
Yamasaki et al.

(10) Patent No.: US 8,338,998 B2
(45) Date of Patent: Dec. 25, 2012

(54) ELECTRONIC CIRCUIT-INTEGRATED MOTOR APPARATUS

(75) Inventors: Masashi Yamasaki, Obu (JP); Hideki Kabune, Nagoya (JP); Atsushi Furumoto, Nukata-gun (JP)

(73) Assignee: Denso Corporation, Kariya (JP)

( * ) Notice: Subject to any disclaimer, the term of this patent is extended or adjusted under 35 U.S.C. 154(b) by 184 days.

(21) Appl. No.: 12/822,627

(22) Filed: Jun. 24, 2010

(65) Prior Publication Data

US 2011/0018374 A1 Jan. 27, 2011

(30) Foreign Application Priority Data

Jun. 24, 2009 (JP) ................................. 2009-149650
Jan. 26, 2010 (JP) ................................. 2010-14436

(51) Int. Cl.
*H02K 9/00* (2006.01)
*H02K 11/00* (2006.01)

(52) U.S. Cl. .......... 310/64; 310/68 A; 310/68 R; 310/71

(58) Field of Classification Search ................ 310/68 D, 310/64, 68 R, 68 A
See application file for complete search history.

(56) References Cited

U.S. PATENT DOCUMENTS

| | | | | |
|---|---|---|---|---|
| 6,321,563 | B1 * | 11/2001 | Ikeda et al. | 62/505 |
| 6,577,030 | B2 * | 6/2003 | Tominaga et al. | 310/68 B |
| 6,828,703 | B2 * | 12/2004 | Einheuser et al. | 310/68 D |
| 7,075,201 | B2 * | 7/2006 | Takahashi et al. | 310/68 D |
| 7,207,187 | B2 * | 4/2007 | Funahashi et al. | 62/228.4 |
| 7,290,638 | B2 * | 11/2007 | Shiino et al. | 180/444 |
| 7,541,703 | B2 * | 6/2009 | Uehara et al. | 310/68 D |
| 7,638,910 | B2 * | 12/2009 | Akita et al. | 310/68 D |
| 2004/0090130 | A1 | 5/2004 | Kaneko et al. | |
| 2005/0167183 | A1 | 8/2005 | Tominaga et al. | |
| 2007/0257568 | A1 * | 11/2007 | Akita et al. | 310/64 |
| 2010/0117466 | A1 * | 5/2010 | Gas et al. | 310/62 |

FOREIGN PATENT DOCUMENTS

| | | | |
|---|---|---|---|
| JP | 10-234158 | | 9/1998 |
| JP | 10-322973 | | 12/1998 |
| JP | 2002-345211 | | 11/2002 |
| JP | 2006149038 | A * | 6/2006 |
| JP | 2008211945 | A * | 9/2008 |
| WO | WO 2010/150527 | | 12/2010 |
| WO | WO 2010/150528 | | 12/2010 |

(Continued)

OTHER PUBLICATIONS

JPO Machine Translation, JP 2008-211945, Vehicle Drive Device, Feb. 10, 2012, http://dossier.ipdl.inpit.go.jp/text_trans.html.*

(Continued)

*Primary Examiner* — Quyen Leung
*Assistant Examiner* — Thomas Truong
(74) *Attorney, Agent, or Firm* — Nixon & Vanderhye PC

(57) ABSTRACT

An electronic circuit including semiconductor modules and capacitors is positioned in the axial direction of a motor. Each semiconductor module is longitudinally positioned in contact with a heat sink. More specifically, a line perpendicular to the surface of a semiconductor chip included in the semiconductor module is perpendicular to the axis line of the motor. Consequently, each capacitor is positioned so that at least a part of the positional range of the capacitor in the axial direction of the motor coincides with the positional ranges of the semiconductor module and the heat sink in the axial direction.

31 Claims, 65 Drawing Sheets

FOREIGN PATENT DOCUMENTS

| | | |
|---|---|---|
| WO | WO 2010/150529 | 12/2010 |
| WO | WO 2010/150530 | 12/2010 |

OTHER PUBLICATIONS

U.S. Appl. No. 12/822,412, Minato et al, filed Jun. 24, 2010.
U.S. Appl. No. 12/822,396, Yamasaki et al, filed Jun. 24, 2010.
U.S. Appl. No. 12/822,403, Fujita et al, filed Jun. 24, 2010.
U.S. Appl. No. 12/822,614, Fujita et al, filed Jun. 24, 2010.
U.S. Appl. No. 12/822,635, Miyachi et al, filed Jun. 24, 2010.
U.S. Appl. No. 12/822,381, Iwai et al, filed Jun. 24, 2010.

* cited by examiner

ELECTRONIC CIRCUIT-INTEGRATED MOTOR APPARATUS

CROSS REFERENCES TO RELATED APPLICATIONS

This application is based on and incorporates herein by reference Japanese Patent Applications No. 2009-149650 filed on Jun. 24, 2009 and No. 2010-14436 filed on Jan. 26, 2010.

FIELD OF ME INVENTION

The present invention relates to an electronic circuit-integrated motor apparatus, in which a motor and an electronic circuit are integrated.

BACKGROUND OF THE INVENTION

An electric assist apparatus, which electrically generates torque, has been proposed as a mechanism that assists a steering operation of a vehicle in place of a hydraulic assist apparatus, which hydraulically generates torque. The electric assist apparatus provides assist, differently from the hydraulic assist apparatus, only when a driver of the vehicle performs a steering operation.

A brushless motor that is rotationally driven when, for instance, a three-phase alternating current is applied to it is used as a motive power source for the electric assist apparatus. When such a brushless motor is used, coil currents differing in phase are supplied to multi-phase (e.g., three-phase) coils. Therefore, AC outputs differing in phase need to be produced from a DC output having a predetermined voltage (e.g., 12 V). Consequently, it is necessary to use an electronic circuit for selecting a coil current. The electronic circuit includes, for instance, semiconductor modules that provide a switching function, and a microcomputer that provides overall control. It has been proposed that the electronic circuit be positioned near the motor. The semiconductor modules described, for instance, in patent documents 1 and 2 are disposed in the axial direction of the motor. The semiconductor modules described, for instance, in patent document 3 are disposed around a stator that is a part of the motor.

Patent document 1: JP10-234158A
Patent document 2: JP10-322973A
Patent document 3: JP2004-159454A The electric assist apparatus uses a relatively large motor in order to provide sufficient torque. Thus, the semiconductor modules are large-sized. Further, the electronic circuit generally includes a large-sized capacitor (e.g., aluminum electrolytic capacitor) in order to prevent a semiconductor chip from being damaged by a switching-induced surge voltage.

In recent years, however, various apparatuses are mounted in a vehicle in addition to the electric assist apparatus. Therefore, it is now important that the space necessary for installing various apparatuses be secured. It is thus increasingly demanded that the motor for the electric assist apparatus be reduced in size.

In this respect, the motor disclosed in patent document 2 is large in axial physical size because it includes a cooling fan.

The motor disclosed in patent document 3 is small in axial physical size because the semiconductor modules are disposed around the stator. However, this motor is large in radial physical size. In addition, the radial physical size is further increased in a situation where a cylindrical smoothing capacitor has to be used (although a flat smoothing capacitor is used for the motor).

In the electric assist apparatus that uses a relatively large motor as described above, the semiconductor modules used for the motor generate a relatively large amount of heat. As such being the case, it is demanded that the motor be reduced in size and improved in heat release performance.

If the semiconductor modules are disposed on the surface of a metal member in the same manner as the semiconductor modules for the motor described, for instance, in patent document 1, the heat release performance is degraded by the release of heat from neighboring semiconductor modules.

SUMMARY OF THE INVENTION

It is therefore an object of the present invention to reduce, in an electronic circuit-integrated motor apparatus, in which an electronic circuit for drive control and a motor are integrated, the physical size of the electronic circuit-integrated motor apparatus and improve the heat release performance of semiconductor modules in the electronic circuit.

An electronic circuit-integrated motor apparatus according to the present invention includes a motor, a heat sink that is extended in the same direction as the direction of the centerline of a shaft from an end wall of a motor case, and an electronic circuit that is mounted on the motor case, oriented in the direction of the centerline of the shaft, and positioned toward the heat sink to provide drive control of the motor. The electronic circuit includes plural semiconductor modules, each having a semiconductor chip for selecting a coil current flowing in multi-phase coils of the motor. The individual semiconductor modules are vertically disposed in contact with a side wall surface of the heat sink such that a line perpendicular to a semiconductor chip surface is not parallel to the centerline of the shaft. The heat sink has plural side wall surfaces that define different planes. The semiconductor modules are disposed, one by one, relative to the plural side wall surfaces and brought into direct or indirect contact with the side wall surfaces.

BRIEF DESCRIPTION OF THE DRAWINGS

The above and other objects, features, and advantages of the present invention will become more apparent from the following detailed description made with reference to the accompanying drawings. In the drawings.

DETAILED DESCRIPTION OF THE PREFERRED EMBODIMENTS

Embodiments of an electronic circuit-integrated motor apparatus according to the present invention will now be described.

First Embodiment

Figure 1:
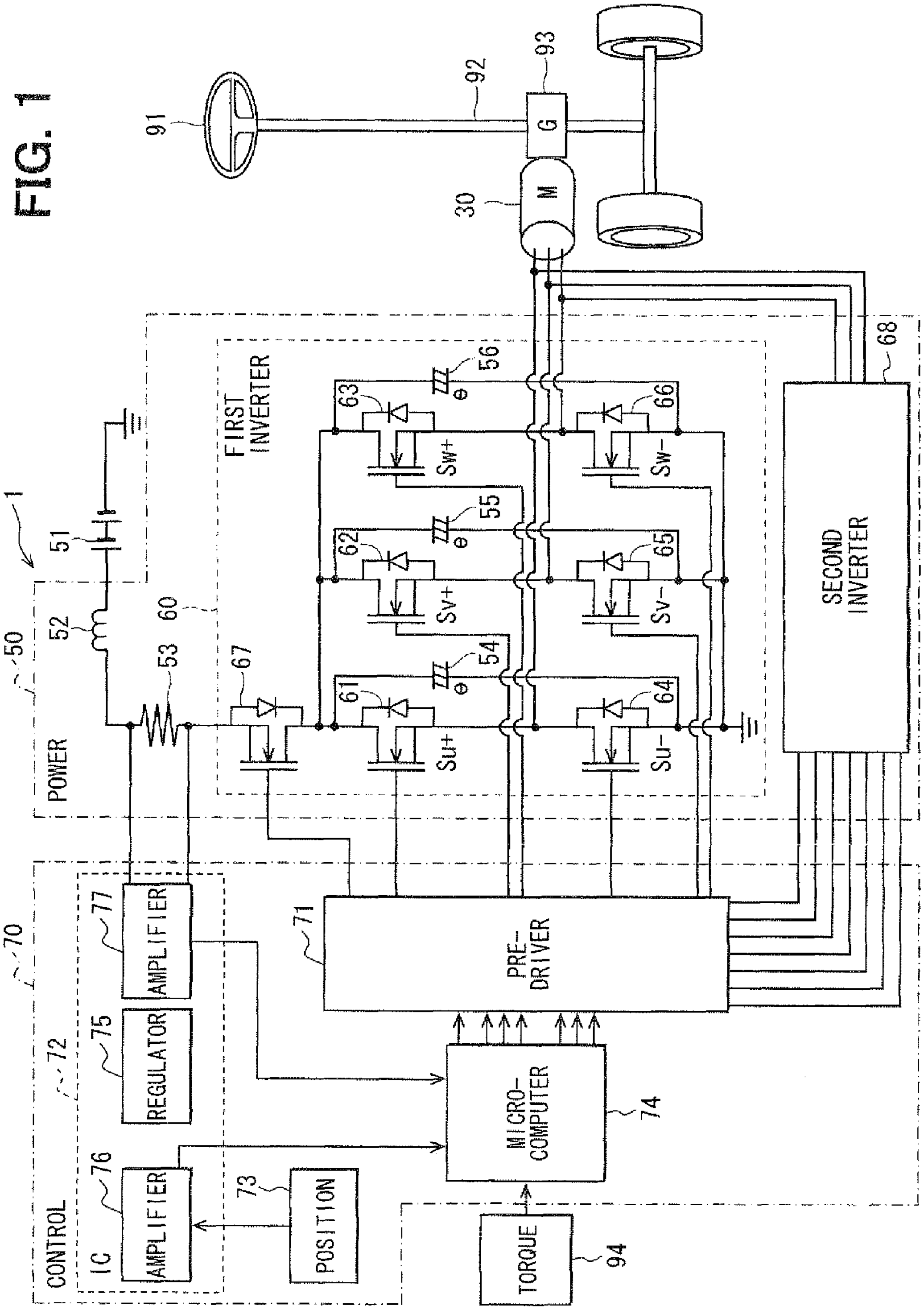
FIG. 1 is a block diagram illustrating an electric power steering unit.

As shown in FIG. 1, an electronic circuit-integrated motor apparatus 1 is used to drive an electric power steering (EPS).

The motor apparatus 1 includes a motor 30, a power circuit 50 and a control circuit 70. The power circuit 50 and the control circuit 70 form an electronic circuit. The motor apparatus 1 provides steering assist to a vehicle's steering wheel 91 by generating a rotary torque for a column shaft 92 through a gear 93 mounted on the column shaft 92, which is a rotating shaft of the steering wheel 91. More specifically, when the steering wheel 91 is operated by a driver, a torque sensor 94 detects a steering torque that is generated for the column shaft 92 as a result of steering wheel operation. Further, vehicle speed information is acquired from a CAN (Controller Area Network), which is not shown, to provide steering assist to the driver who manipulates the steering wheel 91. The use of the above-described mechanism, depending on the employed control method, will make it possible not only to provide steering assist, but also to provide automatic control of operations of the steering wheel 91 for the purpose, for instance, of causing the vehicle to stay in a traveling lane on an expressway or guiding the vehicle into a parking space in a parking lot.

The motor 30 is a brushless motor that rotates the gear 93 in a normal direction and in a reverse direction. The power circuit 50 supplies electrical power to the motor 30. The power circuit 50 includes a choke coil 52, which is positioned in a power supply line from a power source 51, a shunt resistor 53, and a set of two inverter circuits, namely, a first inverter circuit 60 and a second inverter circuit 68.

The first inverter circuit 60 includes MOSFETs (metal-oxide-semiconductor field-effect transistors) 61, 62, 63, 64, 65, 66, 67, which are one of various types of field-effect transistors. The MOSFETs 61-67 are switching elements. More specifically, the path between its source and drain turns on (closes) or turns off (opens) depending on the potential of its gate. As the second inverter circuit 68 has the same configuration as the first inverter circuit 60, only the first inverter circuit 60 will be described below.

The MOSFETs 61-67 are hereinafter abbreviated to the FETs 61-67. The FET 67 closest to the shunt resistor 53 provides protection against reverse connection. More specifically, the FET 67 prevents an electrical current from flowing in a reverse direction when the power source is erroneously connected.

The drains of three FETs 61-63 are connected to a power supply line side. The sources of the FETs 61-63 are respectively connected to the drains of the remaining three FETs 64-66. The sources of the FETs 64-66 are connected to ground. The gates of the six FETs 61-66 are connected to six output terminals of a pre-driver circuit 71 described below. Connection points between the FETs 61-66, which form pairs on a high-potential side and on a low-potential side, are respectively connected to a U-phase coil, a V-phase coil and a W-phase coil of the motor 30.

When the FETs 61-66 need be distinguished from each other, the FETs 61-66 are individually referred to as FET (Su+) 61, FET (Sv+) 62, FET (Sw+) 63, FET (Su−) 64, FET (Sv−) 65 and FET (Sw−) 66.

An aluminum electrolytic capacitor 54 is connected in parallel between the power supply line of the FET (Su+) 61 and the ground of the FET (Su−) 64. Similarly, an aluminum electrolytic capacitor 55 is connected in parallel between the power supply line of the FET (Sv+) 62 and the ground of the FET (Sv−) 65, and an aluminum electrolytic capacitor 56 is connected in parallel between the power supply line of the FET (Sw+) 63 and the ground of the FET (Sw−) 66.

The control circuit 70 includes the pre-driver circuit 71, a custom IC 72, a position sensor 73 and a microcomputer 74. The custom IC 72 includes three functional blocks, namely, a regulator circuit 75, and a position sensor signal amplifier circuit 76, and a detected voltage amplifier circuit 77.

The regulator circuit 75 is a stabilization circuit that stabilizes the power source. The regulator circuit 75 stabilizes the supply of electrical power to various units. For example, the regulator circuit 75 ensures that the microcomputer 74 operates on a predetermined stabilized supply voltage (e.g., 5 V).

The position sensor signal amplifier circuit 76 inputs a signal from the position sensor 73. The position sensor 73 outputs a rotational position signal of the motor 30. The position sensor signal amplifier circuit 76 amplifies the rotational position signal and outputs the amplified rotational position signal to the microcomputer 74.

The detected voltage amplifier circuit 77 detects a voltage across the shunt resistor 53 installed in the power circuit 50, amplifies the detected voltage, and outputs the amplified voltage to the microcomputer 74.

The rotational position signal of the motor 30 and the voltage across the shunt resistor 53 are applied to the microcomputer 74. A steering torque signal is also applied to the microcomputer 74 from the torque sensor 94 mounted on the column shaft 92. In addition, the vehicle speed information is applied to the microcomputer 74 through the CAN.

Upon receipt of the steering torque signal and vehicle speed information, the microcomputer 74 controls the inverter circuit 60 through the pre-driver circuit 71 in accordance with the rotational position signal thereby to provide steering assist to the steering wheel 91 in accordance with vehicle speed. More specifically, the inverter circuit 60 is controlled by turning on or off the FETs 61-66 through the pre-driver circuit 71. As the gates of the six FETs 61-66 are connected to the six output terminals of the pre-driver circuit 71, the pre-driver circuit 71 can change the potentials of the gates.

Further, the microcomputer 74 controls the inverter circuit 60 in accordance with the voltage across the shunt resistor 53, which is input from the detected voltage amplifier circuit 77, so that the electrical current supplied to the motor 30 is similar to a sine wave.

When the inverter circuit 60 is controlled as described above, the choke coil 52 reduces noise generated from the power source 51. The capacitors 54-56 store electrical charge to assist the supply of electrical power to the FETs 61-66 and suppress a surge voltage and other noise components. Even when an erroneous power source connection is made, the capacitors 54-56 will be protected from being damaged because the FET 67 is installed to provide protection against reverse connection.

As described above, the power circuit 50 and the control circuit 70 are necessary for providing drive control of the motor 30. The power circuit 50 and the control circuit 70 form a control unit (ECU).

The motor 30 used for the EPS generates an output of approximately 200 W to 500 W. The area occupied by the power circuit 50 and the control circuit 70 is approximately 20 to 40% of the entire motor apparatus 1. Further, as the motor 30 generates a great output, the power circuit 50 tends to be large in size. Therefore, the power circuit 50 occupies more than 70% of the area occupied by the power circuit 50 and the control circuit 70.

Large parts included in the power circuit 50 are the choke coil 52, the capacitors 54-56, and the FETs 61-67. The FETs 61-67 are configured as six semiconductor modules.

In the present embodiment, the FET (Su+) 61 and the FET (Su−) 64 are configured as semiconductor chips. The semiconductor chips are resin-molded to form one semiconductor module.

Further, the FET (Sv+) 62 and the FET (Sv−) 65 are configured as semiconductor chips. The semiconductor chips are resin-molded to form one semiconductor module.

Furthermore, the FET (Sw+) 63 and the FET (Sw−) 66 are configured as semiconductor chips. The semiconductor chips are resin-molded to form one semiconductor module.

Thus, the first inverter circuit 60 includes three semiconductor modules. The present embodiment includes a total of two inverter circuits 60 and 68. This reduces the electrical current flow in each inverter circuit 60, 68 to half. As the two inverter circuits 60 and 68 are incorporated, the present embodiment includes six semiconductor modules and six capacitors.

Figure 2:
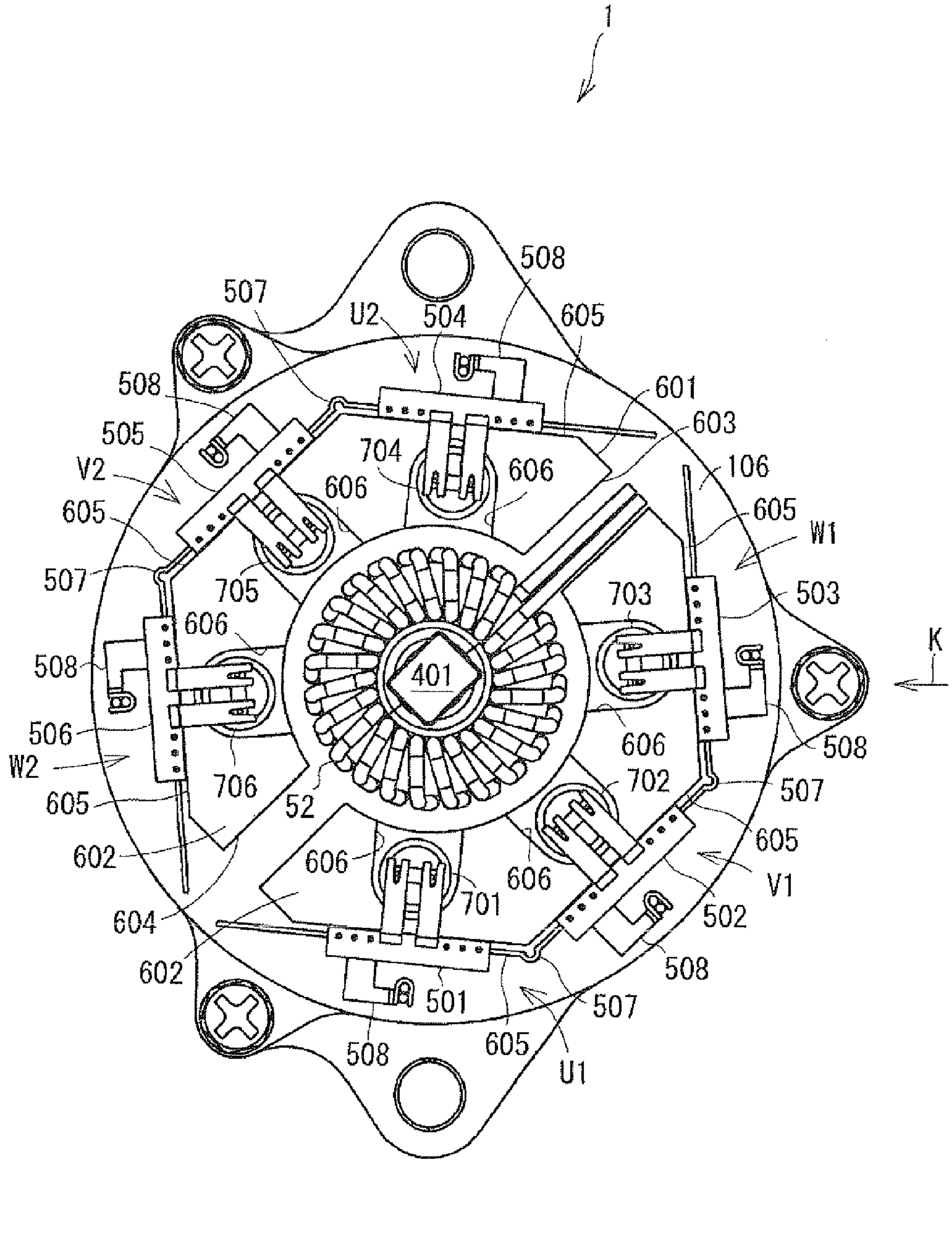
FIG. 2 is a plan view of an electronic circuit-integrated motor apparatus according to a, first embodiment of the present invention.
Figure 3:
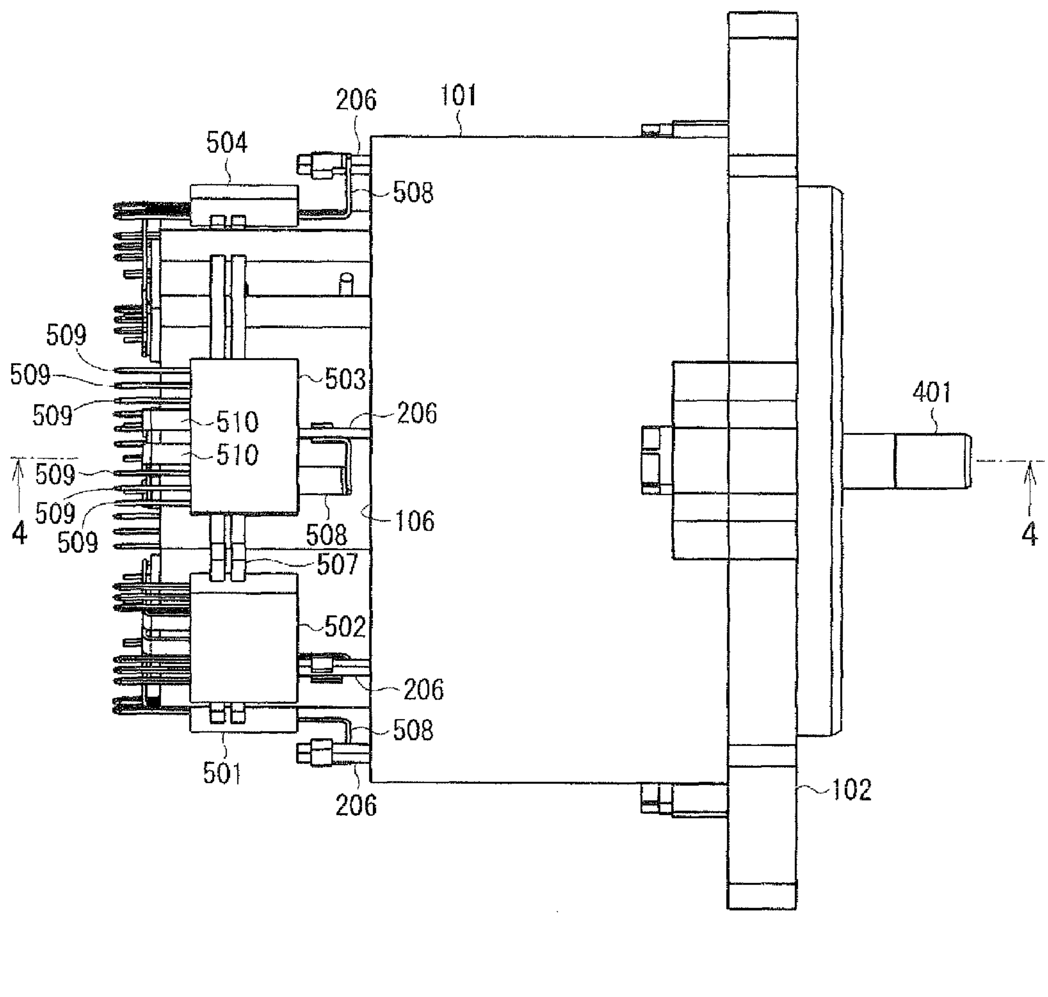
FIG. 3 is a side view of the electronic circuit-integrated motor apparatus according to the first embodiment.
Figure 4:
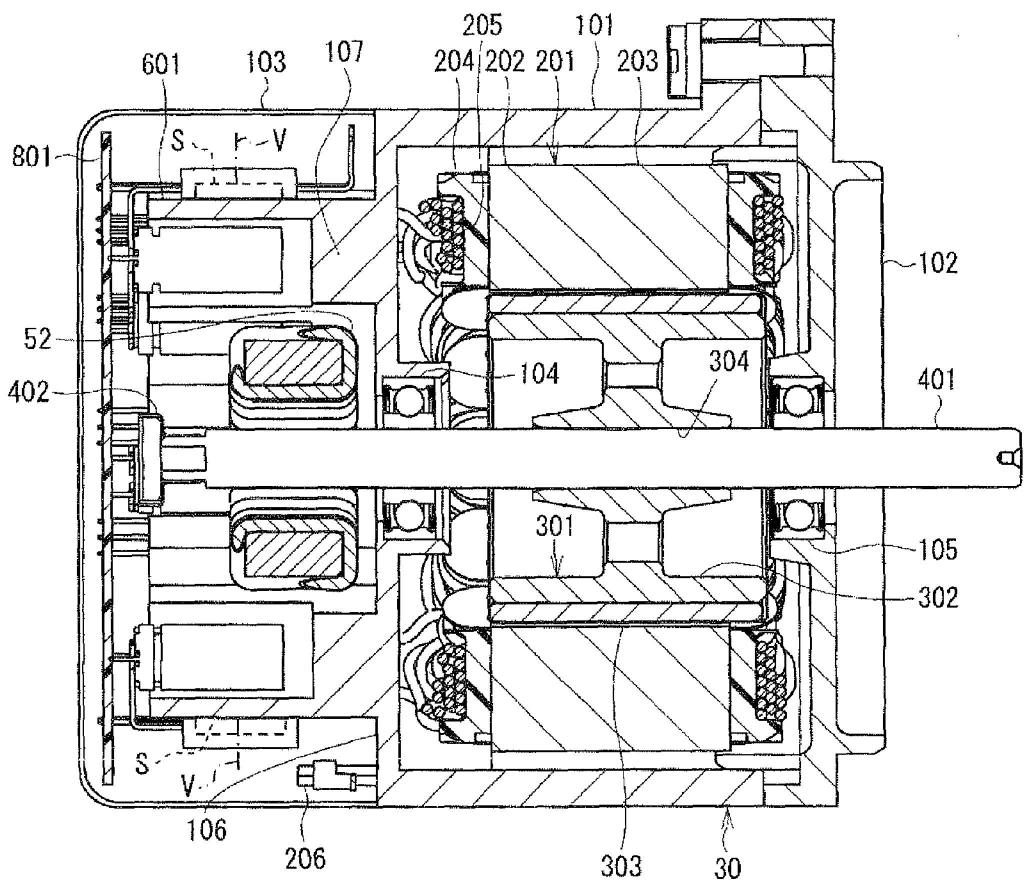
FIG. 4 is a cross-sectional view taken along line 4-4 in FIG. 3.
Figure 5:
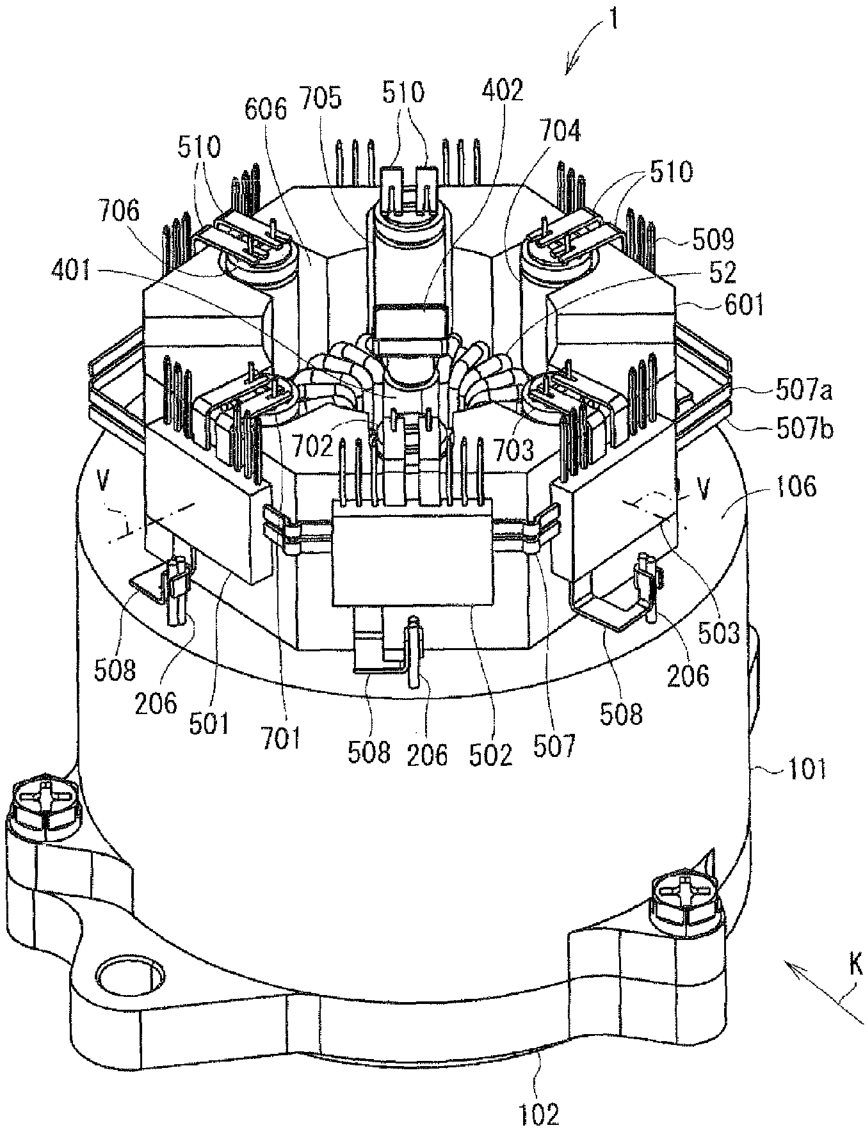
FIG. 5 is a perspective view of the electronic circuit-integrated motor apparatus according to the first embodiment.
Figure 6:
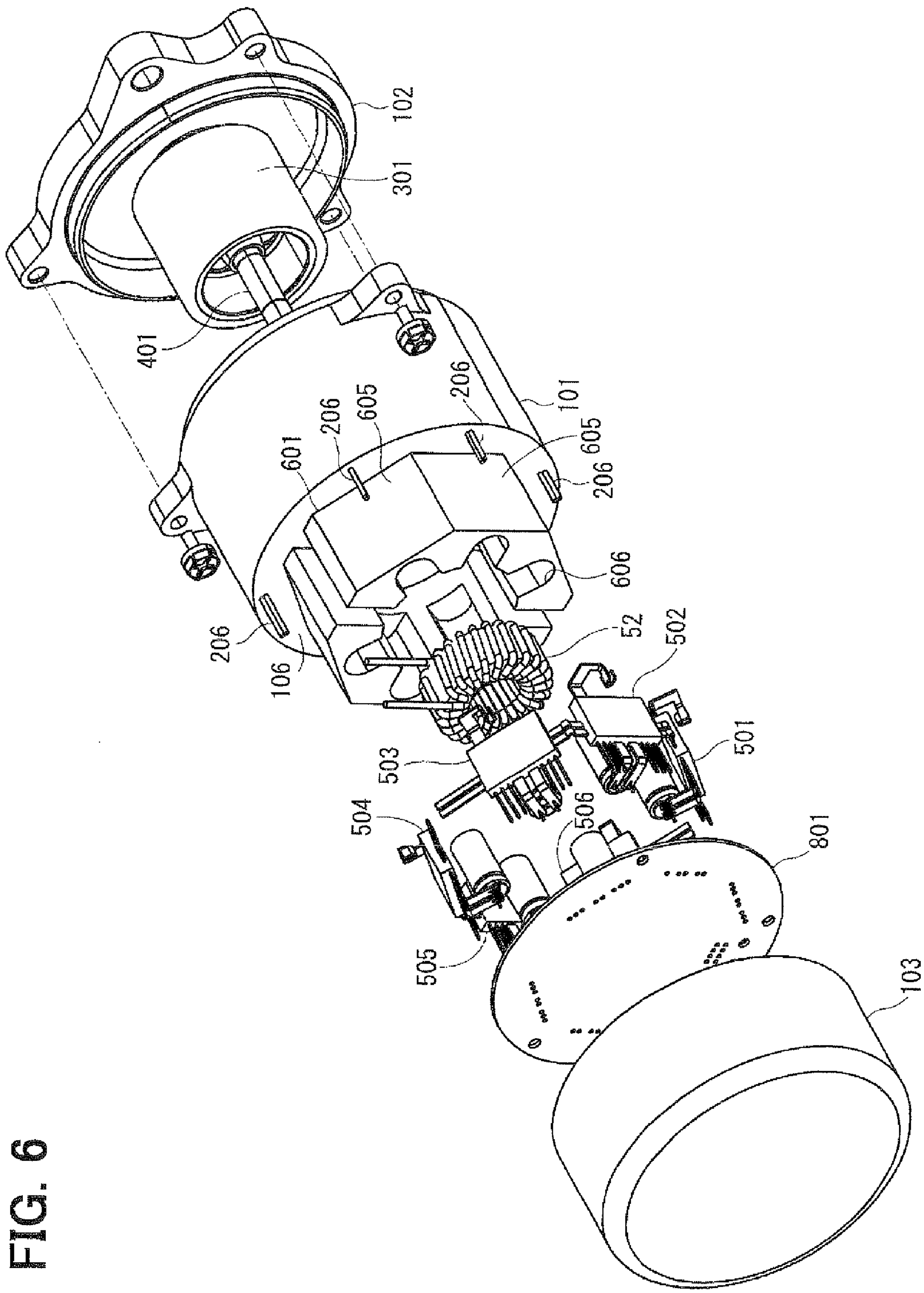
FIG. 6 is an exploded perspective view of the electronic circuit-integrated motor apparatus according to the first embodiment.

The motor apparatus 1 has a mechanical structure shown in FIGS. 2 to 6. In FIGS. 2, 3, and 5, a cover 103 and a printed circuit board 801 are not shown. A side surface view indicated by arrow K in FIG. 2 is shown in FIG. 3.

As shown in FIG. 4, the motor apparatus 1 is provided with a housing that includes a cylindrical motor case 101, an end frame 102 that is screwed down to the output end of the motor case 101, and a bottomed cylindrical cover 103 that is installed over an electronic circuit.

The motor 30 includes the motor case 101, a stator 201 positioned on the radially inside of the motor case 101, a rotor 301 positioned on the radially inside of the stator 201, and a shaft 401 that rotates together with the rotor 301.

The stator 201 includes twelve salient poles 202, which protrude in the radially inward direction of the motor case 101. The salient poles 202 are disposed at predetermined intervals in the circumferential direction of the motor case 101. The salient poles 202 each include a multilayer core 203, which is provided by stacking a number of thin magnetic plates, and an insulator 204, which fits with the axially outer end of the multilayer core 203. A coil 205 is wound on the insulator 204. Lead-out wires 206 for supplying an electrical current to the coil 205 are connected to six points of the coil 205. The coil 205 functions as a three-phase coil that has a U-phase, a V-phase and a W-phase depending on the mode of electrical current supply to the lead-out wires 206. The coil 205 is configured as a three-phase coil having the U-phase, V-phase, and W-phase. The lead-out wires 206 are routed from six holes in an axially end wall 106 of the motor case 101 toward the electronic circuit.

The rotor 301 is made, for instance, of iron or other magnetic material and formed into tubular shape. The rotor 301 includes a rotor core 302 and a permanent magnet 303 that is positioned on the radially outside of the rotor core 302. The permanent magnet 303 includes N and S poles, which are alternately disposed in the circumferential direction.

The shaft 401 is fastened to a shaft hole 304 formed at the axial center of the rotor core 302. The shaft 401 is rotatably supported by a bearing 104 on the motor case 101 and by a bearing 105 on the end frame 102. This ensures that the shaft 401 can rotate together with the rotor 301 with respect to the stator 201. The bearing 104 is positioned at the boundary between the electronic circuit (drive controller) and motor (movable part). A wall at this boundary is the end wall 106 of the motor case 101. The shaft 401 is extended from the end wall 106 toward the electronic circuit, and includes a magnet 402 that is positioned at its end toward the electronic circuit to detect the rotational position. The printed circuit board 801 made of resin is positioned near the end of the shaft 401 that is positioned toward the electronic circuit. The position sensor 73 (FIG. 1) is mounted at the center of the printed circuit board 801 to detect the rotational position of the magnet 402, that is, the rotational position of the shaft 401.

As shown in FIG. 2, the motor apparatus 1 includes six semiconductor modules 501, 502, 503, 504, 505, 506. Alphabetical symbols in FIG. 2 are used to distinguish the semiconductor modules 501-506 from each other. More specifically, the semiconductor modules 501-506 are individually referred to as the U1 semiconductor module 501, the V1 semiconductor module 502, the W1 semiconductor module 503, the U2 semiconductor module 504, the V2 semiconductor module 505, and the W2 semiconductor module 506.

Regarding the correspondence relationship to FIG. 1, the U1 semiconductor module 501 includes the FETs 61, 64, which provide the U-phase. The V1 semiconductor module 502 includes the FETs 62, 65, which provide the V-phase. The W1 semiconductor module 503 includes the FETs 63, 66, which provide the W-phase, and the FET 67, which provides protection against reverse connection. Similarly, the U2 to W2 semiconductor modules 504-506 includes FETs that form the inverter circuit 68. In other words, the U1, V1, and W1 semiconductor modules 501-503 form the first inverter circuit 60, whereas the U2, V2, and W2 semiconductor modules 504-506 form the second inverter circuit 68.

The U1, V1, and W1 semiconductor modules 501-503 and the U2, V2, and W2 semiconductor modules 504-506, which form the inverter circuits 60 and 68, are coupled by bus bars 507 to form a module unit. The bus bars 507 have a coupling function. The bus bar 507*a* positioned apart from the motor case 101 is provided as a ground, whereas the bus bar 507*b* positioned close to the motor case 101 is provided as a power supply line (FIG. 5). Thus, electrical power is supplied to the semiconductor modules 501-506 through the bus bars 507.

FIGS. 2 to 6 illustrate the assembling structures, for instance, of the semiconductor modules 501-506, but do not depict an electrical power supply structure. In reality, however, electrical power is supplied to the bus bars 507 through a connector mounted on the cover 103.

The semiconductor modules 501-506 are mounted on a heat sink 601 that is extended in the same direction as the direction of the centerline of the shaft 401 from the end wall 106 of the motor case 101.

As shown in FIG. 2, the heat sink 601 is configured so that two columnar members, whose cross sections perpendicular to the axial direction are substantially trapezoidal in shape, are disposed so as to sandwich the centerline of the shaft 401. Further, a predefined radial portion is cut out to form a cylindrical space at the center. As a whole, the heat sink 601 looks like a thick-walled cylinder that is octagon-shaped when viewed in the axial direction. Obviously, the heat sink 601 need not always be octagon-shaped when viewed in the axial direction. Alternatively, it may be hexagon-shaped when viewed in the axial direction. The heat sink 601 has side walls 602 that form the columnar members that are substantially trapezoidal in shape when viewed cross-sectionally in the axial direction. The side walls 602 include cut-out portions 603, 604, which form a noncontiguous portion. The heat sink 601 is made of the same material as the motor case 101 and formed integrally with the motor case 101 (FIG. 4).

The side walls 602 of the heat sink 601 have side wall surfaces 605, which are wider than a side surface that faces in a radially outward direction and is positioned adjacent to the cut-out portions 603, 604. A total of six side wall surfaces 605 are formed circumferentially. As illustrated in, for example FIG. 2, side wall surfaces 605 have cross-sections that are linear in a plane perpendicular to the center line of the shaft 401. Accommodation spaces 606 are formed in the radially inward direction of the individual side wall surfaces 605 and open to a cylindrical space at the center. The accommodation space 606 has an arc surface that fits to the outer shape of a capacitor. Further, the accommodation space 606 is in a position that corresponds to the position of the side wall surface 605. Although a portion of the heat sink 601 on which the accommodation spaces 606 are formed is thin, a thick portion 107, which is as thick as a portion where the accommodation spaces 606 are not provided, is formed between the accommodation spaces 606 and the end wall 106 of the motor case 101 (FIG. 4).

The semiconductor modules 501-506 are disposed, one by one, on the side wall surfaces 605, which face the radially outside of the heat sink 601. The semiconductor modules 501-506 are shaped like a plate that is extended in the planar direction of a molded semiconductor chip, and one of the respective surfaces having a relatively large area serves as a heat dissipation surface (as well as in the following embodiments). For example, copper or other metal is exposed from the heat dissipation surface. The semiconductor modules 501-506 are disposed such that the respective heat dissipation surfaces are in contact with the side wall surfaces 605. In this instance, the side wall surfaces 605 are plane surfaces. Accordingly, the heat dissipation surfaces of the semiconductor modules 501-506 are also plane surfaces. An alternative configuration may be employed so that an insulation sheet is placed between the heat dissipation surface of each semiconductor modules 501-506 and the side wall surface 605 of the heat sink 601 (as well as in the following embodiments).

As the semiconductor modules 501-506 are disposed on the side wall surfaces 605 of the heat sink 601 as described above, a vertical line V perpendicular to a flat surface of a semiconductor chip S is perpendicular to the centerline of the shaft 401 (FIGS. 4 and 5). Thus, the semiconductor modules 501-506 according to the present embodiment are vertically disposed. The semiconductor modules 501-506 include coil terminals 508 that are mounted on the end wall 106 of the motor case 101 (FIG. 3). The coil terminals 508 are bent in a radially outward direction. The lead-out wires 206 for supplying an electrical current to the coil 205 are routed toward the electronic circuit through six holes in the end wall 106 of the motor case 101. The lead-out wires 206 are routed into a radially outer space of the semiconductor modules 501-506. In the radially outer space of the semiconductor modules 501-506, therefore, the lead-out wires 206 and coil terminals 508 are electrically connected such that the lead-out wires 206 are sandwiched between the coil terminals 508.

The semiconductor modules 501-506 also include six control terminals 509 and two capacitor terminals 510, which are positioned opposite the end wall 106 of the motor case 101. The control terminals 509 are inserted into through-holes in the printed circuit board 801 (FIG. 4) and then soldered down. This ensures that the semiconductor modules 501-506 are electrically connected to the control circuit 70 (FIG. 1). The capacitor terminals 510 are branched off from the power supply line and ground, respectively, within the semiconductor modules 501-506. Further, the capacitor terminals 510 are both bent in a radially inward direction. As described above, the printed circuit board 801 is positioned in a space between a leading end wall of the heat sink 601 and the cover 103.

As shown in, for instance, FIG. 2, six capacitors 701, 702, 703, 704, 705, 706 are provided for the semiconductor modules 501-506 and disposed on the same side as the heat sink 601, that is, in a radially inward direction. Alphabetical symbols in FIG. 2 are used to differentiate the capacitors 701-706 from each other. More specifically, the capacitors 701-706 will be individually referred to as the U1 capacitor 701, the V1 capacitor 702, the W1 capacitor 703, the U2 capacitor 704, the V2 capacitor 705, and the W2 capacitor 706.

Regarding the correspondence relationship to FIG. 1, the U1 capacitor 701 corresponds to the capacitor 54; the V1 capacitor corresponds to the capacitor 55; and the W1 capacitor 703 corresponds to the capacitor 56. Similarly, the U2 capacitor 704, the V2 capacitor 705, and the W2 capacitor 706 correspond to the capacitors forming the inverter circuit 68.

The capacitors 701-706 are accommodated in the accommodation spaces 606 of the heat sink 601 and positioned near the semiconductor modules 501-506, respectively. The capacitors 701-706 are cylindrical in shape, and disposed such that the respective axes are parallel to the centerline of the shaft 401 (FIG. 5). Further, the capacitor terminals 510 of the semiconductor modules 501-506 are bent in a radially inward indirection so that the terminals of the capacitors 701-706 are directly connected to the bent capacitor terminals 510.

As described above, the shaft 401 is extended toward the electronic circuit. As shown, for instance, in FIG. 4, the choke coil 52 is set such that the shaft 401 is inserted through the choke coil 52. The choke coil 52 is placed in a cylindrical space formed at the center of the heat sink 601. The choke coil 52 is formed by winding a coil wire around a doughnut-shaped iron core. The coil end of the choke coil 52 is passed through the cut-out portion 603 of the heat sink 601 and routed out in a radially outward direction (FIG. 2).

The coil end of the choke coil 52 is connected to the power supply line in an intervening manner (FIG. 1). However, FIGS. 2 to 6 do not illustrate an electrical power supply structure for the choke coil 52.

As described above, from the radially outside to the radially inside, the connections between the coil terminals 508 and the lead-out wires 206, the semiconductor modules 501-506, the heat sink 601, the capacitors 701-706, and the choke coil 52 are sequentially arranged in the order named to make effective use of the radial space.

The control circuit 70 is formed on the printed circuit board 801 shown, for instance, in FIG. 4. More specifically, a wiring pattern is formed on the printed circuit board 801 by etching or other method, and an IC or other part forming the control circuit 70 is mounted on the printed circuit board (the IC and other parts are not shown).

The motor apparatus 1 thus provides the following advantages.

(1) The motor apparatus 1 is configured so that the semiconductor modules 501-506 are disposed in the direction of the centerline of the shaft 401. This makes it possible to reduce the radial physical size. Further, the semiconductor modules 501-506 are vertically arranged to bring them into contact with the side wall surfaces 605 of the heat sink 601. Furthermore, the heat sink 601 includes the accommodation spaces 606, in which the six capacitors 701-706 are radially disposed. The heat sink 601 and the capacitors 701-706 are disposed in the radially inward direction of the six semiconductor modules 501-506. Unlike a conventional configuration, the above-described configuration makes it possible to reduce the axial physical size as well. As a result, the physical size of the motor apparatus 1 can be minimized.

The semiconductor modules 501-506 are disposed, one by one, on the side wall surfaces 605 of the heat sink 601. Therefore, the semiconductor modules 501-506 are unlikely to be affected by heat dissipation from the neighboring semiconductor modules 501-506. This improves the heat release performance of each of semiconductor modules 501-506.

Figure 7:
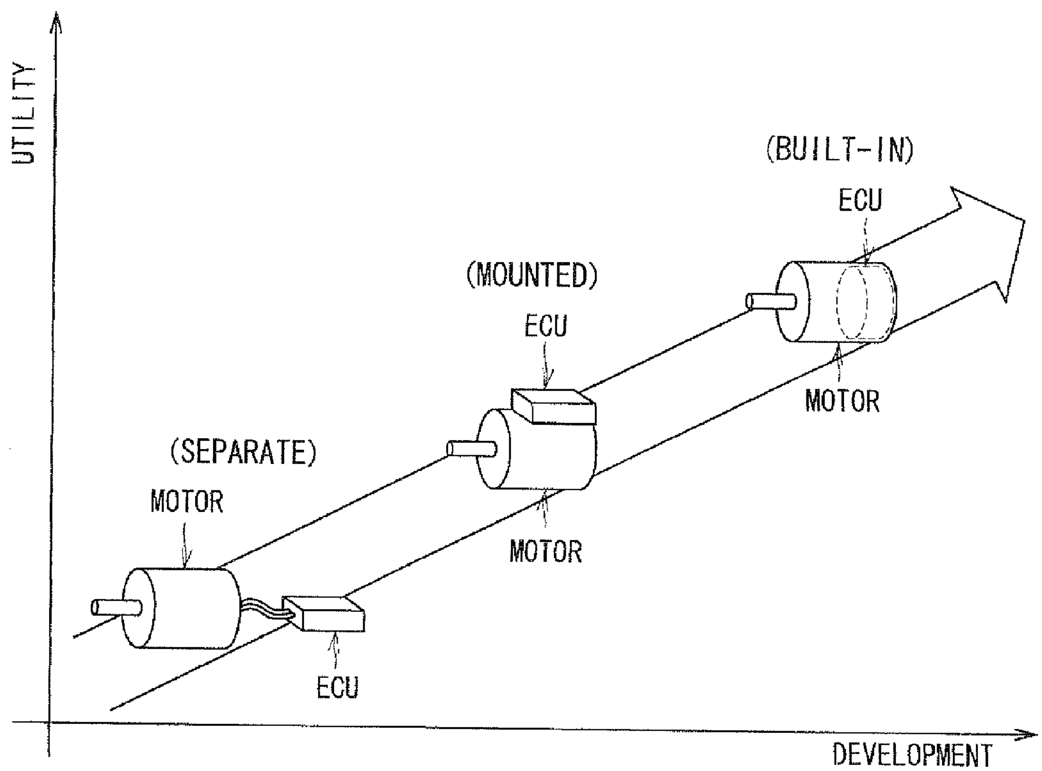
FIG. 7 is a diagram illustrating the history of development of a motor with a built-in ECU.

The motor used for an EPS has evolved as shown in FIG. 7. Initially, a "separate" configuration was employed so that the motor was separate from the ECU. Then, a "mounted" configuration was frequently employed so that no wiring or other connections were needed. However, the "mounted" configuration was such that the ECU was housed in a case shaped like a rectangular parallelepiped and mounted outside a motor case. It is preferred that the ECU be contained within a motor silhouette wherever possible. The use of such a configuration may result in an increase in axial physical size. However, the motor apparatus 1 is configured so that the semiconductor modules 501-506 are vertically disposed. In addition, the space created by the use of such a configuration is utilized to improve the positional relationship to the capacitors 701-706.

(2) In the motor apparatus 1, the lines perpendicular to the semiconductor chip surfaces of the semiconductor modules 501-506 are perpendicular to the centerline of the shaft 401. This will further increase the radial space.

(3) In the motor apparatus 1, the capacitors 701-706 are disposed near the semiconductor modules 501-506. Further, the semiconductor modules 501-506 include the capacitor terminals 510, which are dedicated to the capacitors. The terminals of the capacitors 701-706 are directly connected to the capacitor terminals 510 and not routed through a circuit board. When this connection scheme is employed, the wiring between the semiconductor modules 501-506 and the capacitors 701-706 can be significantly shorter than when the semiconductor modules 501-506 are connected to the capacitors 701-706 through a circuit board. This permits the capacitors 701-706 to fully presents respective functions. In addition, the capacitors 701-706 are disposed for the semiconductor modules 501-506 on a one-to-one basis. This makes it possible to relatively decrease the capacitances of the capacitors 701-706 and reduce the physical sizes of the capacitors 701-706.

(4) The motor apparatus 1 includes the heat sink 601, which is extended in the same direction as the direction of the centerline of the shaft 401 from the end wall 106 of the motor case 101. The semiconductor modules 501-506 are disposed on the side walls 602 of the heat sink 601. This promotes the dissipation of heat from the semiconductor modules 501-506. Consequently, the motor apparatus 1 can also be applied to an electric assist apparatus in which a large current flows to the motor 30.

(5) In the motor apparatus 1, the capacitors 701-706 for the semiconductor modules 501-506 are disposed on the same side as the heat sink 601. More specifically, the capacitors 701-706 are housed in the accommodation spaces 606, which are formed on the heat sink 601. This makes it possible to create a space on the radially outside of the semiconductor modules 501-506. The created space facilitates, for instance, the routing of electrical wires.

(6) In the motor apparatus 1, the heat dissipation surfaces of the semiconductor modules 501-506 are in contact with the side wall surfaces 605 of the heat sink 601. This configuration further promotes the dissipation of heat from the semiconductor modules 501-506.

(7) Further, as the side wall surfaces 605 are plane surfaces, the heat dissipation surfaces of the semiconductor modules 501-506 are also plane surfaces. This structure is advantageous from the viewpoint of ease of planar processing for the semiconductor modules 501-506.

(8) In the motor apparatus 1, the heat sink 601 has the side walls 602, which are positioned around the centerline of the shaft 401. In addition, the choke coil 52 is positioned on the radially inside of the side walls 602. Therefore, the physical size of the motor apparatus 1 can be minimized even when the physical size of the employed choke coil 52 is relatively large.

(9) Further, the side walls 602 have two cut-out portions 603, 604, which form a noncontiguous portion. The cut-out portion 603 is used so that the coil end of the choke coil 52 is routed out in a radially outward direction. This facilitates the routing of electrical wires for the choke coil 52.

(10) In the motor apparatus 1, the semiconductor modules 501-506 and the printed circuit board 801 are disposed together in the axial direction. The semiconductor modules 501-506 include the control terminals 509, which are soldered to the printed circuit board 801. This permits the control terminals 509 to establish electrical connections. Therefore, the configuration does not become complicated even when the control circuit 70 is positionally independent of the semiconductor modules 501-506.

(11) In the motor apparatus 1, the semiconductor modules 501-506 have the coil terminals 508, which are positioned toward an end opposite the printed circuit board 801. The coil terminals 508 are electrically connected to the lead-out wires 206. This makes it relatively easy to make an electrical connection to the coil 205 for the stator 201.

(12) In the motor apparatus 1, the magnet 402 is mounted on the leading end of the shaft 401. The position sensor 73 on the printed circuit board 801 detects the rotational position of the magnet 402 to determine the rotational position of the shaft 401. This makes it relatively easy to detect the rotational position of the motor 30.

(13) In the motor apparatus 1, the W1 and U2 semiconductor modules 503, 504 include the FET 67, which provides protection against reverse connection. This makes it possible to prevent the capacitors 701-706 from being damaged even when an erroneous power source connection is made.

(14) In the motor apparatus 1, the semiconductor modules 501-506 variously relate to the three phases, namely, the U-, V-, and W-phases. More specifically, the U1 and U2 semiconductor modules 501, 504 relate to the U-phase; the V1 and V2 semiconductor modules 502, 505 relate to the V-phase; and the W1 and W2 semiconductor modules 503, 506 relate to the W-phase. Further, the U1 to W1 semiconductor modules 501-503 and the U2 to W2 semiconductor modules 504-506 are respectively coupled by the bus bars 507 to form a module unit. As the semiconductor modules 501-506 are functionally modularized as described above, it is easy to configure the inverter circuit 60.

Second Embodiment

Figure 8:
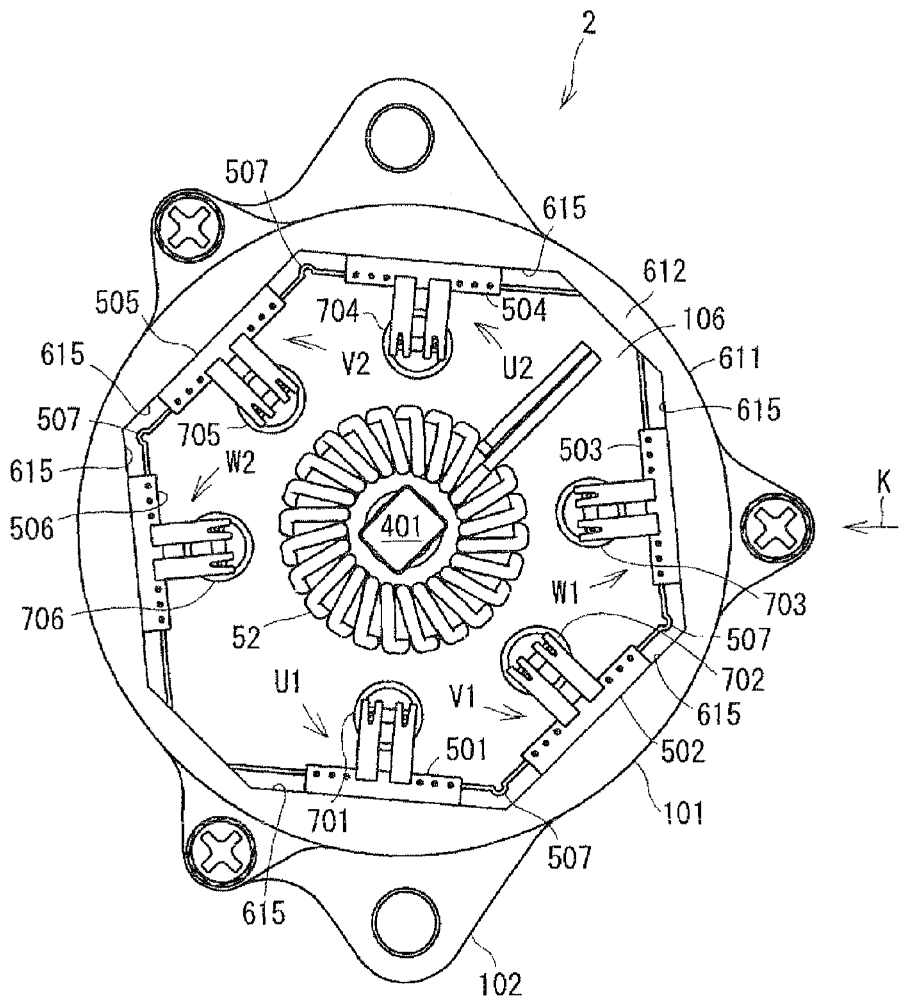
FIG. 8 is a plan view of an electronic circuit-integrated motor apparatus according to a second embodiment of the present invention.
Figure 9:
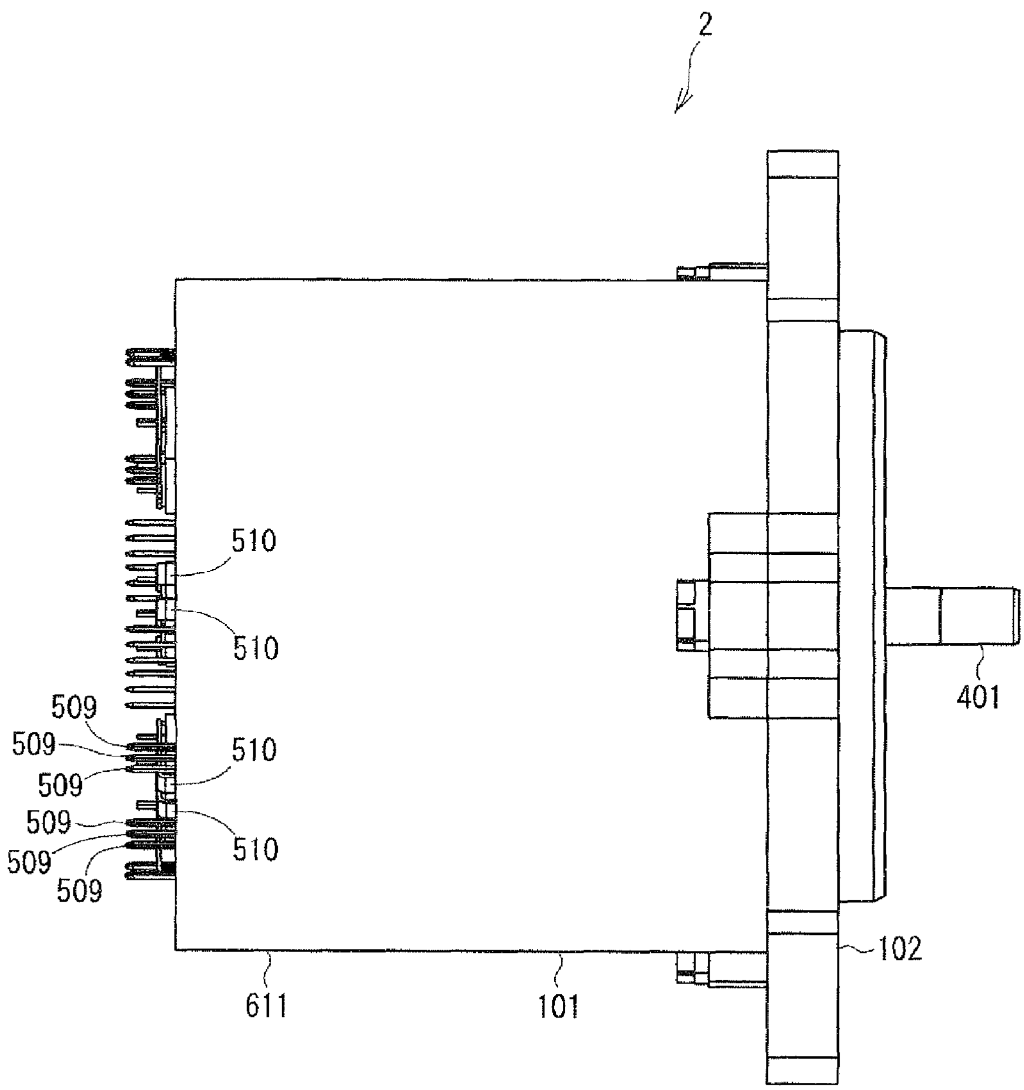
FIG. 9 is a side view of the electronic circuit-integrated motor apparatus according to the second embodiment.
Figure 10:
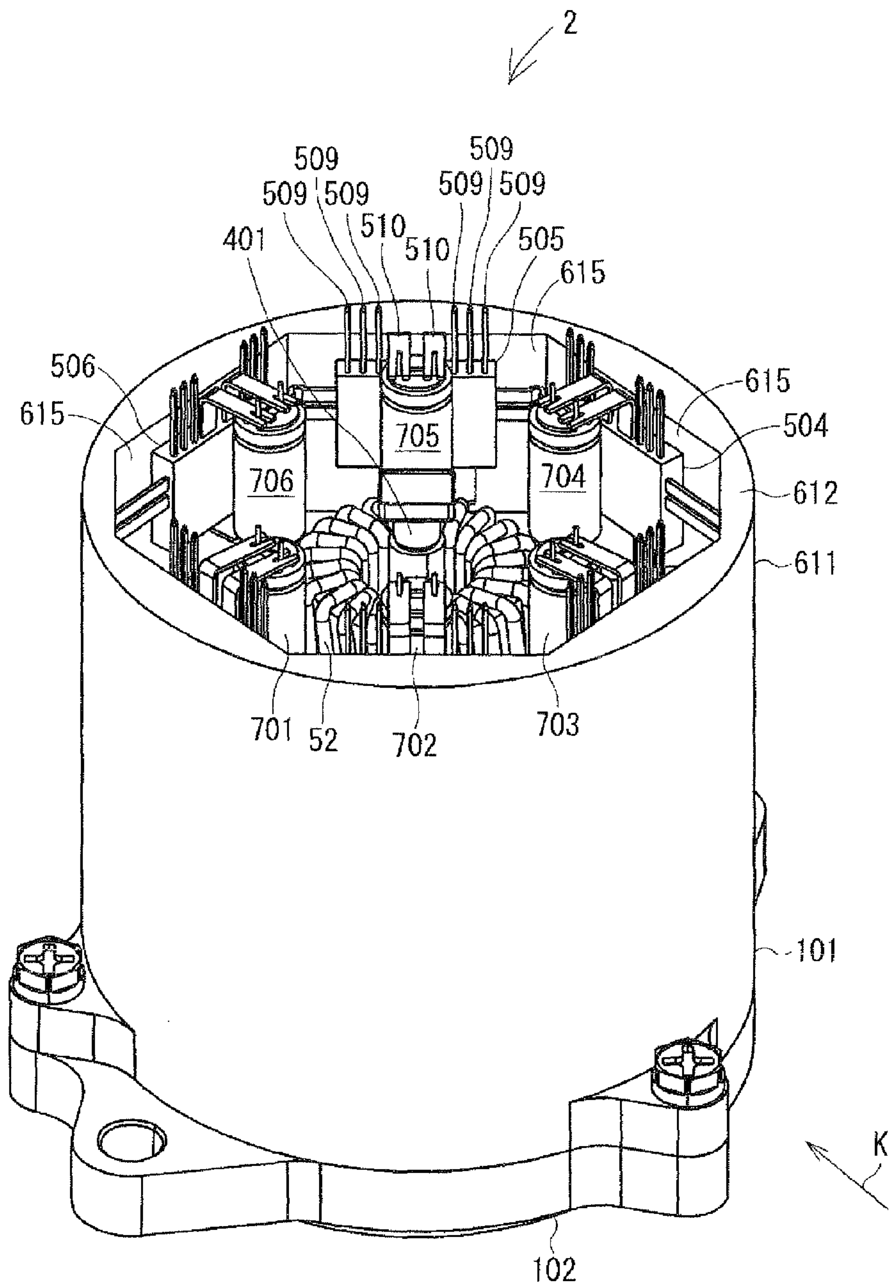
FIG. 10 is a perspective view of the electronic circuit-integrated motor apparatus according to the second embodiment.

As shown in FIGS. 8 to 10, a motor apparatus 2 according to a second embodiment of the present invention differs from the motor apparatus 1 according to the first embodiment in the configuration of the power circuit 50.

As shown in FIG. 8, the motor apparatus 2 includes six semiconductor modules 501, 502, 503, 504, 505, 506. Alphabetical symbols in FIG. 8 are used to distinguish the semiconductor modules 501-506 from each other. More specifically, the semiconductor modules 501-506 are individually referred to as the U1 semiconductor module 501, the V1 semiconductor module 502, the W1 semiconductor module 503, the U2 semiconductor module 504, the V2 semiconductor module 505, and the W2 semiconductor module 506.

The U1, V1, and W1 semiconductor modules 501-503 and the U2, V2, and W2 semiconductor modules 504-506 are coupled by the bus bars 507 to form a module unit. The bus bars 507 have a coupling function and operate as a power supply line.

The semiconductor modules 501-506 are mounted on a heat sink 611, which is extended in the same direction as the direction of the centerline of the shaft 401 from the end wall 106 of the motor case 101.

As shown in FIG. 8, the heat sink 611 is formed such that its cross section perpendicular to the axial direction is cylindrical in shape. A prismatic space is formed for the heat sink 611. The heat sink 611 has a side wall 612, which surrounds the centerline of the shaft 401. Here, the outer wall surface of the heat sink 611 forms a part of the shell of the motor apparatus 2 (FIGS. 9 and 10). The outside diameter of the heat sink 611 is equal to the outside diameter of a portion of the motor case 101 that houses the stator 201.

The side wall 612 of the heat sink 611 has side wall surfaces 615, which face in a radially inward direction. A total of six side wall surfaces 615 are formed in a circumferential direction. The semiconductor modules 501-506, which are mounted on the heat sink 611, are disposed, one by one, on the side wall surfaces 615, which face in the radially inward direction. The semiconductor modules 501-506 are positioned such that the respective heat dissipation surfaces are in contact with the side wall surfaces 615. The side wall surfaces 615 are plane surfaces. Accordingly, the heat dissipation surfaces of the semiconductor modules 501-506 are also plane surfaces.

The semiconductor modules 501-506 are disposed on the side wall surfaces 615 of the heat sink 611 as described above. Therefore, a line perpendicular to a semiconductor chip surface is perpendicular to the centerline of the shaft 401 (FIG. 10).

The semiconductor modules 501-506 have coil terminals (not shown), which are positioned on the end wall 106 of the motor case 101. Further, the semiconductor modules 501-506 have six control terminals 509 and two capacitor terminals 510, which are positioned opposite the end wall 106 of the motor case 101 (FIGS. 9 and 10).

As shown, for instance, in FIG. 8, six capacitors 701, 702, 703, 704, 705, 706 are provided for the semiconductor modules 501-506 and disposed opposite the heat sink 611.

The capacitors 701-706 are provided for the semiconductor modules 501-506 on a one-to-one basis, and disposed near the semiconductor modules 501-506. The capacitors 701-706 are cylindrical in shape, and disposed so that the respective axes are parallel to the centerline of the shaft 401. Further, the capacitor terminals 510 of the semiconductor modules 501-506 are bent in a radially inward direction. The terminals of the capacitors 701-706 are directly connected to the bent capacitor terminals 510.

The choke coil 52 is set such that the shaft 401 is inserted through the choke coil 52 (FIG. 10). The choke coil 52 is formed by winding a coil wire around a doughnut-shaped iron core.

As described above, from the radially outside to the radially inside, the heat sink 611, the semiconductor modules 501-506, the capacitors 701-706, and the choke coil 52 are sequentially arranged in the order named to make effective use of the radial space.

The motor apparatus 2 according to the second embodiment provides the same advantages as advantages (1) to (4), (6) to (8), and (10) to (14) described above in connection with the first embodiment.

In the motor apparatus 2, in particular, the capacitors 701-706 provided for the semiconductor modules 501-506 are disposed opposite the heat sink 611, that is, disposed on the radially inside of the semiconductor modules 501-506. Therefore, the space for the capacitors 701-706 need not be provided by the heat sink 611.

Third Embodiment

Figure 11:
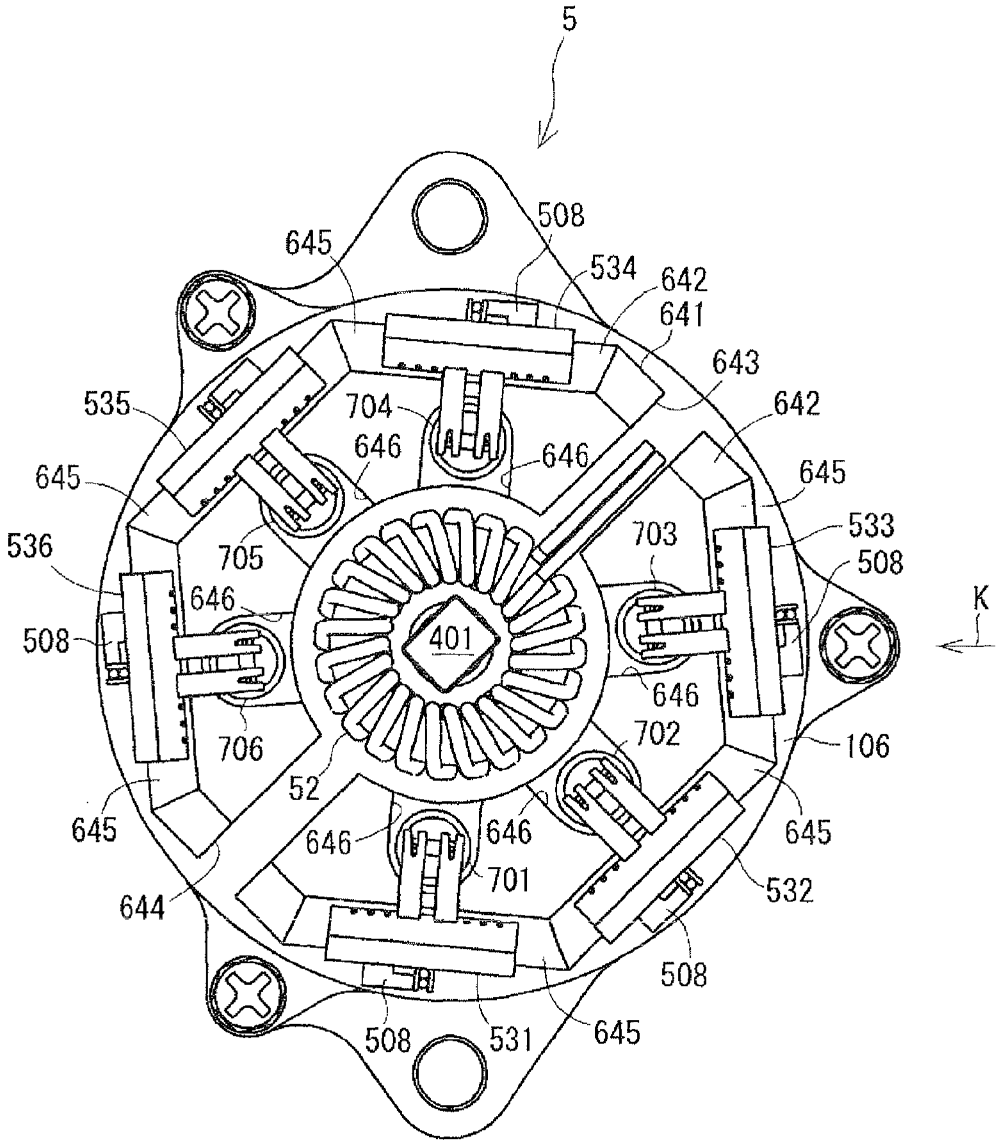
FIG. 11 is a plan view of an electronic circuit-integrated motor apparatus according to a third embodiment of the present invention.
Figure 12:
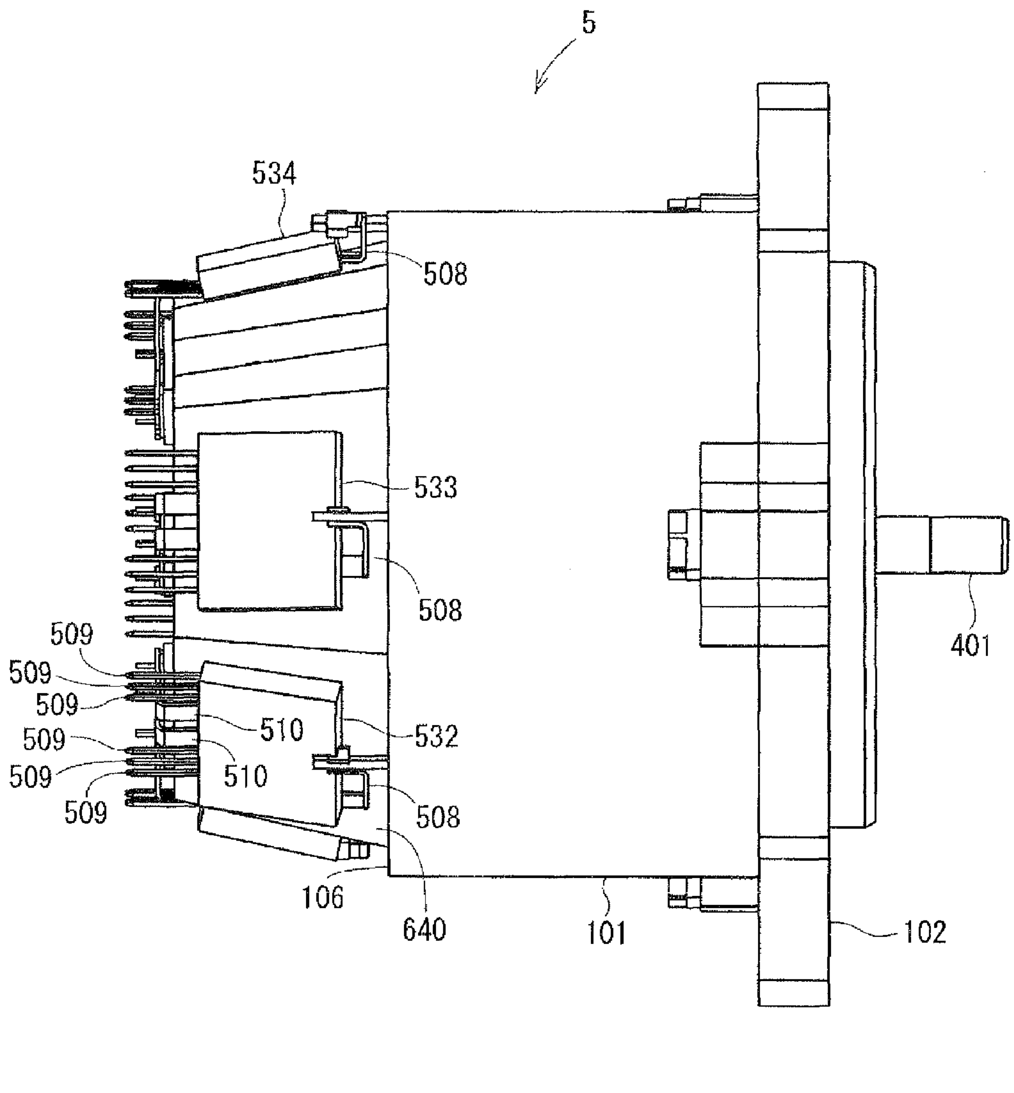
FIG. 12 is a side view of the electronic circuit-integrated motor apparatus according to the third embodiment.
Figure 13:
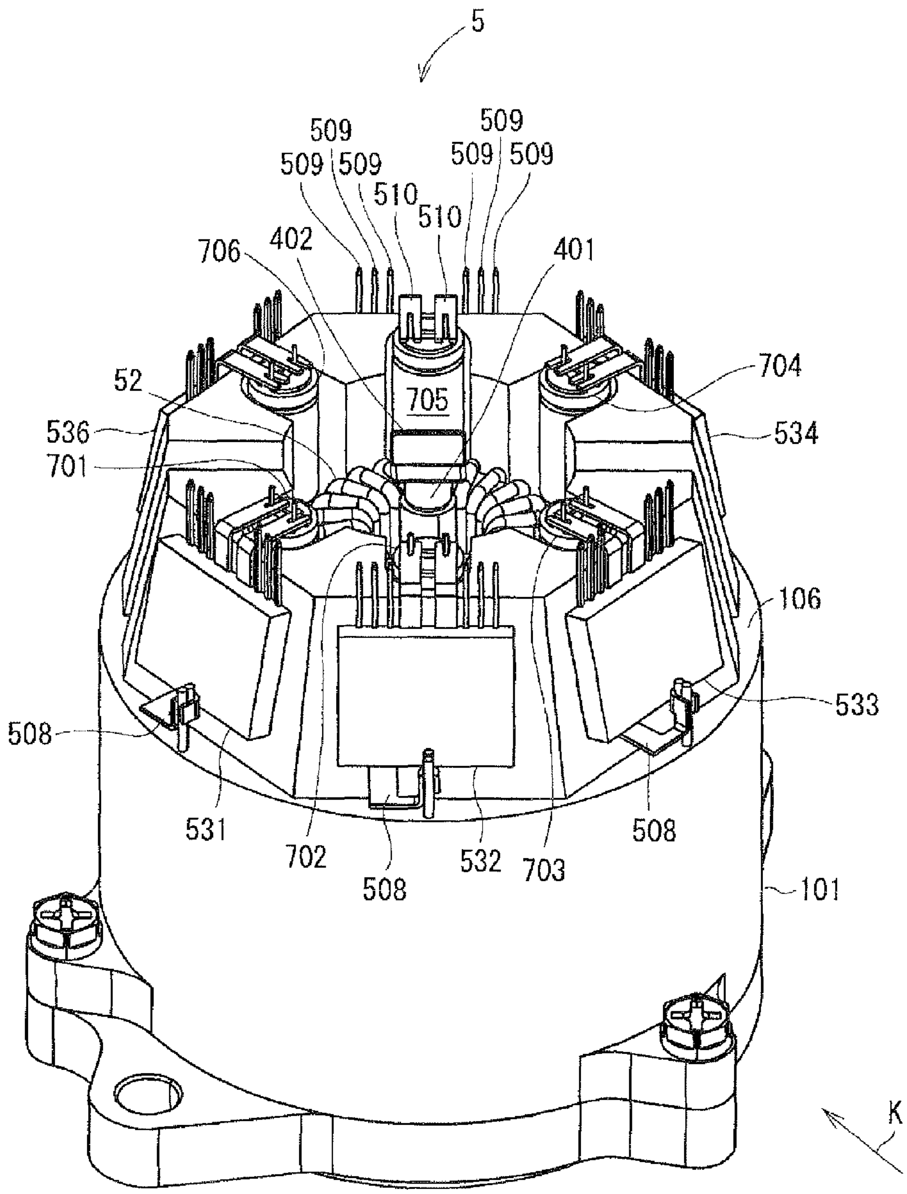
FIG. 13 is a perspective view of the electronic circuit-integrated motor apparatus according to the third embodiment.

As shown in FIGS. 11 to 13, a motor apparatus 5 according to a third embodiment of the present invention includes six semiconductor modules 531, 532, 533, 534, 535, 536.

The semiconductor modules 531-536 are mounted on a heat sink 641, which is extended in the same direction as the direction of the centerline of the shaft 401 from the end wall 106 of the motor case 101.

As shown in FIG. 11, the heat sink 641 is configured so that the centerline of the shaft 401 is sandwiched between two columnar members whose cross section perpendicular to the axial direction is substantially trapezoidal in shape. Further, the heat sink 641 is shaped so that a predefined radial portion is cut out to form a cylindrical space at the center. The heat sink 641 differs from the heat sink 601 (FIG. 2) in that the wall surface on the radially outside is inclined to approach the centerline of the shaft 401 with an increase in the distance from the motor case 101 as shown in FIG. 12. As a whole, the heat sink 641 is shaped like a prismoid, whose bottom surface is positioned toward the motor case 101. The heat sink 641 has side walls 642, which surround the centerline of the shaft 401. The side walls 642 have two cut-out portions 643, 644, which form a noncontiguous portion.

The side walls 642 of the heat sink 641 have six side wall surfaces 645, which face in a radially outward direction. The side wall surfaces 645 are inclined plane surfaces. Accommodation spaces 646 are formed in the radially inward direction of the individual side wall surfaces 645 and open to a cylindrical space at the center.

The semiconductor modules 531-536 provided for the heat sink 641 are disposed on the side wall surfaces 645, which face in the radially outward direction. The semiconductor modules 531-536 are positioned such that the respective heat dissipation surfaces are in contact with the side wall surfaces 645. The side wall surfaces 645 are plane surfaces. Accordingly, the heat dissipation surfaces of the semiconductor modules 531-536 are also plane surfaces.

The semiconductor modules 531-536 are disposed on the side wall surfaces 645 of the heat sink 641 as described above. Therefore, the semiconductor modules 531-536 are also inclined with respect to the centerline of the shaft 401.

The semiconductor modules 531-536 have coil terminals 508, which are positioned on a side of the end wall 106 of the motor case 101. Further, the semiconductor modules 531-536 have six control terminals 509 and two capacitor terminals 510, which are mounted on a side opposite the end wall 106 of the motor case 101 (FIGS. 12 and 13).

As shown, for instance, in FIG. 11, six capacitors 701, 702, 703, 704, 705, 706 are provided for the semiconductor modules 531-536 and disposed on the same side as the heat sink 641. More specifically, the capacitors 701-706 are disposed in the accommodation spaces 646 of the heat sink 641.

The capacitors 701-706 are provided for the semiconductor modules 531-536 on a one-to-one basis, and disposed near the semiconductor modules 531-536. The capacitors 701-706 are cylindrical in shape, and disposed so that the respective axes are parallel to the centerline of the shaft 401. Further, the capacitor terminals 510 of the semiconductor modules 531-536 are bent in a radially inward direction. Therefore, the terminals of the capacitors 701-706 are directly connected to the bent capacitor terminals 510 (FIG. 13).

The choke coil 52 is set such that the shaft 401 is inserted through the choke coil 52 (FIG. 13). The choke coil 52 is formed by winding a coil wire around a doughnut-shaped iron core. The coil end of the choke coil 52 is routed out in a radially outward direction from the cut-out portion 643 of the heat sink 641 (FIG. 11).

The motor apparatus 5 according to the third embodiment provides the same advantages as advantages (1) and (3) to (13) described in the first embodiment.

In the motor apparatus 5, in particular, the semiconductor modules 531-536 are inclined. Therefore, the axial physical size of the motor apparatus 5 can be further decreased.

In addition, the side wall surfaces 645 are inclined such that the distance from the centerline of the shaft 401 decreases with an increase in the distance from the end wall 106 of the motor case 101. This makes it relatively easy to cast the heat sink 641.

Fourth Embodiment

Figure 14:
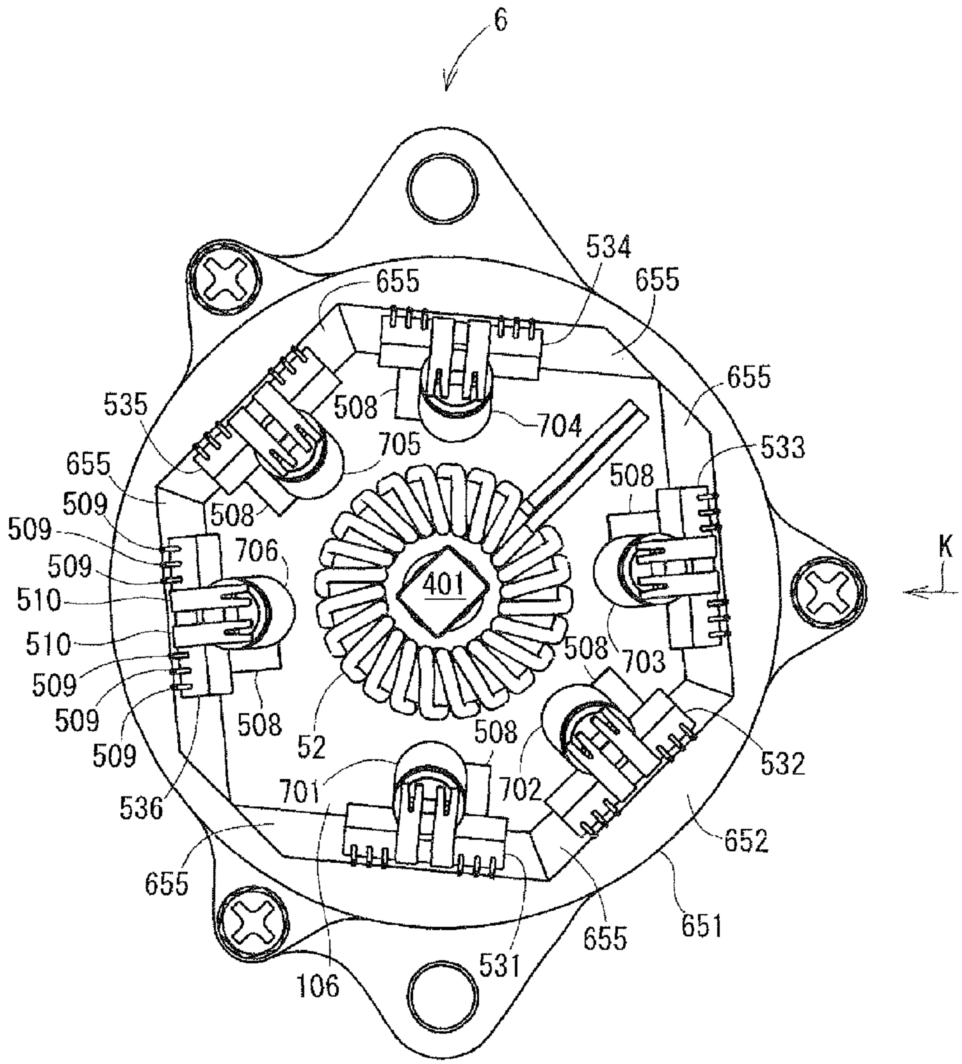
FIG. 14 is a plan view of an electronic circuit-integrated motor apparatus according to a fourth embodiment of the present invention.
Figure 15:
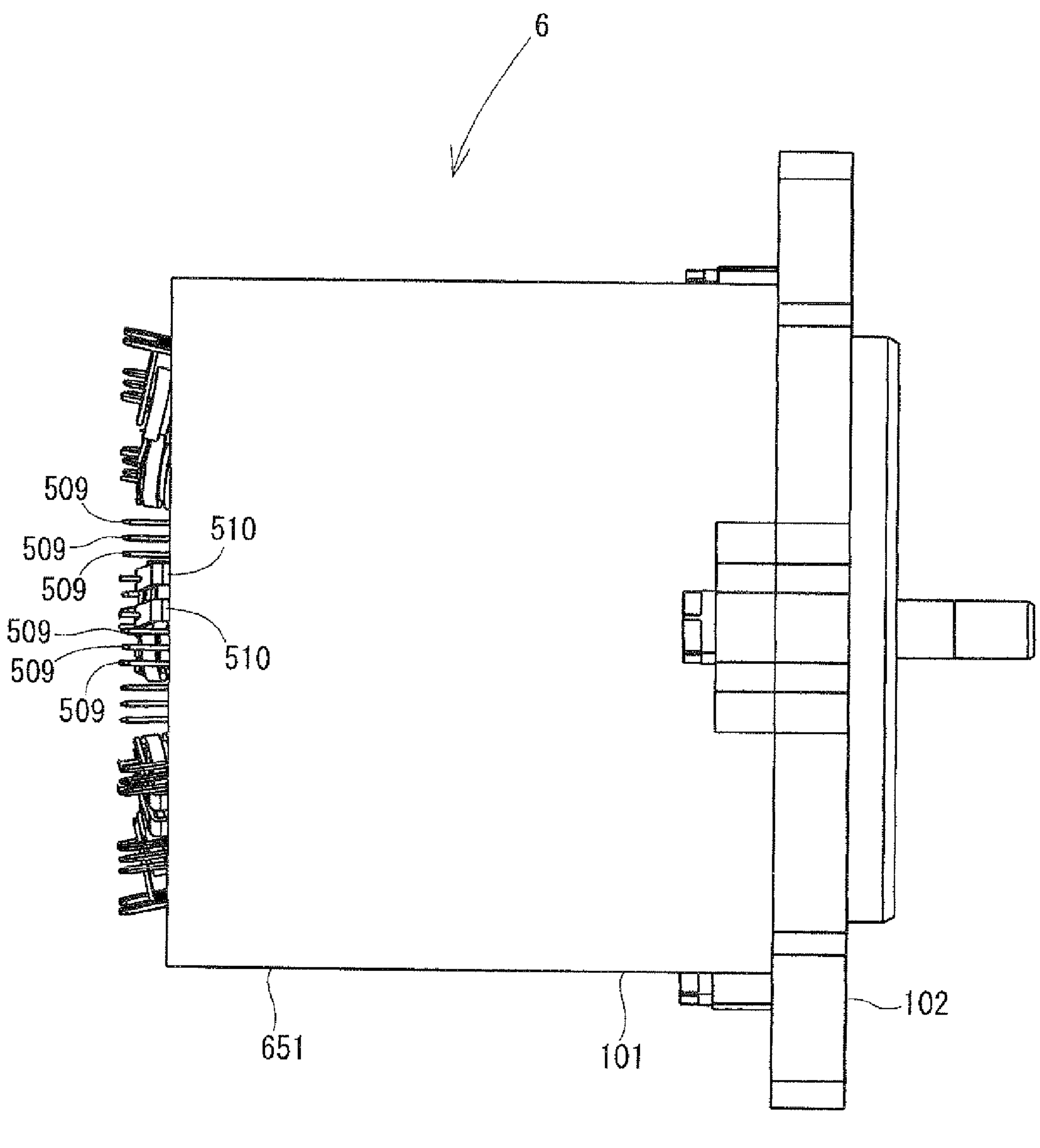
FIG. 15 is a side view of the electronic circuit-integrated motor apparatus according to the fourth embodiment.
Figure 16:
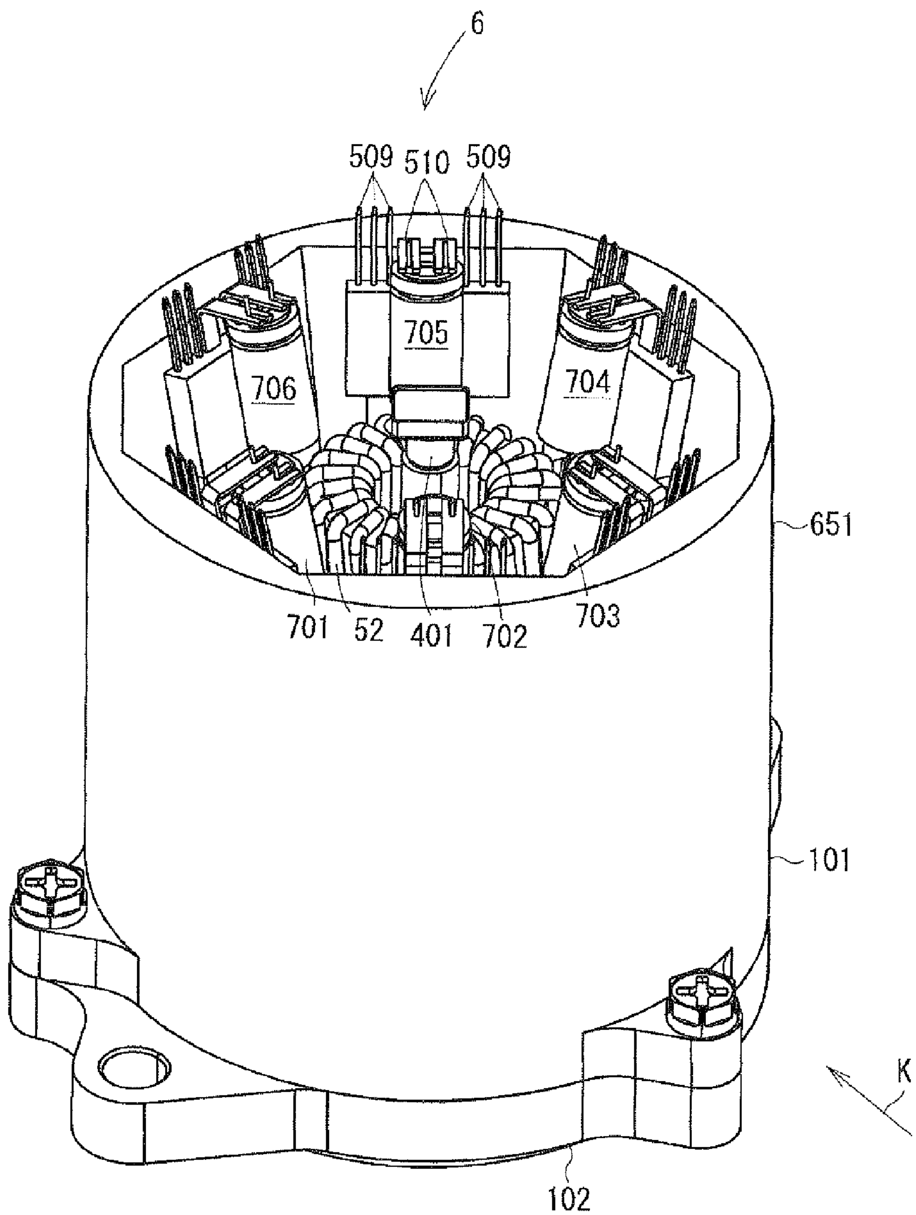
FIG. 16 is a perspective view of the electronic circuit-integrated motor apparatus according to the fourth embodiment.

A motor apparatus 6 according to a fourth embodiment of the present invention includes six semiconductor modules 531, 532, 533, 534, 535, 536, as shown in FIGS. 14 to 16.

The semiconductor modules 531-536 are mounted on a heat sink 651, which is extended in the same direction as the direction of the centerline of the shaft 401 from the end wall 106 of the motor case 101.

As shown in FIG. 14, the heat sink 651 is formed such that its cross section perpendicular to the axial direction is cylindrical in shape. A prismoidal space is formed for the heat sink 651. The heat sink 651 has a side wall 652, which surrounds the centerline of the shaft 401. Here, the outer wall, surface of the heat sink 651 forms a part of the shell of the motor apparatus 6 (FIGS. 15 and 16).

The side wall 652 of the heat sink 651 has side wall surfaces 655, which face in a radially inward direction. A total of six side wall surfaces 655 are formed in a circumferential direction. The heat sink 651 differs from the heat sink 611 according to the second embodiment (FIG. 8) in that the side wall surfaces 655 are inclined. More specifically, the side wall surfaces 655 are inclined such that the distance from the centerline of the shaft 401 increases with an increase in the distance from the end wall 106 of the motor case 101.

The semiconductor modules 531-536 provided for the heat sink 651 are disposed, one by one, on the side wall surfaces 655, which face in a radially inward direction. The semiconductor modules 531-536 are disposed such that the respective heat dissipation surfaces are in contact with the side wall surfaces 655. The side wall surfaces 655 are plane surfaces. Accordingly, the heat dissipation surfaces of the semiconductor modules 531-536 are also plane surfaces.

The semiconductor modules 531-536 are disposed on the side wall surfaces 655 of the heat sink 651 as described above. Therefore, the semiconductor modules 531-536 are inclined with respect to the centerline of the shaft 401.

The semiconductor modules 531-536 have coil terminals 508, which are positioned on the end wall 106 of the motor case 101 (FIG. 14). Further, the semiconductor modules 531-536 have six control terminals 509 and two capacitor terminals 510, which are positioned opposite the end wall 106 of the motor case 101 (FIGS. 15 and 16).

As shown, for instance, in FIG. 14, six capacitors 701, 702, 703, 704, 705, 706 are provided for the semiconductor modules 531-536 and disposed opposite the heat sink 641.

The capacitors 701-706 are provided for the semiconductor modules 531-536 on a one-to-one basis, and disposed near the semiconductor modules 531-536. The capacitors 701-706 are cylindrical in shape and inclined along the semiconductor modules. Further, the capacitor terminals 510 of the semiconductor modules 531-536 are bent in a radially inward direction. Therefore, the terminals of the capacitors 701-706 are directly connected to the bent capacitor terminals 510.

The choke coil 52 is set such that the shaft 401 is inserted through the choke coil 52 (FIG. 16). The choke coil 52 is formed by winding a coil wire around a doughnut-shaped iron core.

The motor apparatus 6 according to the fourth embodiment provides the same advantages as advantages (1), (3), (4), (6) to (8), and (10) to (13) described above in connection with the first embodiment.

The motor apparatus 6 according to the fourth embodiment is configured so that the capacitors 701-706 provided for the semiconductor modules 531-536 are disposed opposite the heat sink 651, that is, on the radially inside of the semiconductor modules. Therefore, the accommodation spaces for the capacitors 701-706 need not be formed on the heat sink 651.

Further, the motor apparatus 6 is configured so that the semiconductor modules 531-536 are inclined. This makes it possible to further reduce the axial physical size of the motor apparatus 6.

Furthermore, the side wall surfaces 655 are inclined such that the distance from the centerline of the shaft 401 increases with an increase in the distance from the end wall 106 of the motor case 101. This makes it relatively easy to cast the heat sink 651.

Fifth Embodiment

Figure 17:
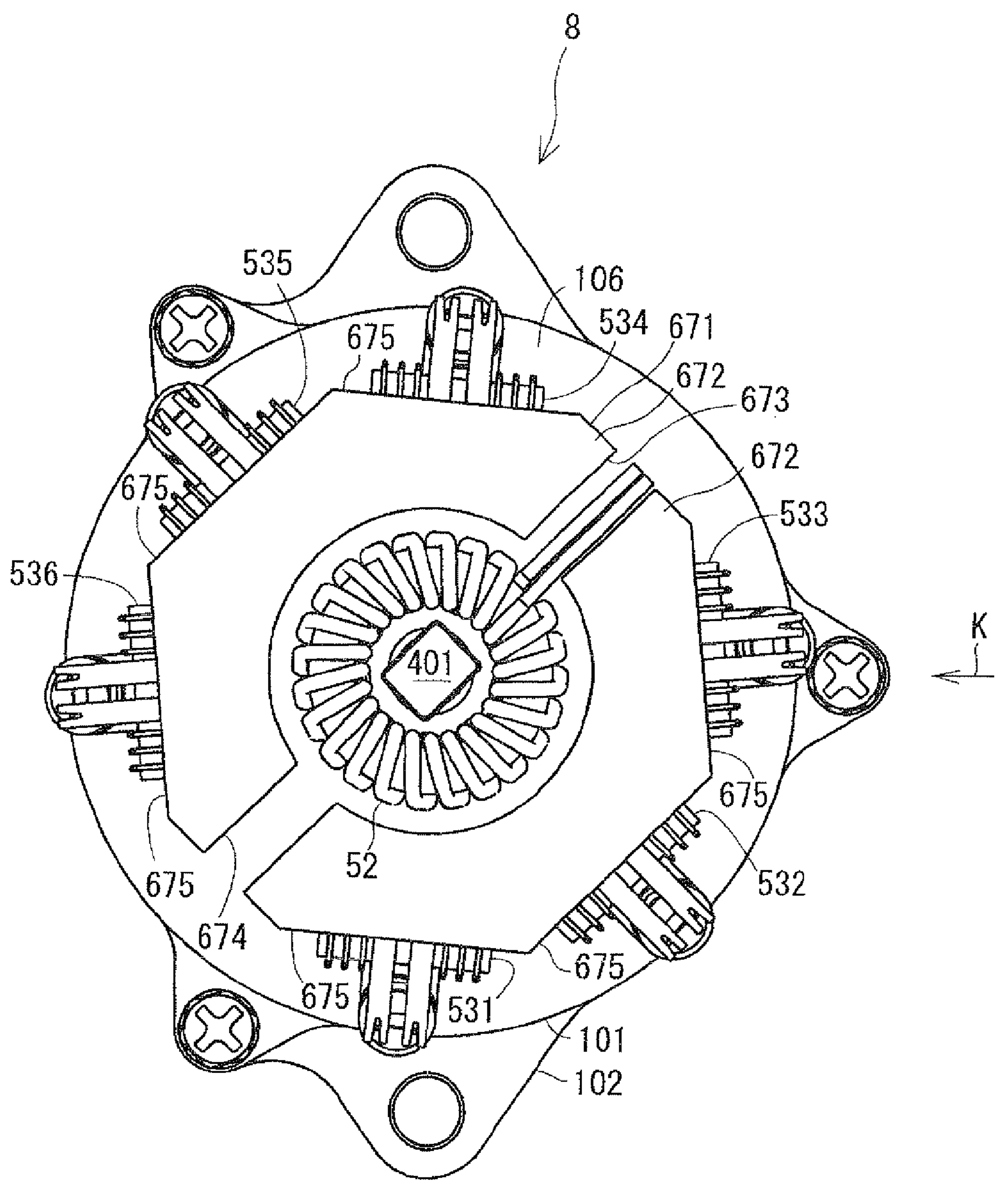
FIG. 17 is a plan view of an electronic circuit-integrated motor apparatus according to a fifth embodiment of the present invention.
Figure 18:
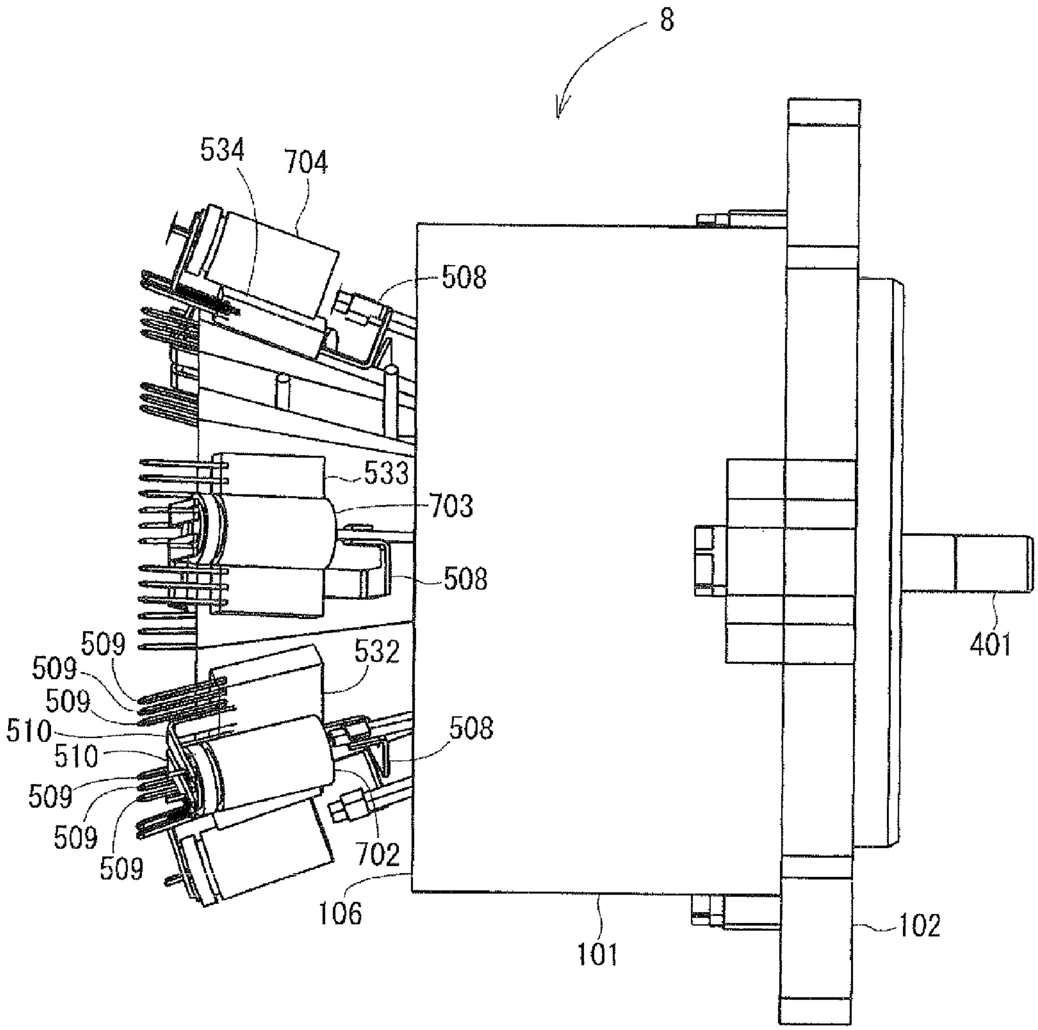
FIG. 18 is a side view of the electronic circuit-integrated motor apparatus according to the fifth embodiment.
Figure 19:
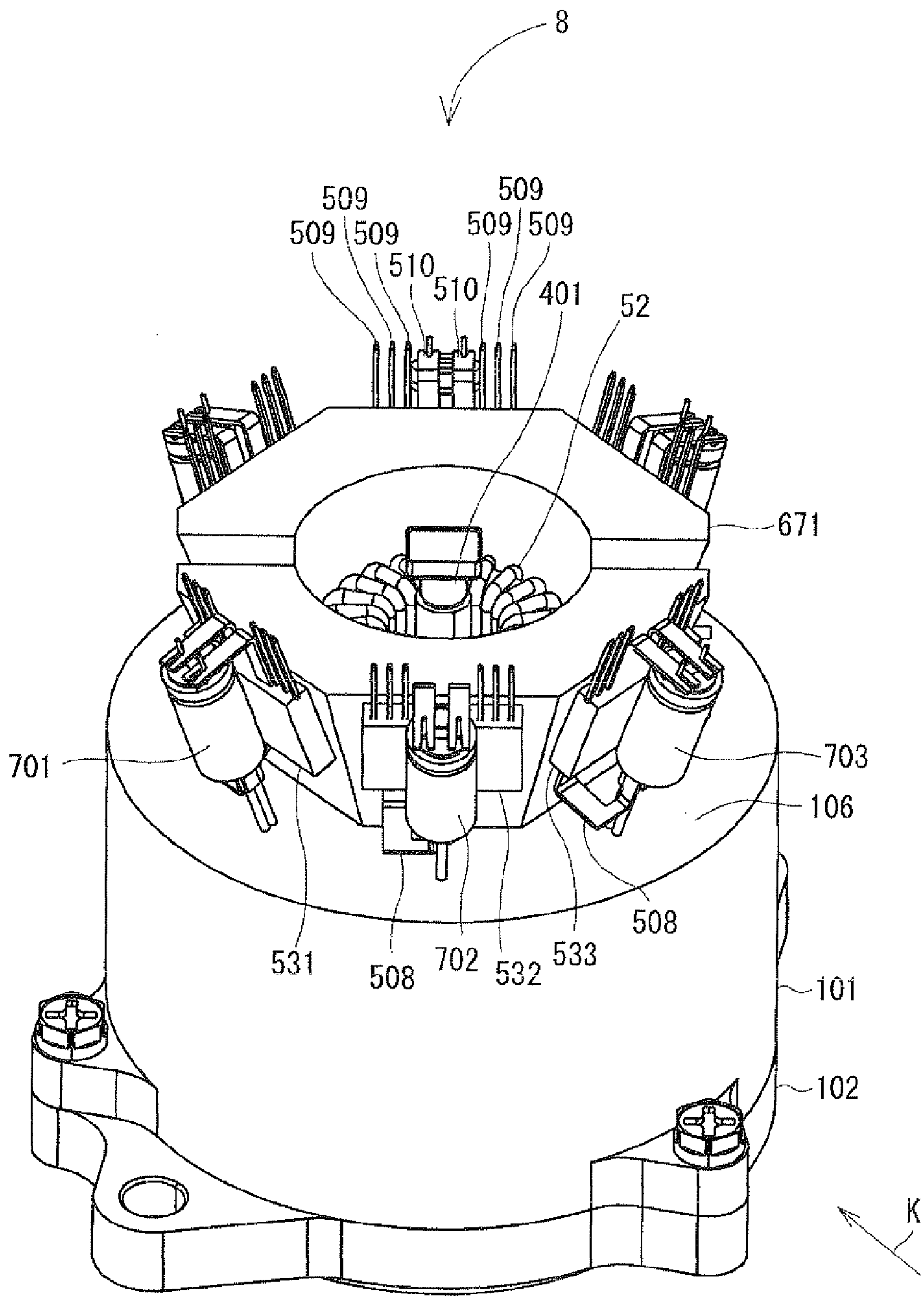
FIG. 19 is a perspective view of the electronic circuit-integrated motor apparatus according to the fifth embodiment.

A motor apparatus 8 according to a fifth embodiment of the present invention includes six semiconductor modules 531, 532, 533, 534, 535, 536, as shown in FIGS. 17 to 19.

The semiconductor modules 531-536 are mounted on a heat sink 671, which is extended in the same direction as the direction of the centerline of the shaft 401 from the end wall 106 of the motor case 101.

As shown in FIG. 17, the heat sink 671 is configured such that the centerline of the shaft 401 is sandwiched between two columnar members whose cross section perpendicular to the axial direction is substantially trapezoidal in shape. Further, the heat sink 671 is shaped so that a predefined radial portion is cut out to form a cylindrical space at the center. The heat sink 671 differs from the heat sink 601 (FIG. 2) in that the wall surface on the radially outside is inclined to retreat from the centerline of the shaft 401 with an increase in the distance from the motor case 101. As a whole, the heat sink 671 is shaped like a prismoid, whose top surface parallel to the bottom surface is positioned toward the motor case 101. The heat sink 671 has side walls 672, which surround the centerline of the shaft 401. The side walls 672 have two cut-out portions 673, 674, which form a noncontiguous portion.

The side wall 672 of the heat sink 671 has six side wall surfaces 675, which face in a radially outward direction. The side wall surfaces 675 are inclined.

The semiconductor modules 531-536 provided for the heat sink 671 are disposed on the side wall surfaces 675, which face in a radially outward direction. The semiconductor modules 531-536 are disposed such that the respective heat dissipation surfaces are in contact with the side wall surfaces 675. The side wall surfaces 675 are plane surfaces. Accordingly, the heat dissipation surfaces of the semiconductor modules 531-536 are also plane surfaces.

The semiconductor modules 531-536 are disposed on the side wall surfaces 675 of the heat sink 671 as described above. Therefore, the semiconductor modules 531-536 are inclined with respect to the centerline of the shaft 401.

The semiconductor modules 531-536 have coil terminals 508, which are positioned on the end wall 106 of the motor case 101 (FIGS. 18 and 19). Further, the semiconductor modules 531-536 have six control terminals 509 and two capacitor terminals 510, which are positioned opposite the end wall 106 of the motor case 101 (FIGS. 18 and 19).

As shown, for instance, in FIG. 17, six capacitors 701, 702, 703, 704, 705, 706 are provided for the semiconductor modules 531-536 and disposed opposite the heat sink 671.

The capacitors 701-706 are provided for the semiconductor modules 531-536 on a one-to-one basis, and disposed near the semiconductor modules 531-536. The capacitors 701-706 are cylindrical in shape and inclined along the semiconductor modules 531-536. Further, the capacitor terminals 510 of the semiconductor modules 531-536 are bent in a radially outward direction. Therefore, the terminals of the capacitors 701-706 are directly connected to the bent capacitor terminals 510 (FIG. 19).

The choke coil 52 is set such that the shaft 401 is inserted through the choke coil 52 (FIG. 19). The choke coil 52 is formed by winding a coil wire around a doughnut-shaped iron core. The coil end of the choke coil 52 is routed out in a radially outward direction from the cut-out portion 673 of the heat sink 671.

The motor apparatus 8 according to the present embodiment provides the same advantages as advantages (1), (3), (4), and (6) to (13) described, in the first embodiment.

In the motor apparatus 8, in particular, the semiconductor modules 531-536 are inclined. Therefore, the axial physical size of the motor apparatus 8 can be further decreased.

Further, the side wall surfaces 675 of the heat sink 671 are inclined such that the distance from the centerline of the shaft 401 increases with an increase in the distance from the end wall 106 of the motor case 101. This makes it possible to provide a space for the end wall 106 of the motor case 101.

Furthermore, the motor apparatus 8 is configured so, that the capacitors 701-706 provided for the semiconductor modules 531-536 are disposed opposite the heat sink 671. Therefore, the accommodation spaces for the capacitors 701-706 need not be formed on the heat sink 671.

Sixth Embodiment

Figure 20:
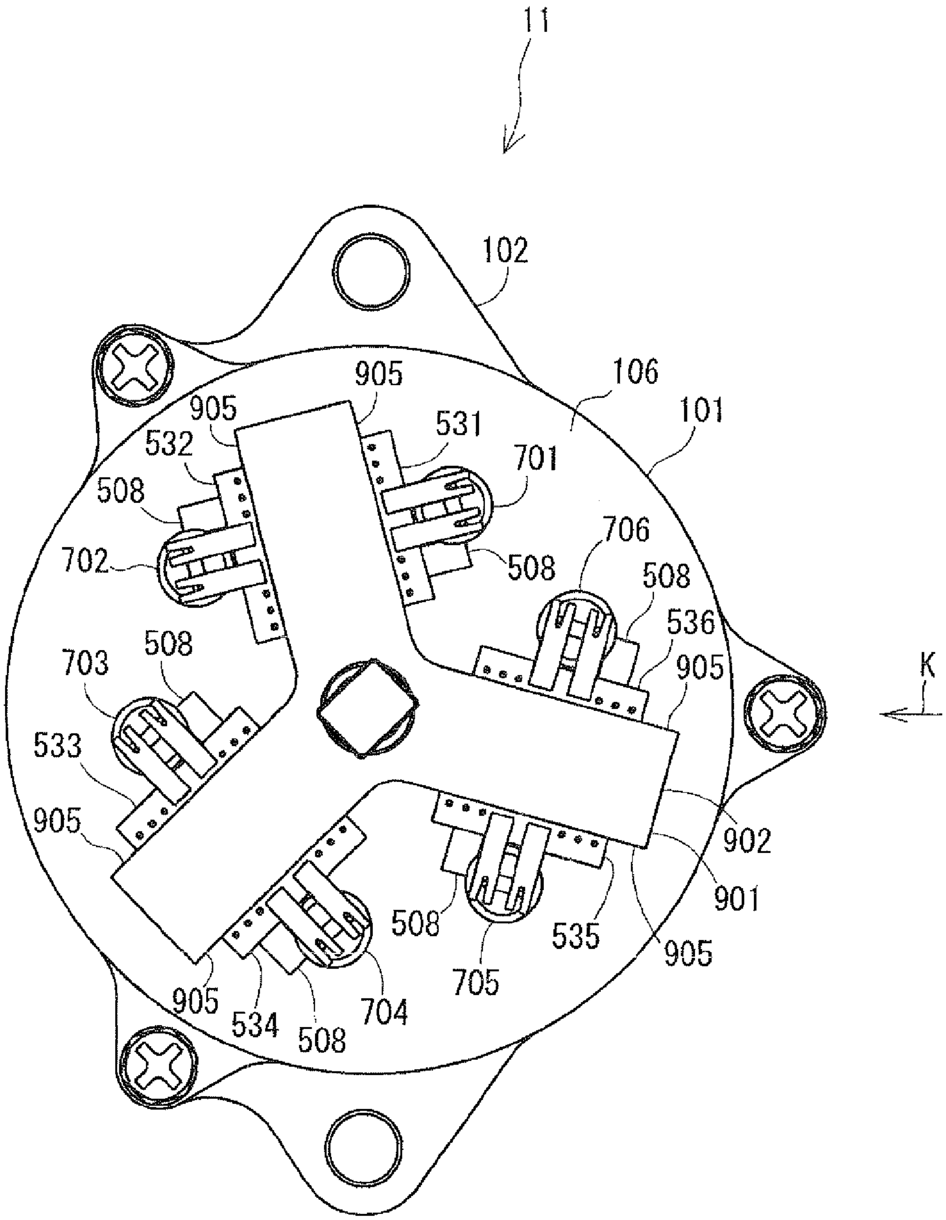
FIG. 20 is a plan view of an electronic circuit-integrated motor apparatus according to a sixth embodiment of the present invention.
Figure 21:
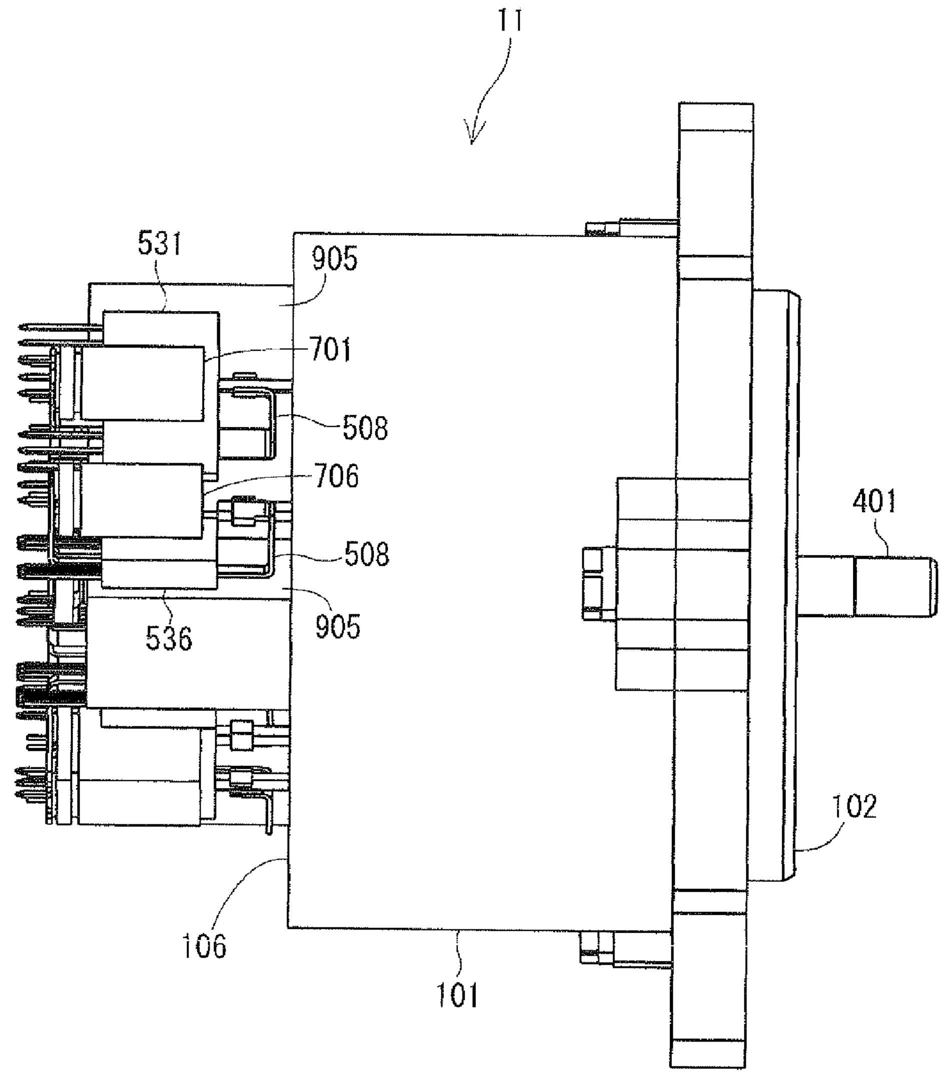
FIG. 21 is a side view of the electronic circuit-integrated motor apparatus according to the sixth embodiment.
Figure 22:
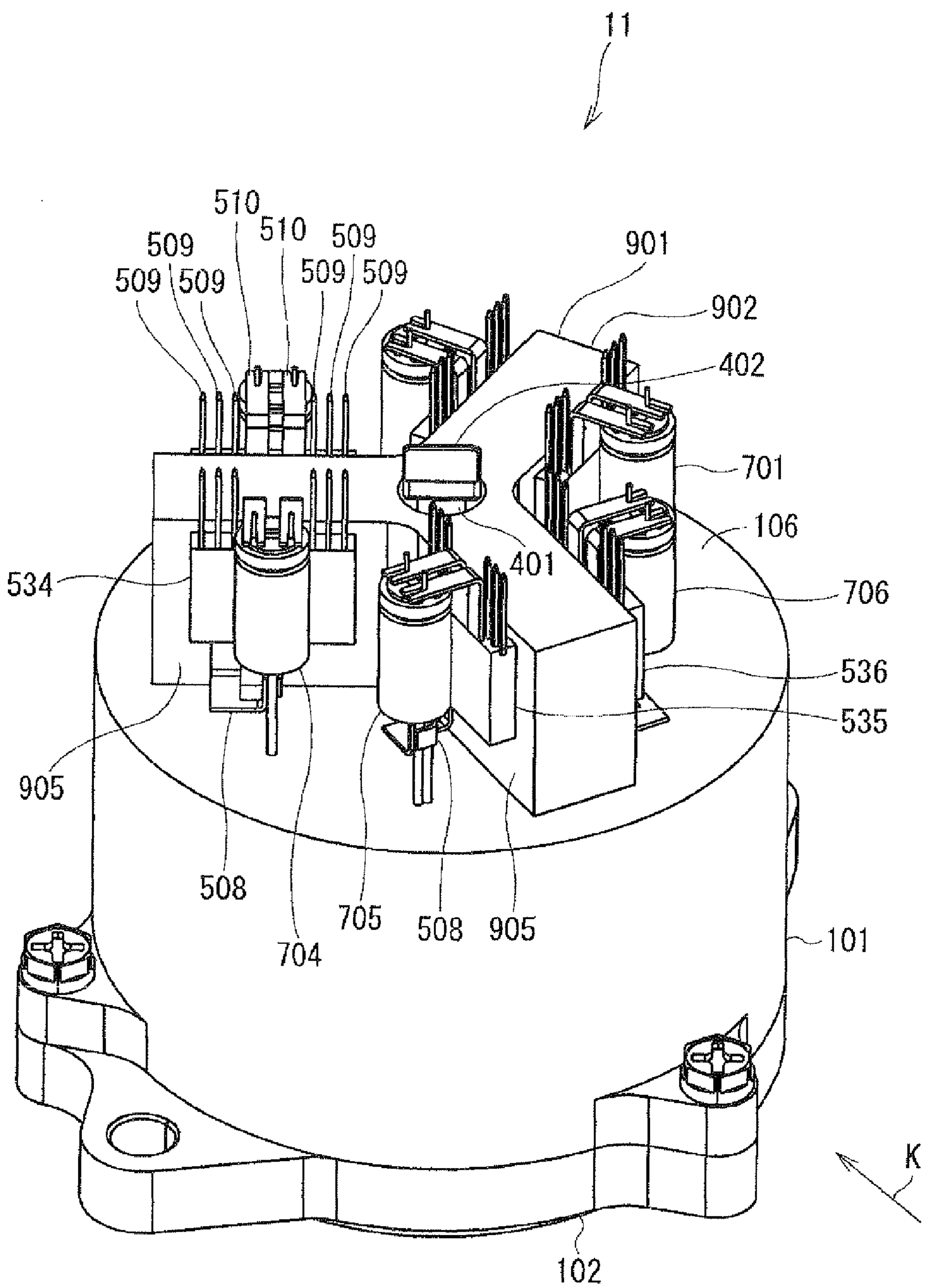
FIG. 22 is a perspective view of the electronic circuit-integrated motor apparatus according to the sixth embodiment.

A motor apparatus 11 according to a sixth embodiment of the present invention includes six semiconductor modules 531, 532, 533, 534, 535, 536, as shown in FIGS. 20 to 22. The semiconductor modules 531-536 are mounted on a heat sink 901, which is extended in the same direction as the direction of the centerline of the shaft 401 from the end wall 106 of the motor case 101.

The heat sink 901 has side walls 902, which are radially extended from the center and spaced at 120-degree intervals. The radially extended side walls 902 have two side wall surfaces 905, that is, one side wall 905 on each side. It means that the heat sink 901 has a total of six side wall surfaces 905.

The above-described six semiconductor modules 531-536 are respectively mounted on the side wall surfaces 905 of the heat sink 901.

The semiconductor modules 531-536 are disposed such that the respective heat dissipation surfaces are in contact with the side wall surfaces 905. The side wall surfaces 905 are plane surfaces. Accordingly, the heat dissipation surfaces of the semiconductor modules 531-536 are also plane surfaces.

The semiconductor modules 531-536 have coil terminals 508, which are positioned on the end wall 106 of the motor case 101. Further, the semiconductor modules 531-536 have six control terminals 509 and two capacitor terminals 510, which are positioned opposite the end wall 106 of the motor case 101 (FIG. 22).

Six capacitors 701, 702, 703, 704, 705, 706 are provided for the semiconductor modules 531-536 and disposed opposite the heat sink 641.

The capacitors 701-706 are provided for the semiconductor modules 531-536 on a one-to-one basis, and disposed near the semiconductor modules 531-536. The capacitors 701-706 are cylindrical in shape, and disposed so that the respective axes are parallel to the centerline of the shaft 401. Further, the capacitor terminals 510 of the semiconductor modules 531-536 are bent toward the opposite side of the side wall surfaces 905. Therefore, the terminals of the capacitors 701-706 are directly connected to the bent capacitor terminals 510 (FIG. 22).

The motor apparatus 11 according to the present embodiment provides the same advantages as advantages (1) to (4), (6), (7), and (10) to (13) described in the first embodiment.

Seventh Embodiment

Figure 23:
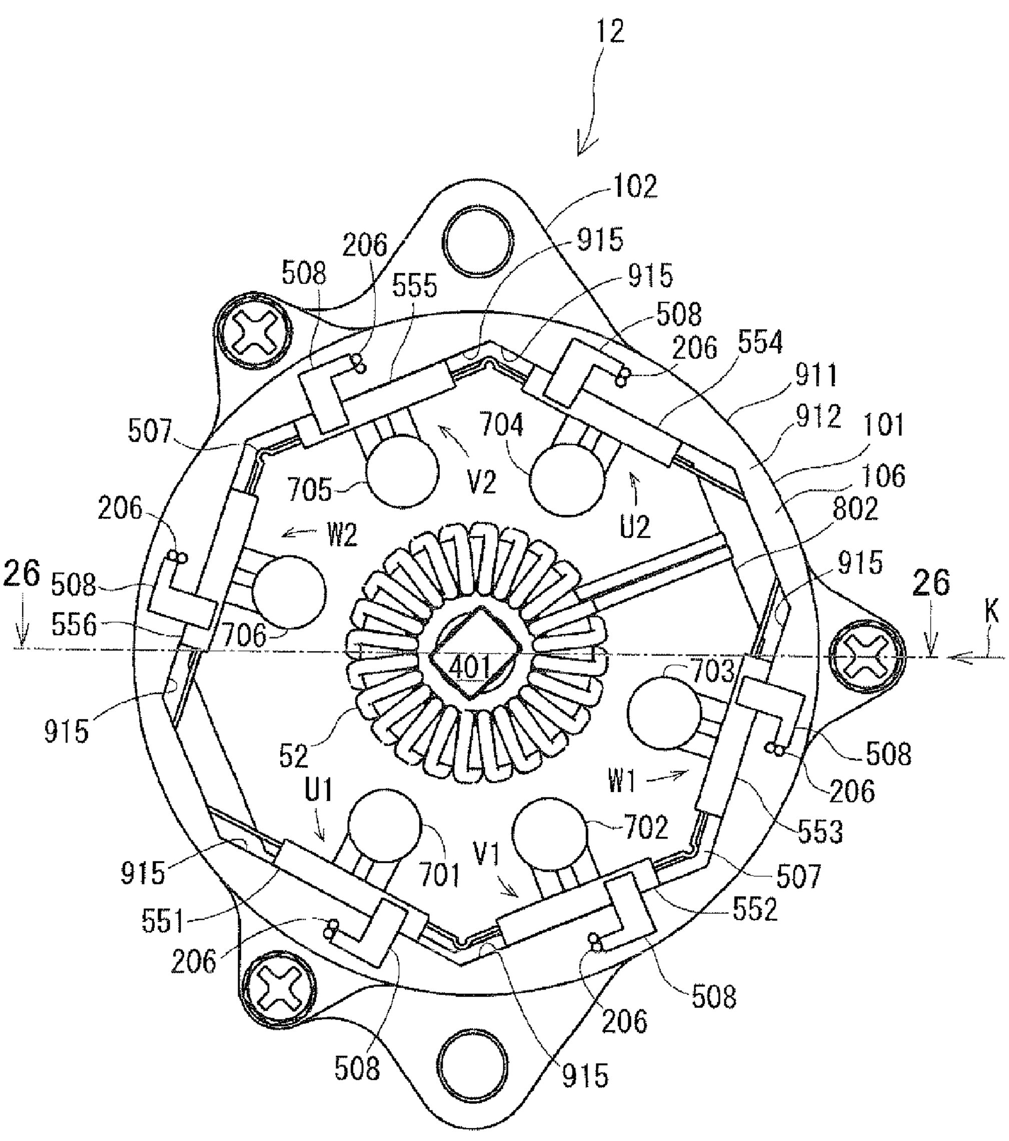
FIG. 23 is a plan view of an electronic circuit-integrated motor apparatus according to a seventh embodiment of the present invention.

A motor apparatus 12 according to a seventh embodiment of the present invention includes six semiconductor modules 551, 552, 553, 554, 555, 556, as shown in FIGS. 23 to 26. Alphabetical symbols in FIG. 23 are used to distinguish the semiconductor modules 551-556 from each other. More specifically, the semiconductor modules 551-556 are individually referred to as the U1 semiconductor 25, module 551, the V1 semiconductor module 552, the W1 semiconductor module 553, the U2 semiconductor module 554, the V2 semiconductor module 555, and the W2 semiconductor module 556.

The U1, V1, and W1 semiconductor modules 551-553 and the U2, V2, and W2 semiconductor modules 554-556 are coupled by the bus bars 507 to form a module. The bus bars 507 have a coupling function and operate as a power supply line, as is the case with the first embodiment.

The semiconductor modules 551-556 are mounted on a heat sink 911, which is extended in the same direction as the direction of the centerline of the shaft 401 from the end wall 106 of the motor case 101.

Figure 24:
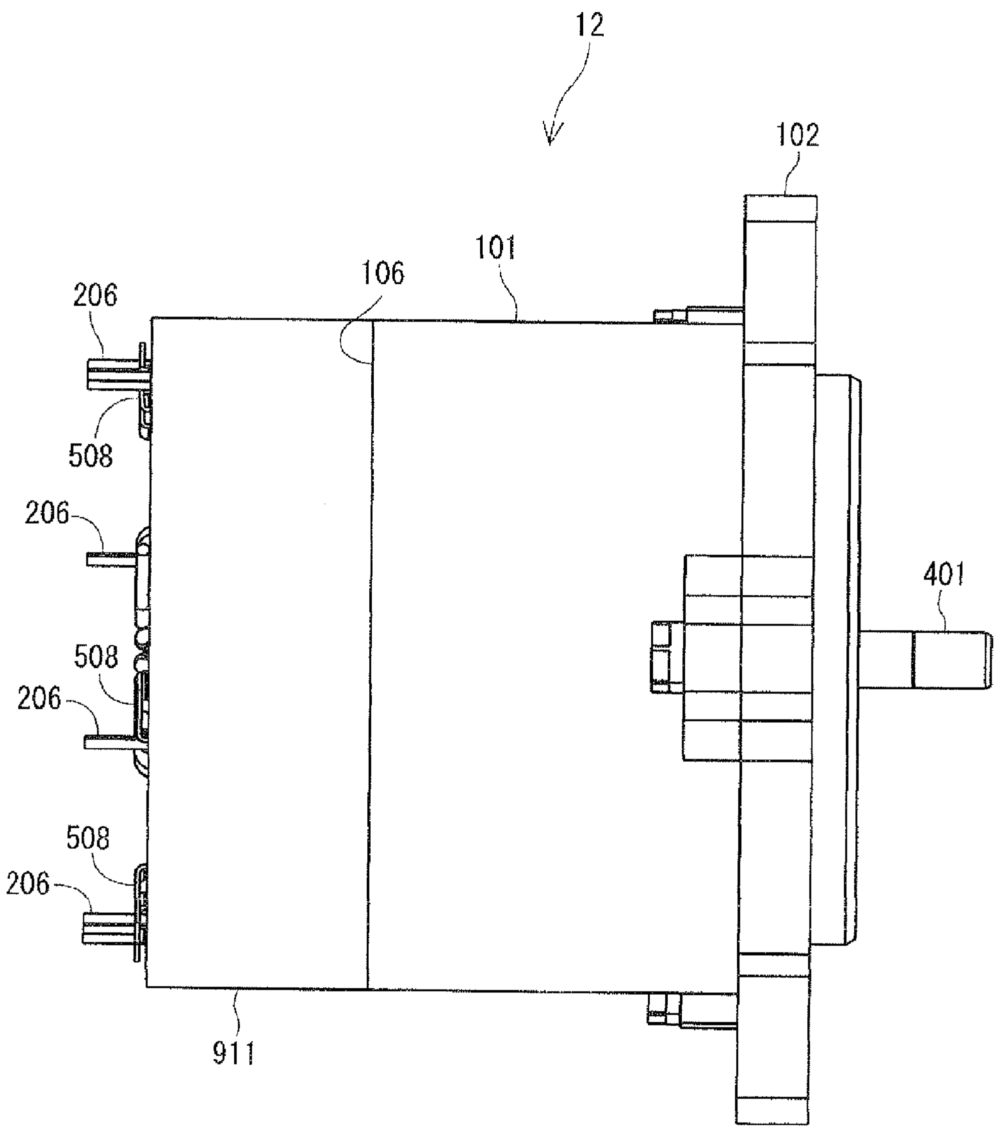
FIG. 24 is a side view of the electronic circuit-integrated motor apparatus according to the seventh embodiment.
Figure 25:
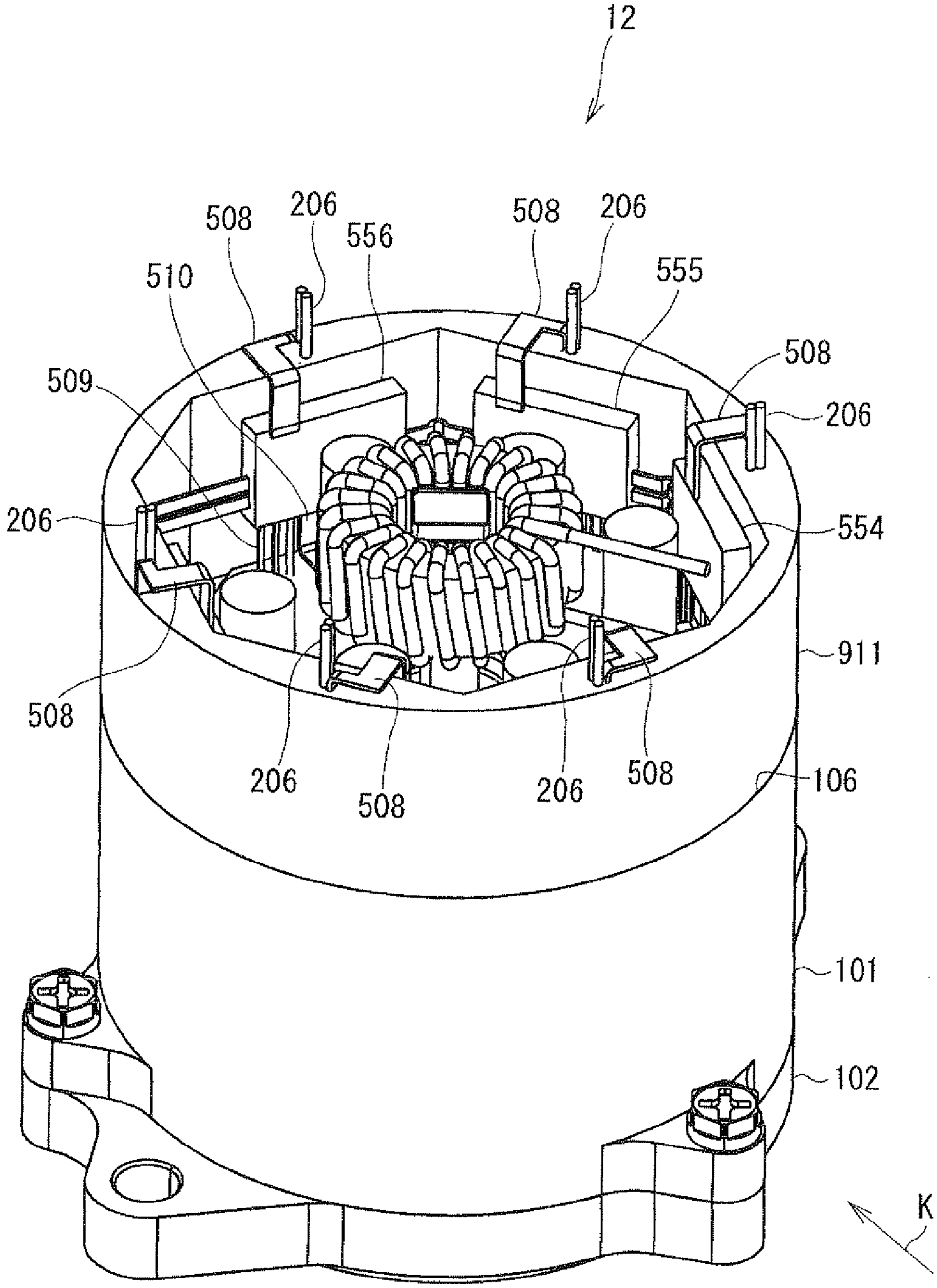
FIG. 25 is a perspective view of the electronic circuit-integrated motor apparatus according to the seventh embodiment.

The heat sink 911 is formed such that its cross section perpendicular to the axial direction is cylindrical in shape. A prismatic space is formed in the heat sink 911. The heat sink 911 has a side wall 912, which surrounds the centerline of the shaft 401. Here, the outer wall surface of the heat sink 911 forms a part of the shell of the motor apparatus 12 (FIGS. 24 and 25). The side wall 912 of the heat sink 911 has side wall surfaces 915, which face in a radially inward direction. A total of six side wall surfaces 915 are formed in a circumferential direction.

The semiconductor modules 551-556, which are provided for the heat sink 911, are disposed, one by one, on the side wall surfaces 915, which face in the radially inward direction. The semiconductor modules 551-556 are positioned such that the respective heat dissipation surfaces are in contact with the side wall surfaces 915. The side wall surfaces 915 are plane surfaces. Accordingly, the heat dissipation surfaces of the semiconductor modules 551-556 are also plane surfaces.

The semiconductor modules 551-556 are disposed on the side wall surfaces 915 of the heat sink 911 as described above. Therefore, a line perpendicular to a semiconductor chip surface is perpendicular to the centerline of the shaft 401.

Figure 26:
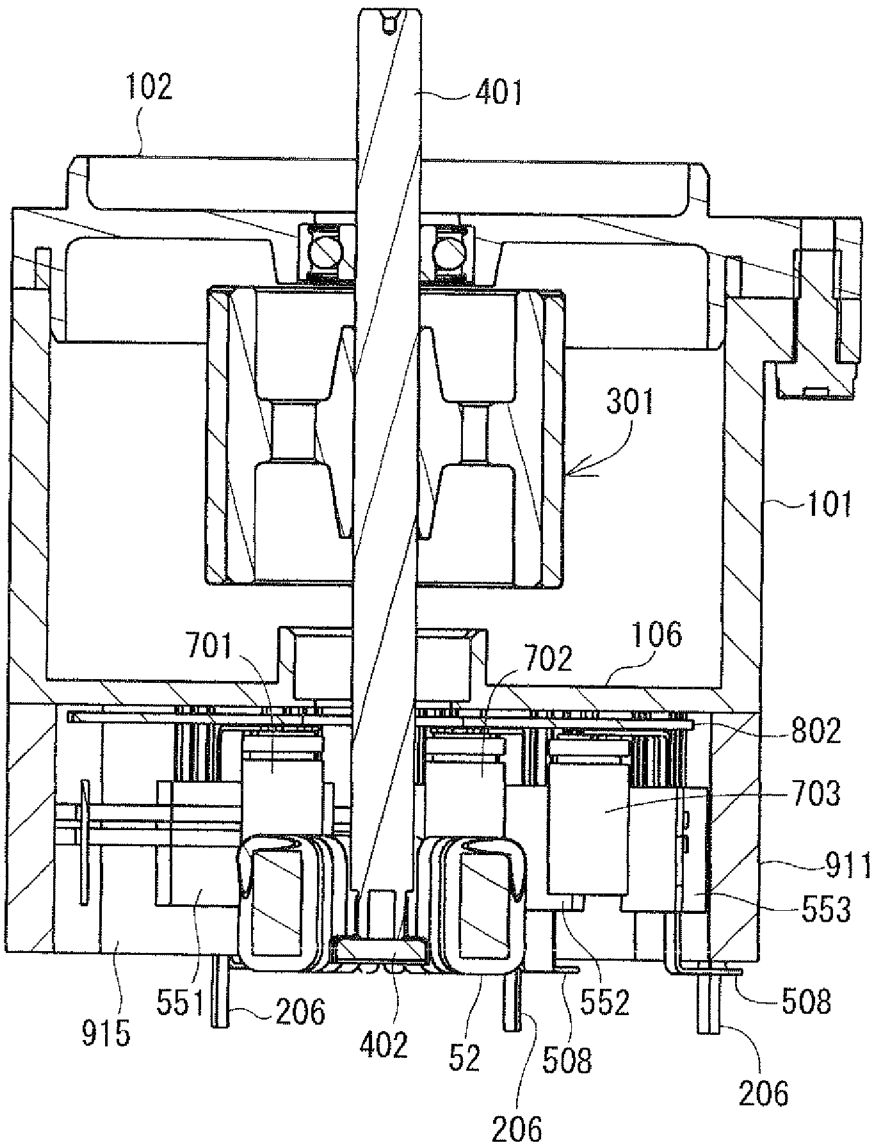
FIG. 26 is a cross-sectional view taken along line 26-26 in FIG. 23.

As shown in FIG. 26, a printed circuit board 802 is provided for the semiconductor modules 551-556 and positioned toward the motor case 101. Therefore, the present embodiment differs from the first embodiment in that the six control terminals 509 and the two capacitor terminals 510 of the semiconductor modules 551-556 are mounted on the end wall 106 of the motor case 101 (FIG. 25). Further, the semiconductor modules 551-556 have coil terminals 508, which are positioned opposite the end wall 106 of the motor case 101. Therefore, the lead-out wires 206 from the coil 205 are passed through the inside of the side wall 912 of the heat sink 911 and routed out to the end wall of the heat sink 911.

As shown, for instance, in FIG. 23, six capacitors 701, 702, 703, 704, 705, 706 are provided for the semiconductor modules 551-556 and disposed opposite the heat sink 911.

The capacitors 701-706 are provided for the semiconductor modules 551-556 on a one-to-one basis, and disposed near the semiconductor modules 551-556. The capacitors 701-706 are cylindrical in shape, and disposed so that the respective axes are parallel to the centerline of the shaft 401. Further, the capacitor terminals 510 of the semiconductor modules 551-556 are bent in a radially inward direction. Therefore, the terminals of the capacitors 701-706 are directly connected to the bent capacitor terminals 510.

The choke coil 52 is set such that the shaft 401 is inserted through the choke coil 52. The choke coil 52 is formed by winding a coil wire around a doughnut-shaped iron core.

The motor apparatus 2 according to the present embodiment provides the same advantages as advantages (1) to (4), (6) to (8), and (10) to (14) described in the first embodiment.

In the motor apparatus 12, in particular, the capacitors 701-706 provided for the semiconductor modules 551-556 are disposed opposite the heat sink 911, that is, disposed on the radially inside of the semiconductor modules 551-556. Therefore, the accommodation spaces for the capacitors 701-706 need not be formed on the heat sink 911.

Eighth Embodiment

Figure 27:
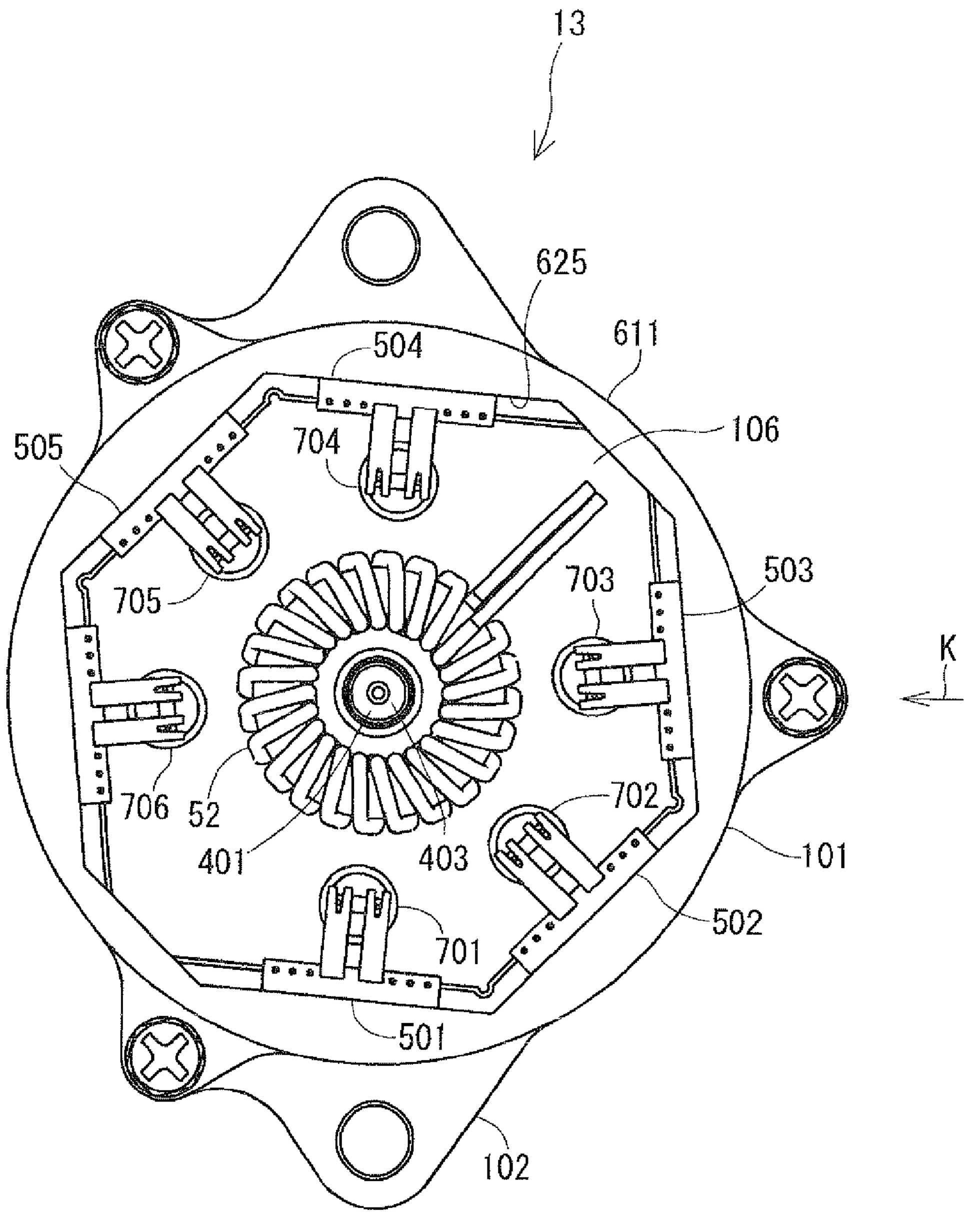
FIG. 27 is a plan view of an electronic circuit-integrated motor apparatus according to an eighth embodiment of the present invention.
Figure 28:
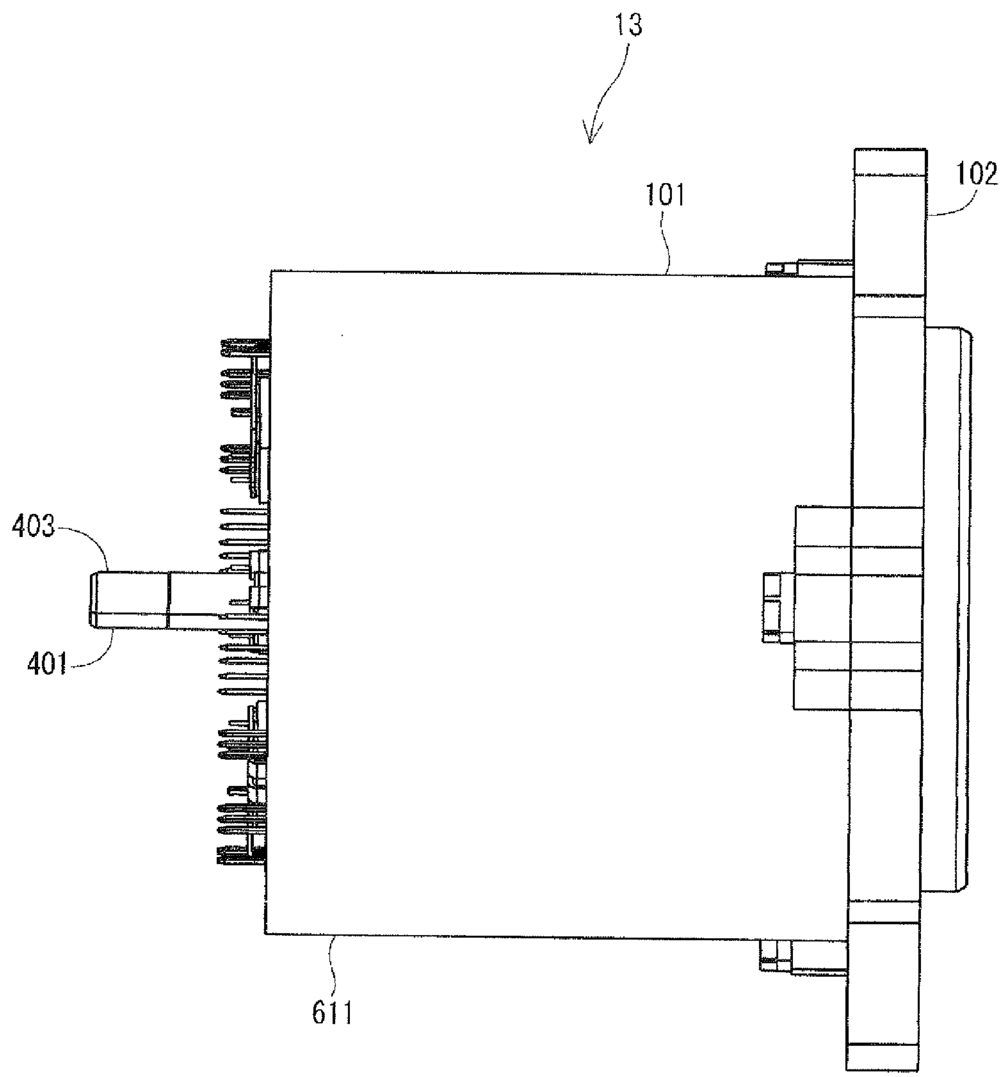
FIG. 28 is a side view of the electronic circuit-integrated motor apparatus according to the eighth embodiment.
Figure 29:
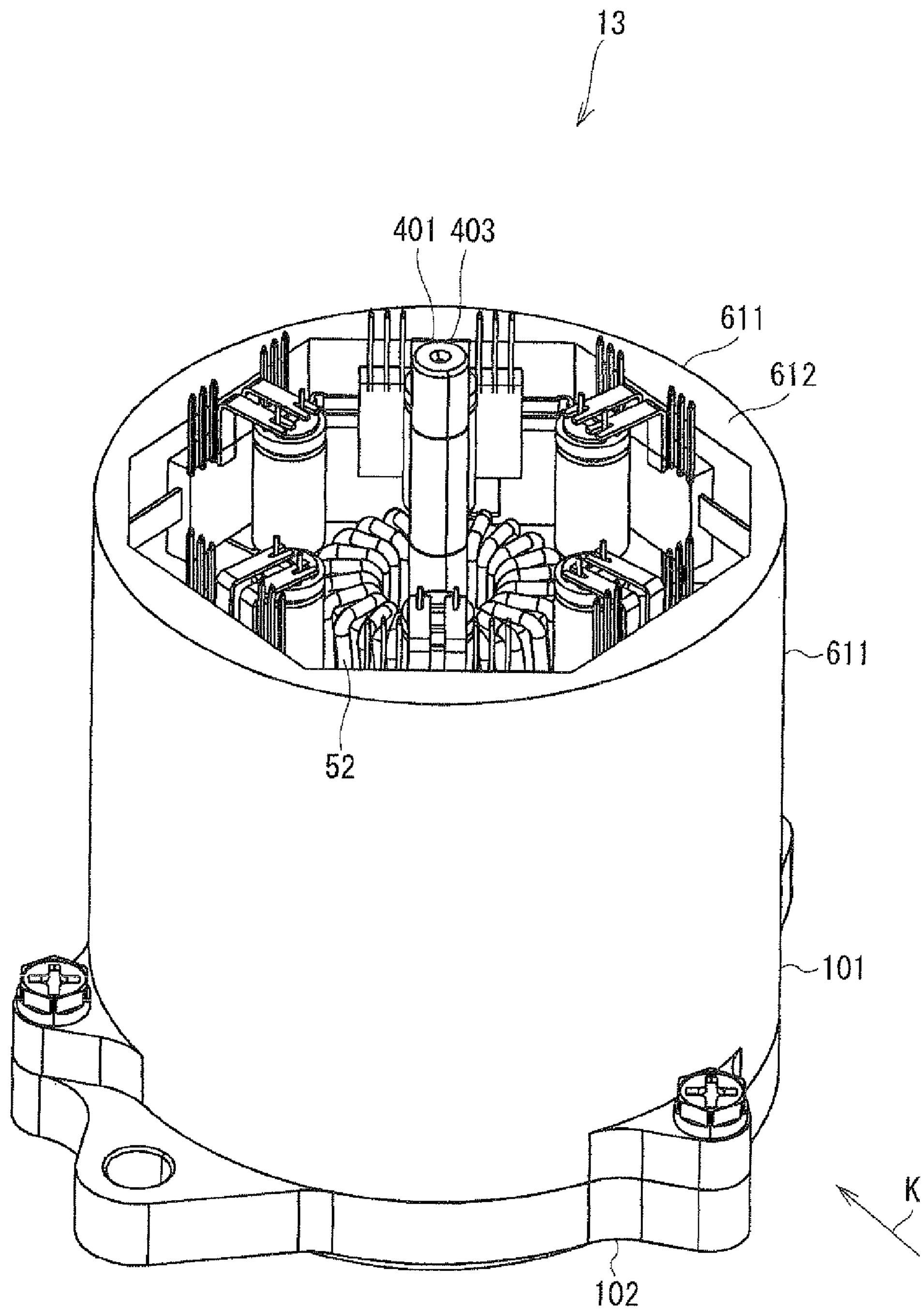
FIG. 29 is a perspective view of the electronic circuit-integrated motor apparatus according to the eighth embodiment.

As shown in FIGS. 27 to 29, a motor apparatus 13 according to an eighth embodiment of the present invention has substantially the same configuration as the motor apparatus 2 (FIGS. 8 to 10). More specifically, the motor apparatus 13 includes six semiconductor modules 501, 502, 503, 504, 505, 506. The semiconductor modules 501-506 are mounted on the heat sink 611, which is extended in the same direction as the direction of the centerline of the shaft 401 from the end wall 106 of the motor case 101. Six capacitors 701, 702, 703, 704, 705, 706 are provided for the semiconductor modules 501-506 and disposed opposite the heat sink 611. The choke coil 52 is set such that the shaft 401 is inserted through the choke coil 52.

The motor apparatus 13 according to the present embodiment differs from the motor apparatus 2 according to the second embodiment in that the power circuit 50 is positioned toward an output end 403 of the shaft 401.

The motor apparatus 13 according to the present embodiment provides the same advantages as advantages (1) to (4), (6) to (8), and (10) to (14) described in the first embodiment.

In the motor apparatus 13, in particular, the capacitors 701-706 provided for the semiconductor modules 501-506 are disposed opposite the heat sink 611. Therefore, the accommodation spaces for the capacitors 701-706 need not be formed on the heat sink 611.

Ninth Embodiment

Figure 30:
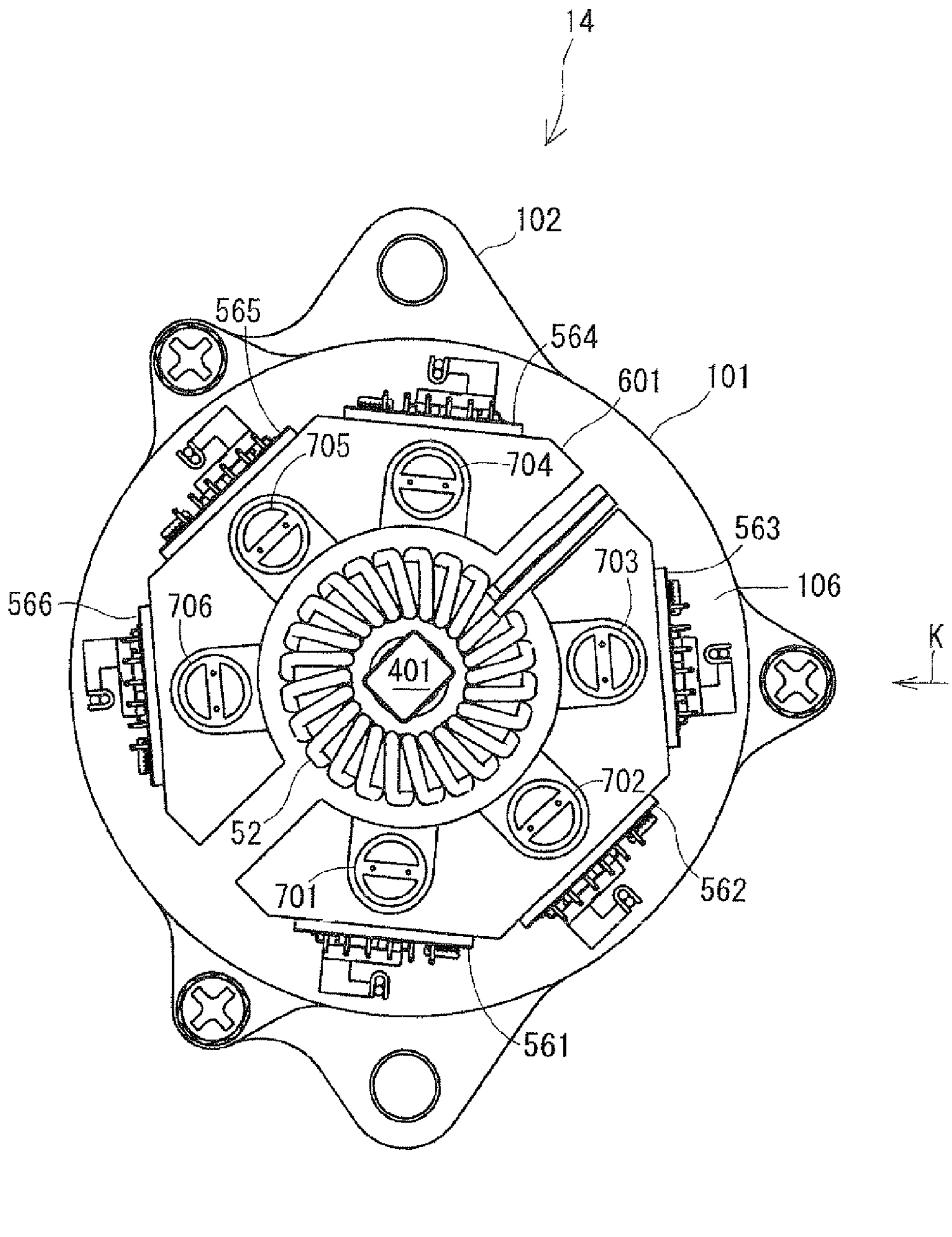
FIG. 30 is a plan view of an electronic circuit-integrated motor apparatus according to a ninth embodiment of the present invention.
Figure 31:
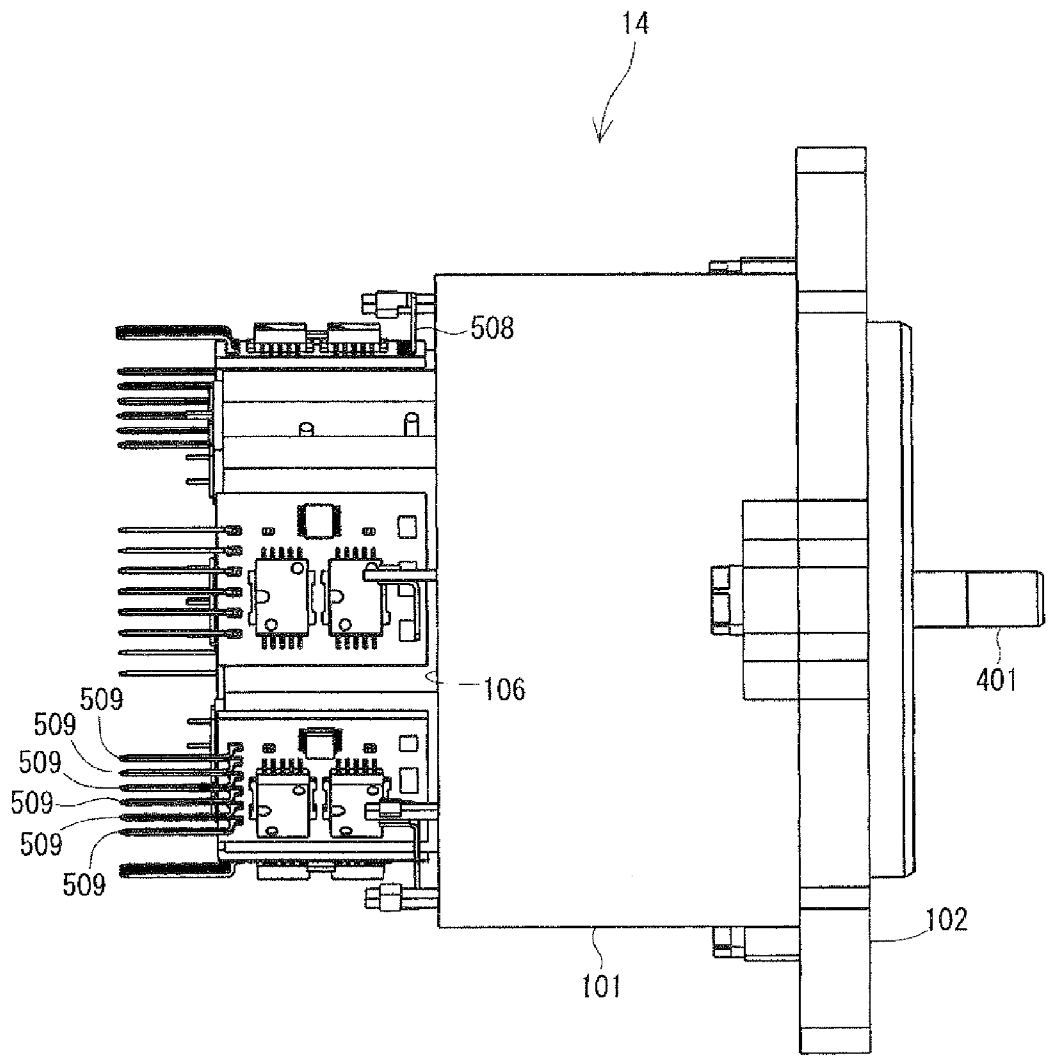
FIG. 31 is a side view of the electronic circuit-integrated motor apparatus according to the ninth embodiment.
Figure 32:
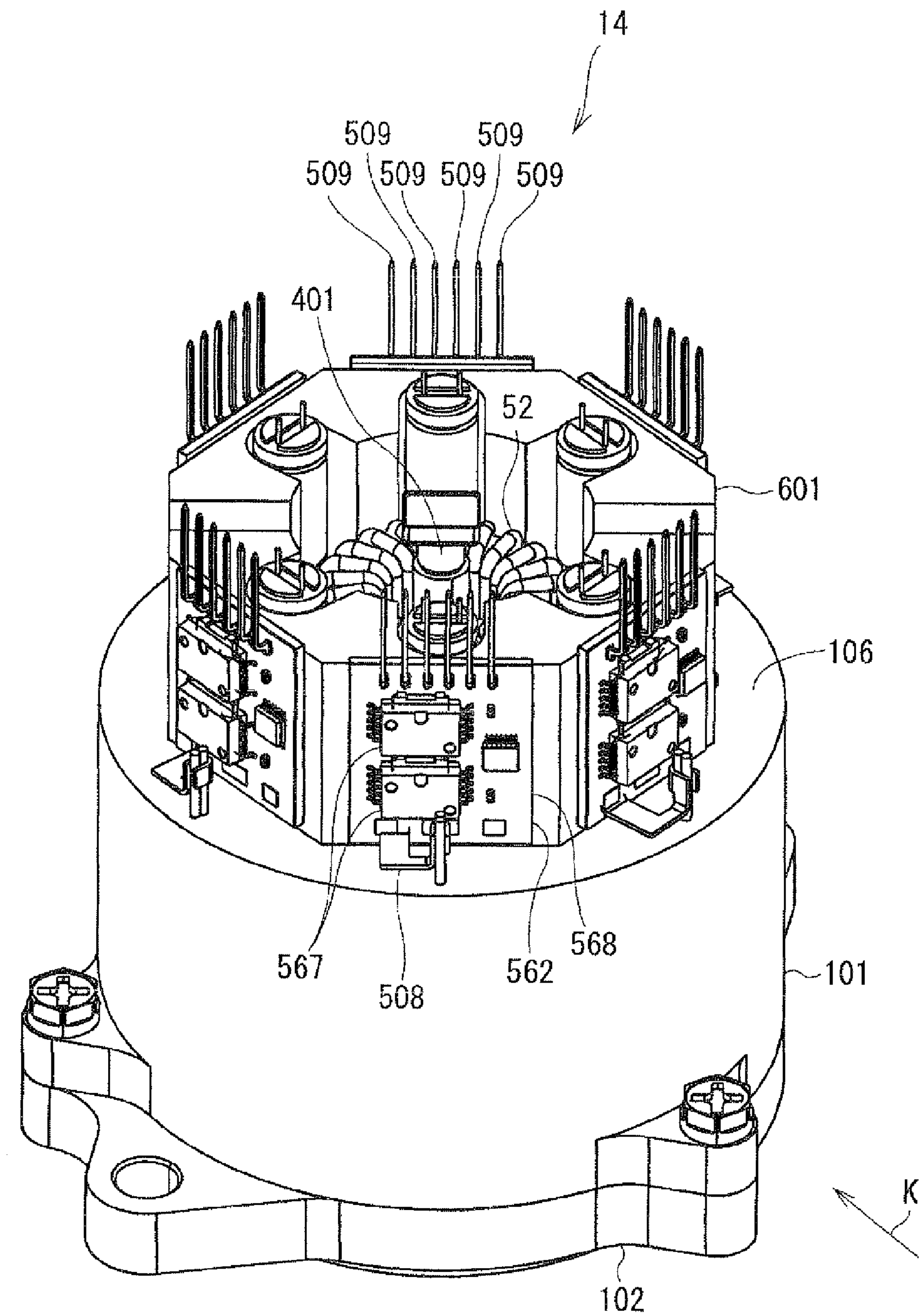
FIG. 32 is a perspective view of the electronic circuit-integrated motor apparatus according to the ninth embodiment.

As shown in FIGS. 30 to 32, a motor apparatus 14 according to a ninth embodiment of the present invention has substantially the same configuration as the motor apparatus 1 (FIGS. 2 to 6). More specifically, the motor apparatus 14 includes six semiconductor modules 561, 562, 563, 564, 565, 566. The semiconductor modules 561-566 are mounted on the heat sink 601, which is extended in the same direction as the direction of the centerline of the shaft 401 from the end wall 106 of the motor case 101. Six capacitors 701, 702, 703, 704, 705, 706 are provided for the semiconductor modules 561-566 and disposed on the same side as the heat sink 601. The choke coil 52 is set such that the shaft 401 is inserted through the choke coil 52 (FIG. 32).

The motor apparatus 14 differs from the motor apparatus 1 in the configuration of the semiconductor modules 561-566. As shown in FIG. 32, the semiconductor modules 561-566 are formed by mounting, for instance, an IC 567 on a metal circuit board 568. The IC 567 is formed by molding a semiconductor chip with resin.

Here, the semiconductor modules 561-566 have the coil terminals 508; which are positioned toward the motor case 101, and six control terminals 509, which are positioned opposite the motor case 101 (FIGS. 30 and 32).

The motor apparatus 14 according to the present embodiment provides the same advantages as advantages (1) to (13) described in the first embodiment.

The motor apparatus 14, in particular, excels in heat dissipation performance because it uses the metal circuit board 568.

Tenth Embodiment

Figure 33:
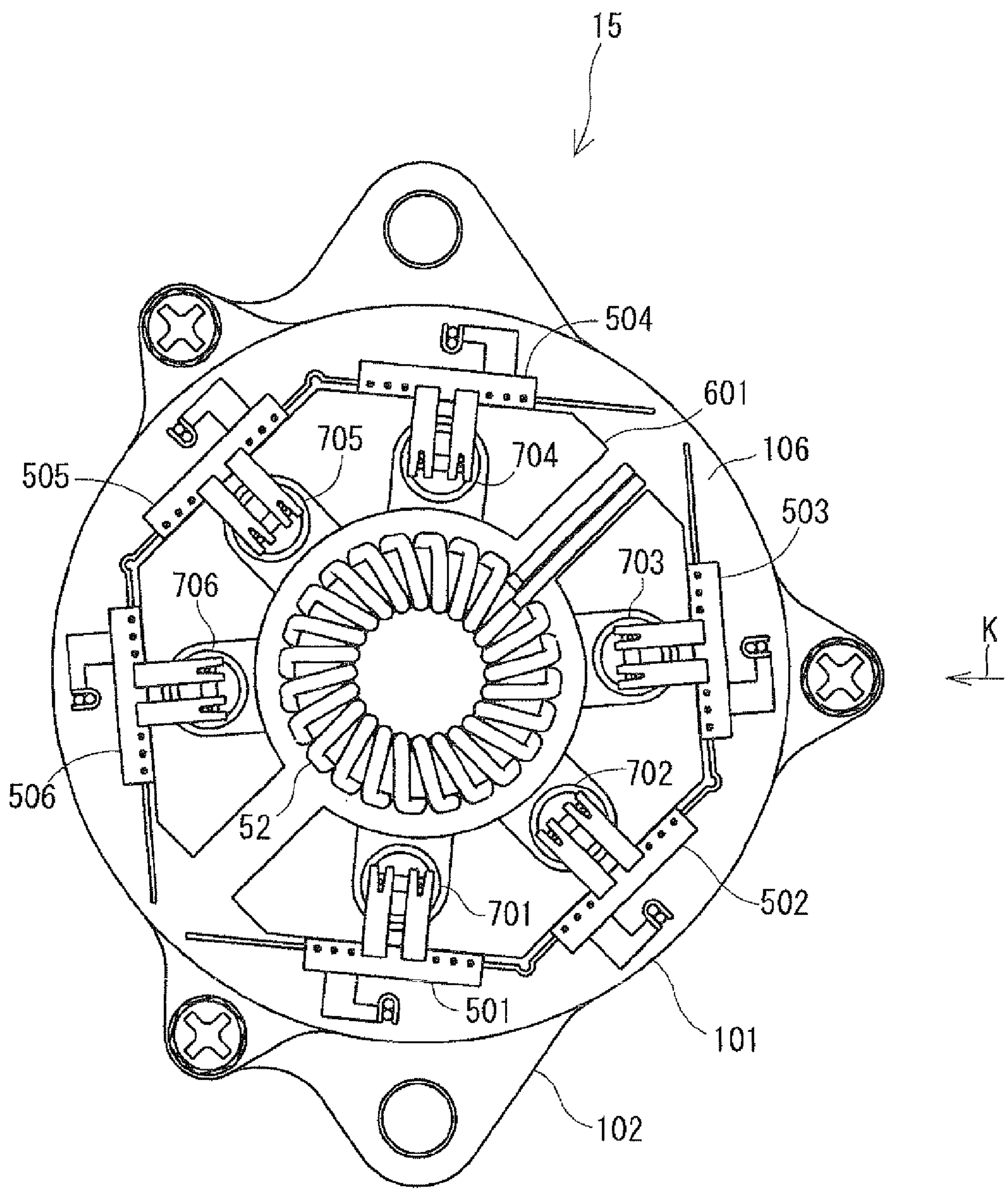
FIG. 33 is a plan view of an electronic circuit-integrated motor apparatus according to a tenth embodiment of the present invention.
Figure 34:
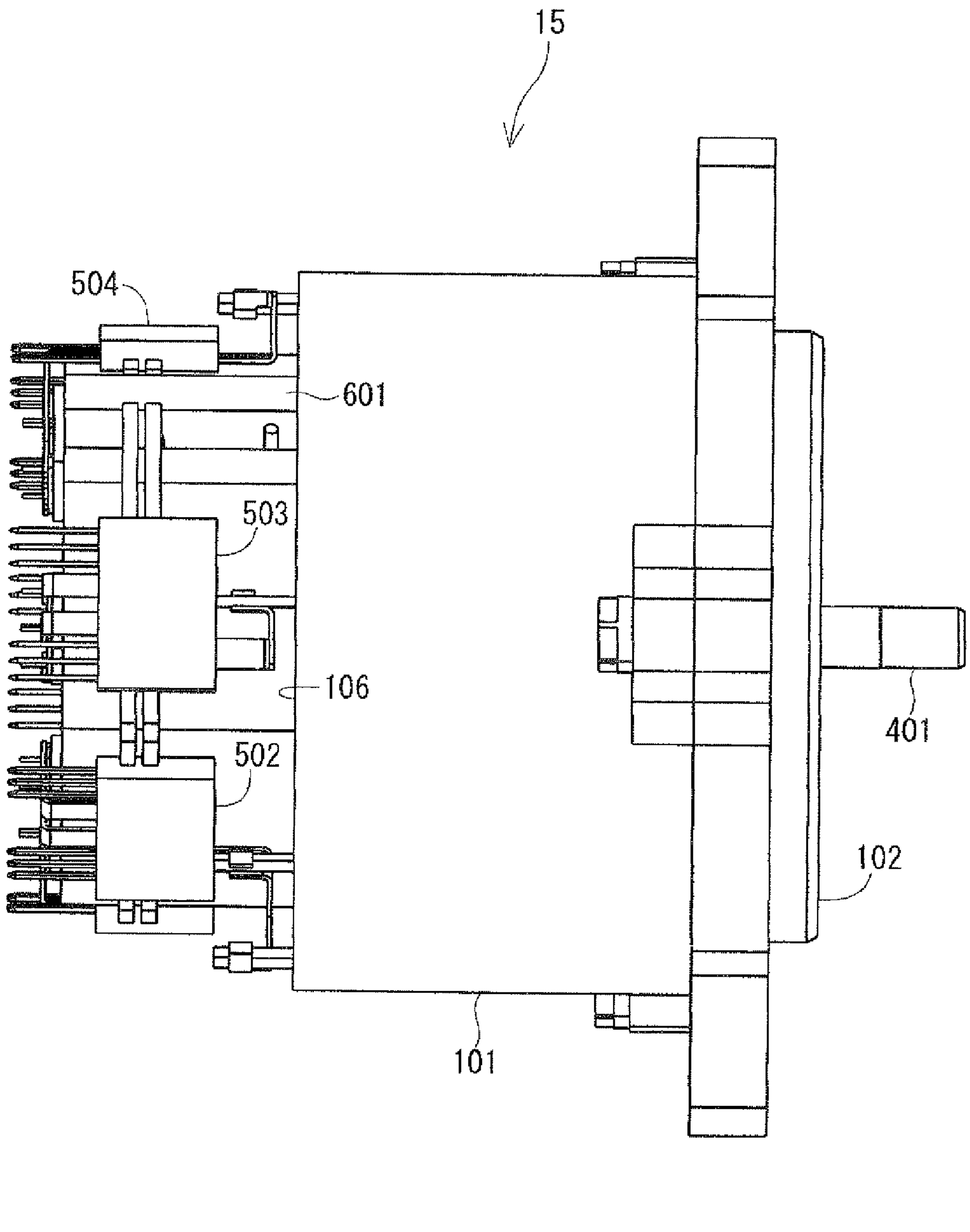
FIG. 34 is a side view of the electronic circuit-integrated motor apparatus according to the tenth embodiment.
Figure 35:
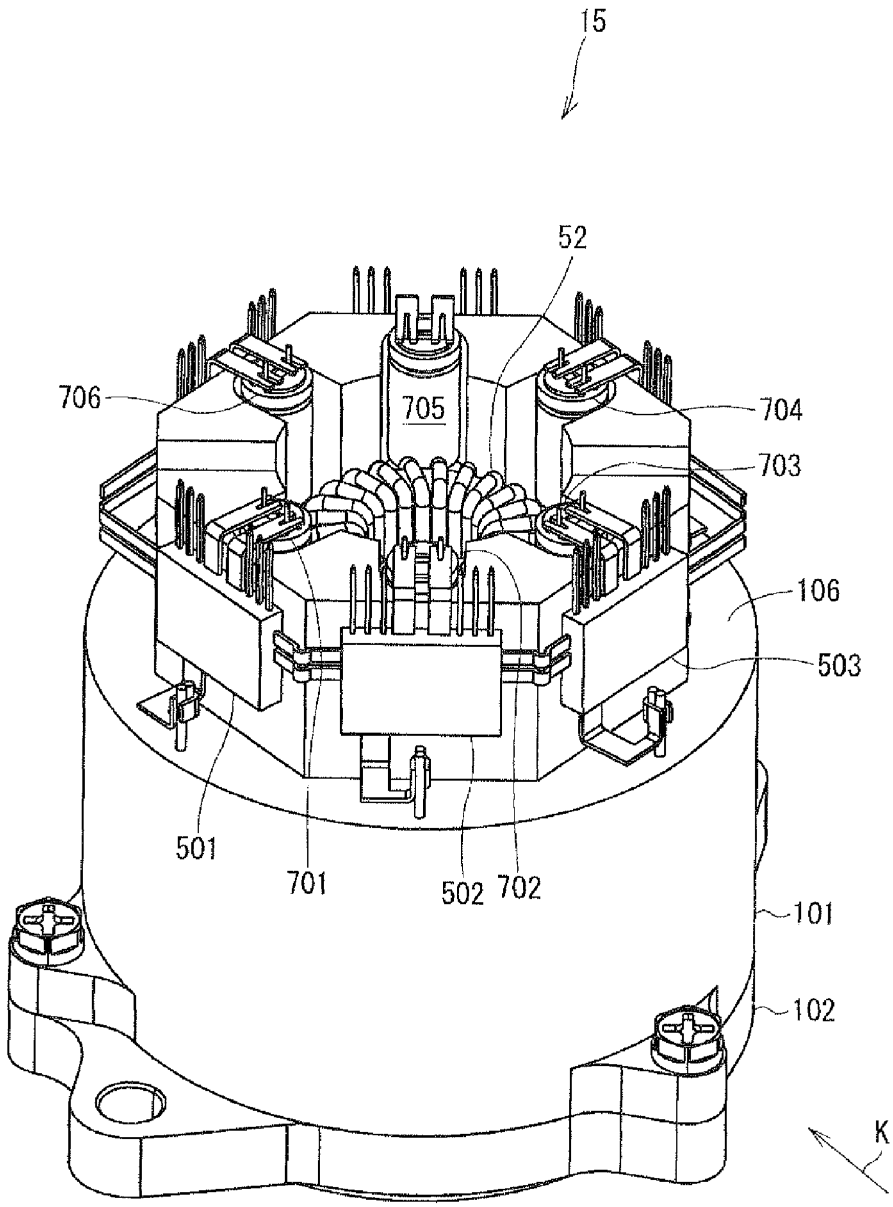
FIG. 35 is a perspective view of the electronic circuit-integrated motor apparatus according to the tenth embodiment.

As shown in FIGS. 33 to 35, a motor apparatus 15 according to a tenth embodiment of the present invention has substantially the same configuration as the motor apparatus 1 (FIGS. 2 to 6). More specifically, the motor apparatus 15 includes six semiconductor modules 501, 502, 503, 504, 505, 506. The semiconductor modules 501-506 are mounted on the heat sink 601, which is extended in the same direction as the direction of the centerline of the shaft 401 from the end wall 106 of the motor case 101. Six capacitors 701, 702, 703, 704, 705, 706 are provided for the semiconductor modules 501-506 and disposed on the same side as the heat sink 601.

The motor apparatus 15 differs from the motor apparatus 1 according to the foregoing embodiments in that the shaft 401 is extended toward electronic circuit parts and not inserted through the choke coil 52.

The motor apparatus 15 according to the present embodiment provides the same advantages as advantages (1) to (14) described in the first embodiment.

Eleventh Embodiment

Figure 36:
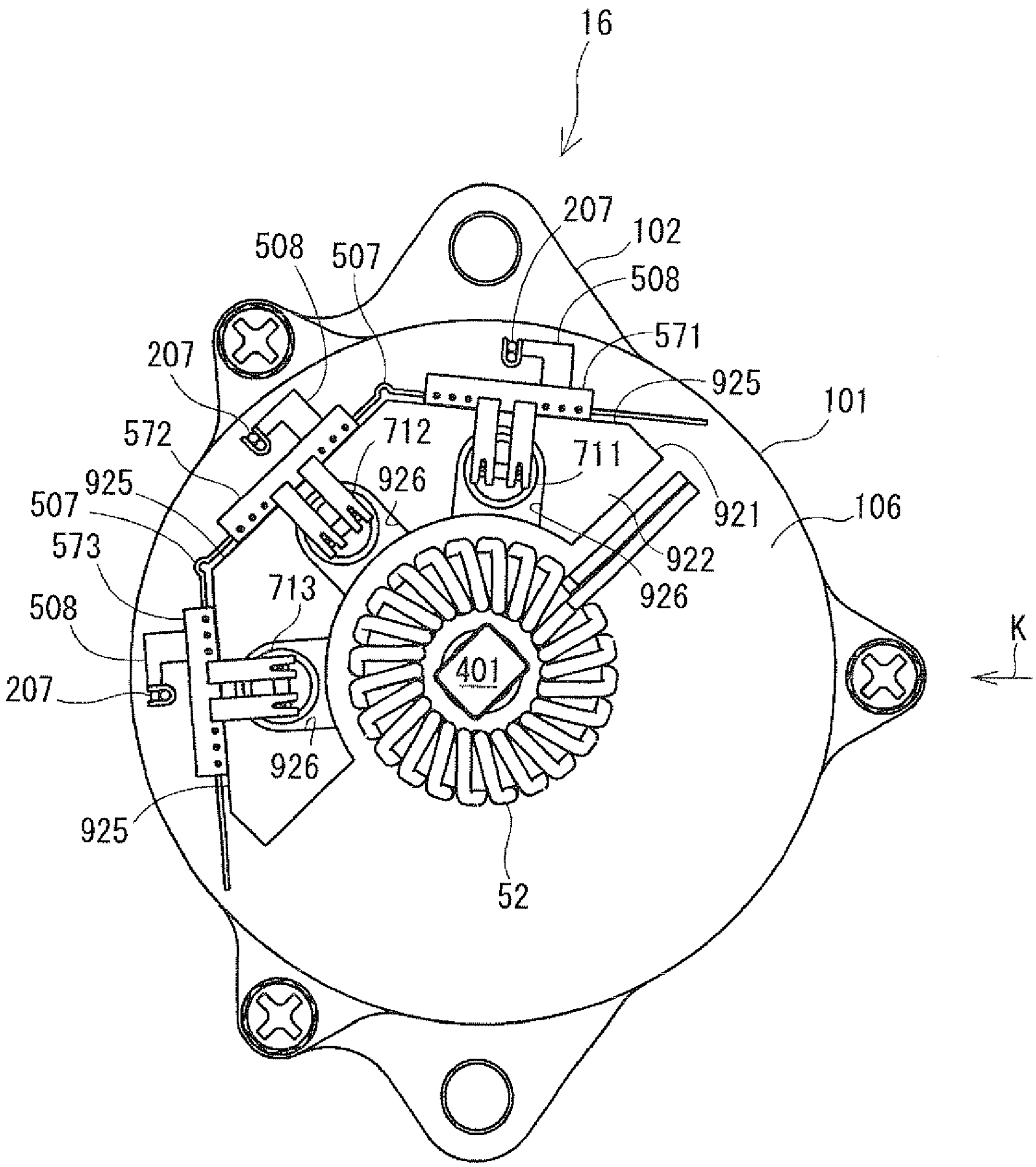
FIG. 36 is a plan view of an electronic circuit-integrated motor apparatus according to an eleventh embodiment of the present invention.
Figure 37:
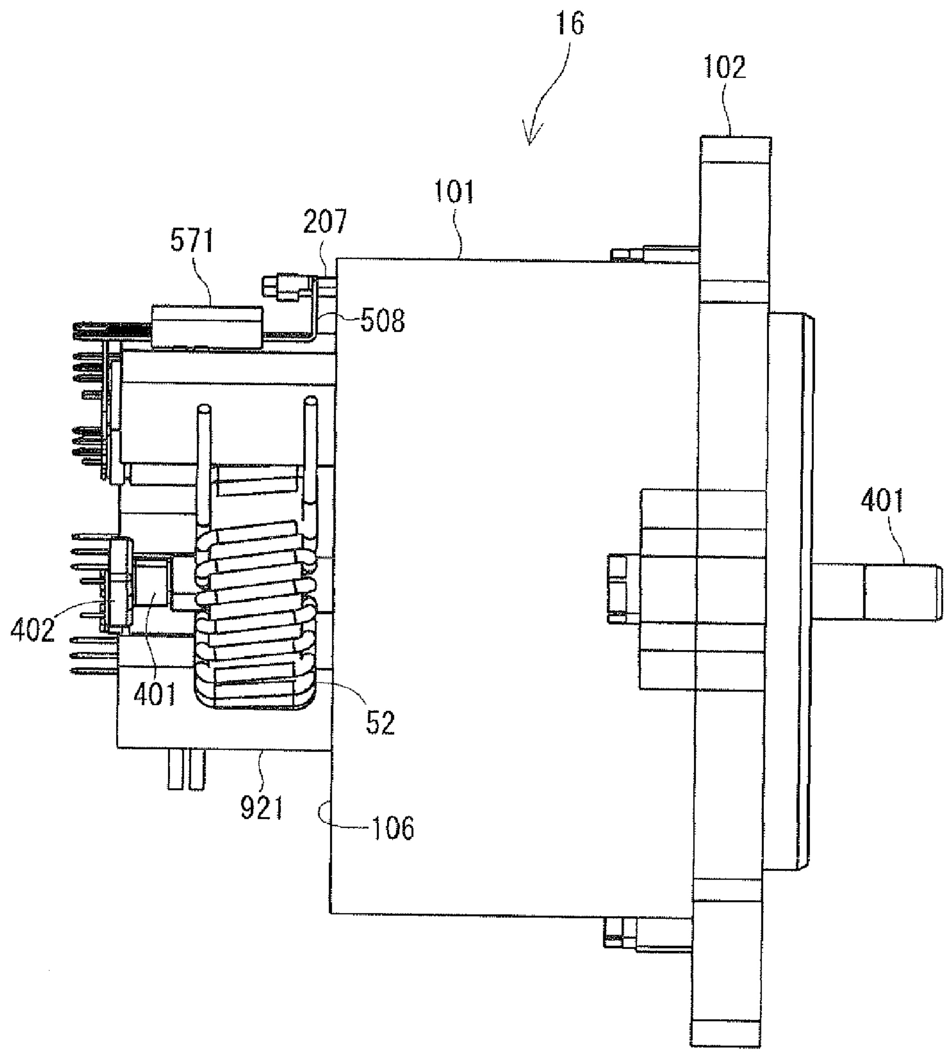
FIG. 37 is a side view of the electronic circuit-integrated motor apparatus according to the eleventh embodiment.
Figure 38:
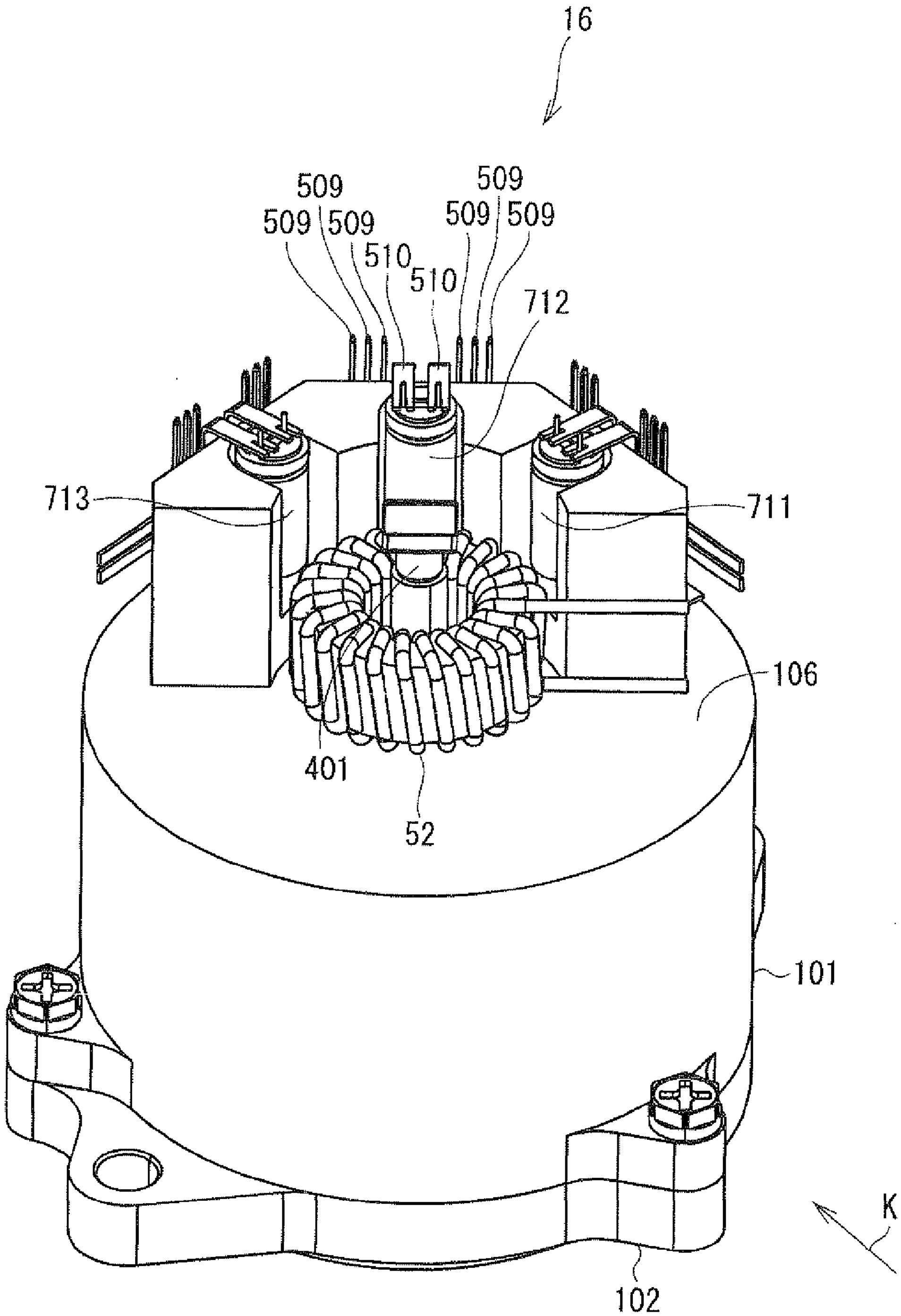
FIG. 38 is a perspective view of the electronic circuit-integrated motor apparatus according to the eleventh embodiment.

A motor apparatus 16 according to an eleventh embodiment of the present invention includes three semiconductor modules 571, 572, 573, as shown in FIGS. 36 to 38. The three semiconductor modules 571-573 are coupled by the bus bars 507 to form a module unit.

The semiconductor modules 571-573 are mounted on a heat sink 921, which is extended in the same direction as the direction of the centerline of the shaft 401 from the end wall 106 of the motor case 101.

As shown in FIG. 36, the heat sink 921 is configured so that one columnar member whose cross section perpendicular to the axial direction is substantially trapezoidal in shape is formed on one side of the centerline of the shaft 401. Further, the heat sink 921 is shaped so that a predefined radial portion is cut out from the center of the shaft 401. The heat sink 921 has a side wall 922.

The side wall 922 has side wall surfaces 925, which face in a radially outward direction. The side wall surfaces 925 are plane surfaces. A total of three side wall surfaces 925 facing in the radially outward direction are circumferentially formed. An accommodation space 926 is formed in the radially inward direction of each side wall surface 925.

The semiconductor modules 571-573 provided for the heat sink 921 are disposed on the side wall surfaces 925, which face in the radially outward direction. The semiconductor modules 571-573 are disposed such that the respective heat dissipation surfaces are in contact with the side wall surfaces 925. The side wall surfaces 925 are plane surfaces. Accordingly, the heat dissipation surfaces of the semiconductor modules 571-573 are also plane surfaces.

As the semiconductor modules 571-573 are disposed on the side wall surfaces 925 of the heat sink 921, the respective semiconductor chip surfaces are perpendicular to the centerline of the shaft 401.

The semiconductor modules 571-573 have coil terminals 508, which are positioned on the end wall 106 of the motor case 101. The coil terminals 508 are electrically connected to lead-out wires 207, which are routed from three points of the end wall 106 of the motor case 101, in such a manner as to sandwich the lead-out wires 207 (FIGS. 36 and 37). The semiconductor modules 571-573 have six control terminals 509 and two capacitor terminals 510, which are positioned opposite the end wall 106 of the motor case 101 (FIG. 38).

As shown, for instance, in FIG. 36, three capacitors 711, 712, 713 are provided for the semiconductor modules 571-573 and disposed on the same side as the heat sink 921. More specifically, the capacitors 711, 712, 713 are disposed in the accommodation spaces 926 of the heat sink 921.

The capacitors 711-713 are provided for the semiconductor modules 571-573 on a one-to-one basis, and disposed near the semiconductor modules 571-573. The capacitors 711-713 are cylindrical in shape, and disposed so that the respective axes are parallel to the centerline of the shaft 401. Further, the capacitor terminals 510 of the semiconductor modules 571-573 are bent in a radially inward direction. Therefore, the terminals of the capacitors 711-713 are directly connected to the bent capacitor terminals 510.

The choke coil 52 is set such that the shaft 401 is inserted through the choke coil 52 (FIG. 38). The choke coil 52 is formed by winding a coil wire around a doughnut-shaped iron core.

The motor apparatus 16 according to the present embodiment provides the same advantages as advantages (1) to (14) described in the first embodiment.

Twelfth Embodiment

Figure 39:
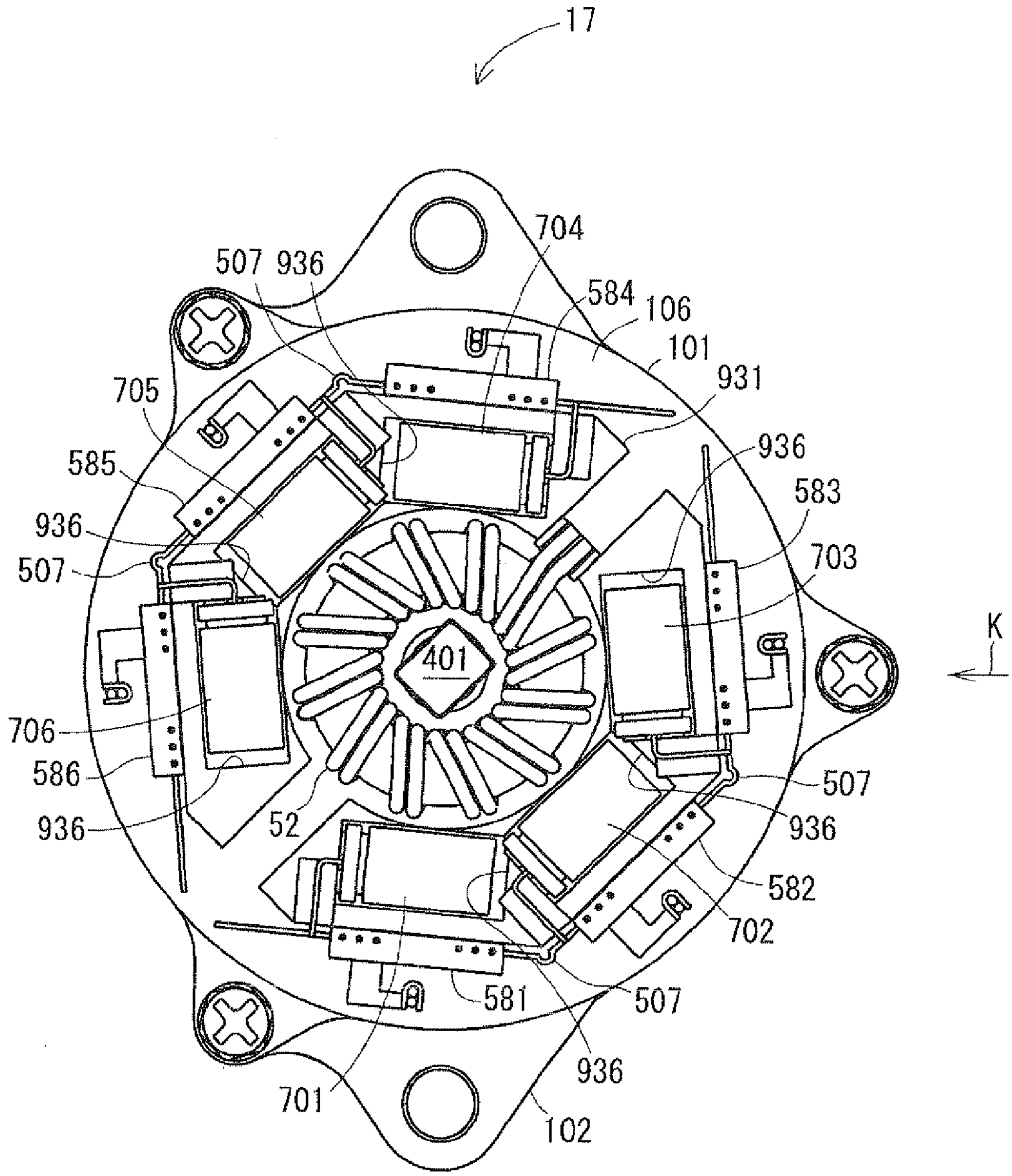
FIG. 39 is a plan view of an electronic circuit-integrated motor apparatus according to a twelfth embodiment of the present invention.
Figure 40:
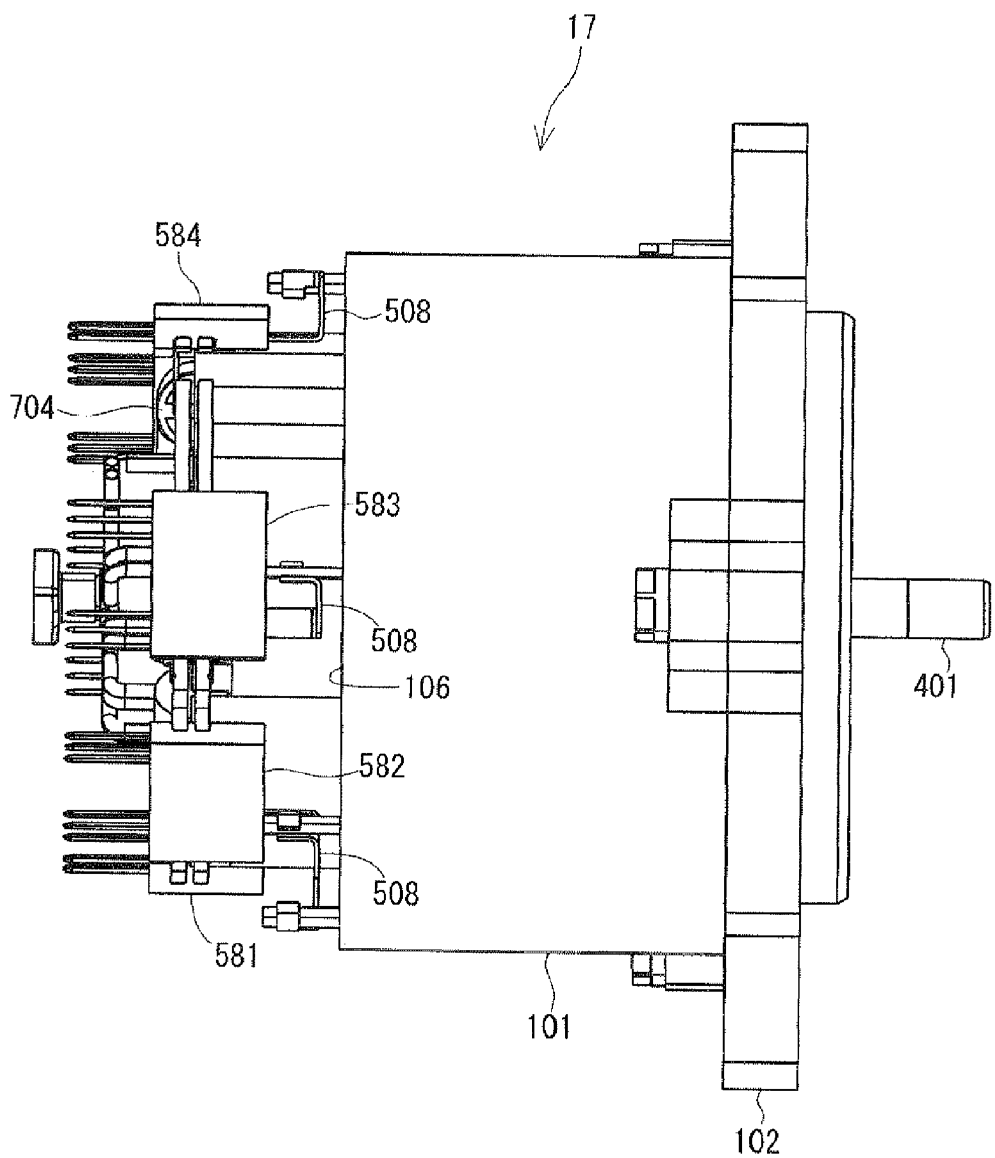
FIG. 40 is a side view of the electronic circuit-integrated motor apparatus according to the twelfth embodiment.
Figure 41:
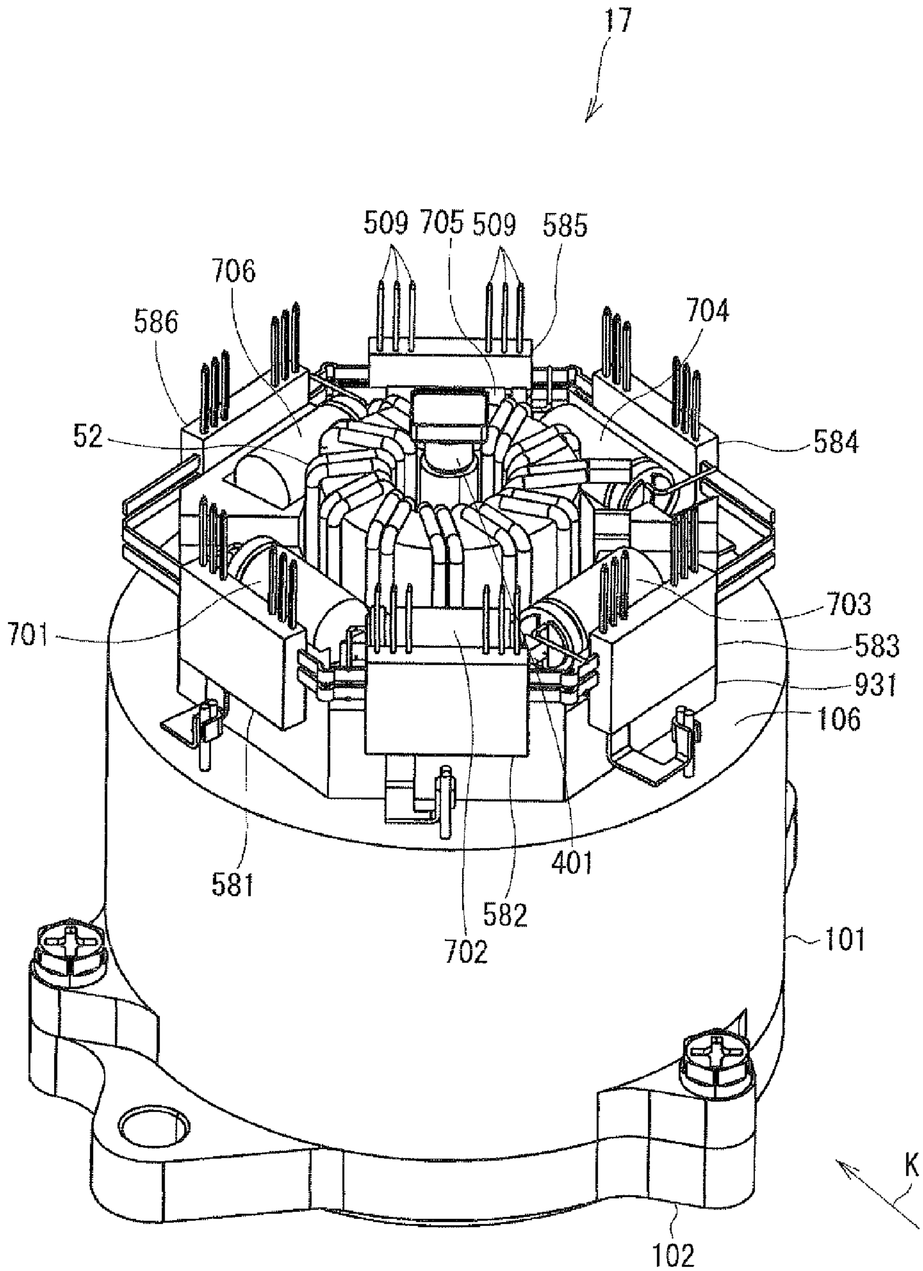
FIG. 41 is a perspective view of the electronic circuit-integrated motor apparatus according to the twelfth embodiment.

As shown in FIGS. 39 to 41, a motor apparatus 17 according to a twelfth embodiment of the present invention has substantially the same configuration as the motor apparatus 1 (FIGS. 2 to 6). More specifically, the motor apparatus 17 includes six semiconductor modules 581, 582, 583, 584, 585, 586. The semiconductor modules 581-586 are mounted on a heat sink 931, which is extended in the same direction as the direction of the centerline of the shaft 401 from the end wall 106 of the motor case 101. Six capacitors 701, 702, 703, 704, 705, 706 are provided for the semiconductor modules 581-586 and disposed on the same side as the heat sink 931.

The motor apparatus 17 differs from the motor apparatus 1 in that the axes of the capacitors 701-706 are perpendicular to the centerline of the shaft 401. That is, the capacitors 701-706, which are cylindrical in shape, are placed transversely. Therefore, the heat sink 931 has accommodation spaces 936 whose cross section perpendicular to the axial direction is rectangular in shape. The accommodation spaces 936 are formed on an end wall that is placed in the axial direction. Here, the terminals of the capacitors 701-706 are directly connected to the bus bars 507, which operate as a power supply line. As for the semiconductor modules 581-586, a side opposite the motor case 101 is provided with only six control terminals 509 but no capacitor terminals (FIG. 41).

The motor apparatus 17 according to the present embodiment provides the same advantages as advantages (1), (2), and (4) to (14) described in the first embodiment.

In the motor apparatus 17, in particular, the capacitors 701-706 are placed transversely near the semiconductor modules 581-586. Therefore, the accommodation spaces 936 formed on the heat sink 931 need not be deep in the axial direction unlike the accommodation spaces 606 according to the first embodiment (FIG. 2). This makes it possible to inhibit the heat dissipation performance of the heat sink 931 from being degraded. Further, the terminals of the capacitors 701-706 are directly connected to the bus bars 507 of the semiconductor modules 581-586. Thus, the length of the wiring between the semiconductor modules 581-586 and the capacitors 701-706 can be minimized to let the capacitors 701-706 deliver the full-expected performance. Furthermore, the capacitors 701-706 are provided for the semiconductor modules 581-586 on a one-to-one basis. Thus, the capacitances of the capacitors 701-706 can be made relatively small to reduce the physical sizes of the capacitors 701-706.

Thirteenth Embodiment

Figure 42:
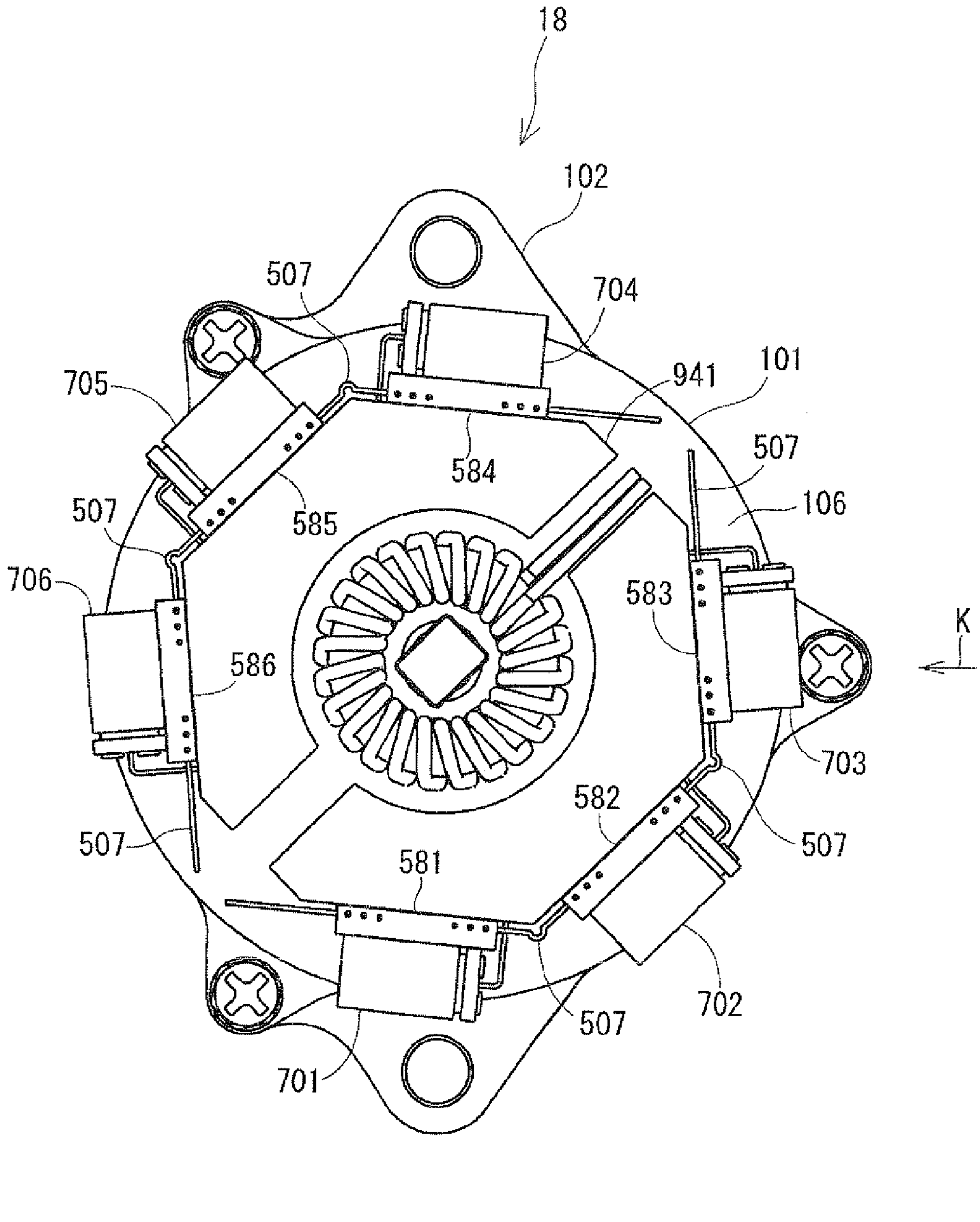
FIG. 42 is a plan view of an electronic circuit-integrated motor apparatus according to a thirteenth embodiment of the present invention.
Figure 43:
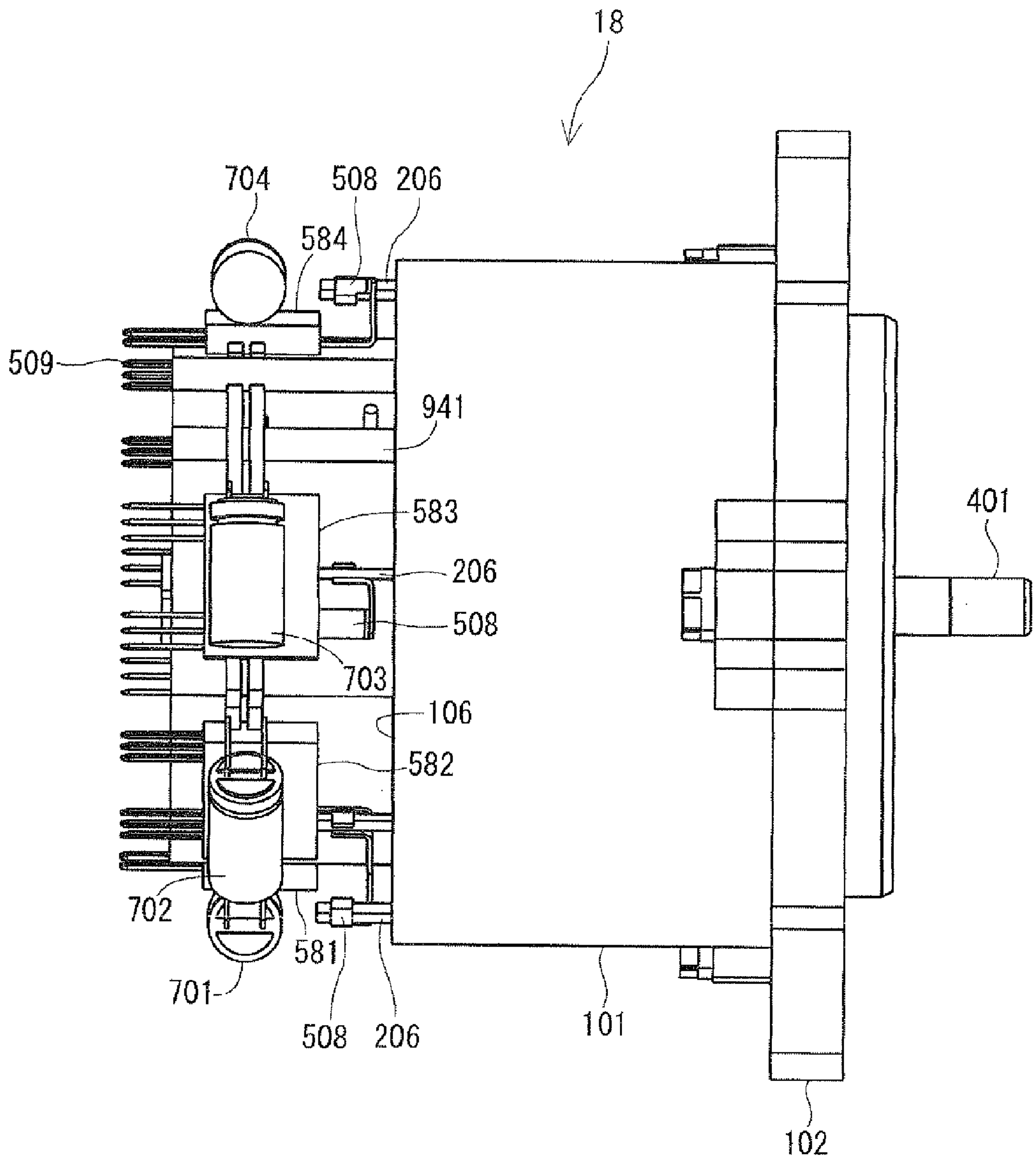
FIG. 43 is a side view of the electronic circuit-integrated motor apparatus according to the thirteenth embodiment.
Figure 44:
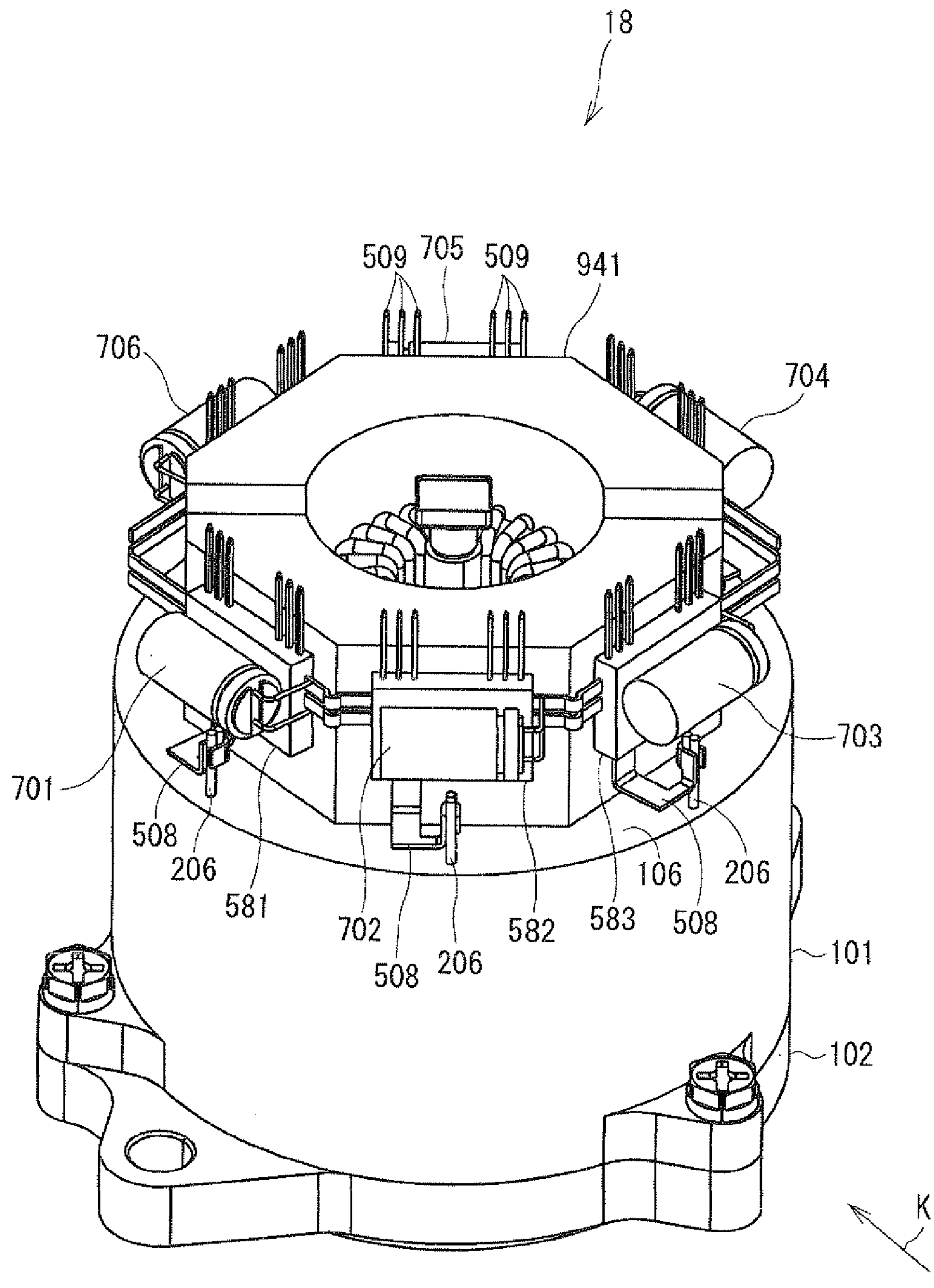
FIG. 44 is a perspective view of the electronic circuit-integrated motor apparatus according to the thirteenth embodiment.

As shown in FIGS. 42 to 44, a motor apparatus 18 according to a thirteenth embodiment of the present invention has substantially the same configuration as the motor apparatus 17 (FIGS. 39 to 41). More specifically, the motor apparatus 18 includes six semiconductor modules 581, 582, 583, 584, 585, 586. The semiconductor modules 581-586 are mounted on a heat sink 941, which is extended in the same direction as the direction of the centerline of the shaft 401 from the end wall 106 of the motor case 101. Six capacitors 701, 702, 703, 704, 705, 706 are provided transversely for the semiconductor modules 581-586.

The motor apparatus 18 differs from the motor apparatus 17 in that the capacitors 701-706 are disposed opposite the heat sink 941. The capacitors 701-706 are disposed on the radially outside of the semiconductor modules 581-586. Here, the terminals of the capacitors 701-706 are directly connected to the bus bars 507, which operate as a power supply line. The semiconductor modules 581-586 have, on respective side surfaces opposite the motor case, only six control terminals 509 and no capacitor terminals (FIG. 44).

The motor apparatus 18 according to the present embodiment also provides the same advantages as advantages (1), (2), and (4) to (14) described in the first embodiment.

In the motor apparatus 18, in particular, the capacitors 701-706 are placed transversely near the semiconductor modules 581-586, and disposed on the radially outside of the semiconductor modules 581-586. Therefore, no accommodation spaces need be formed on the heat sink 941. Further, the terminals of the capacitors 701-706 are directly connected to the bus bars 507 of the semiconductor modules 581-586. Thus, the length of the wiring between the semiconductor modules 581-586 and the capacitors 701-706 can be minimized to let the capacitors 701-706 deliver the full-expected performance. Furthermore, the capacitors 701-706 are provided for the semiconductor modules 581-586 on a one-to-one basis. Thus, the capacitances of the capacitors 701-706 can be made relatively small to reduce the physical sizes of the capacitors 701-706.

Fourteenth Embodiment

Figure 45:
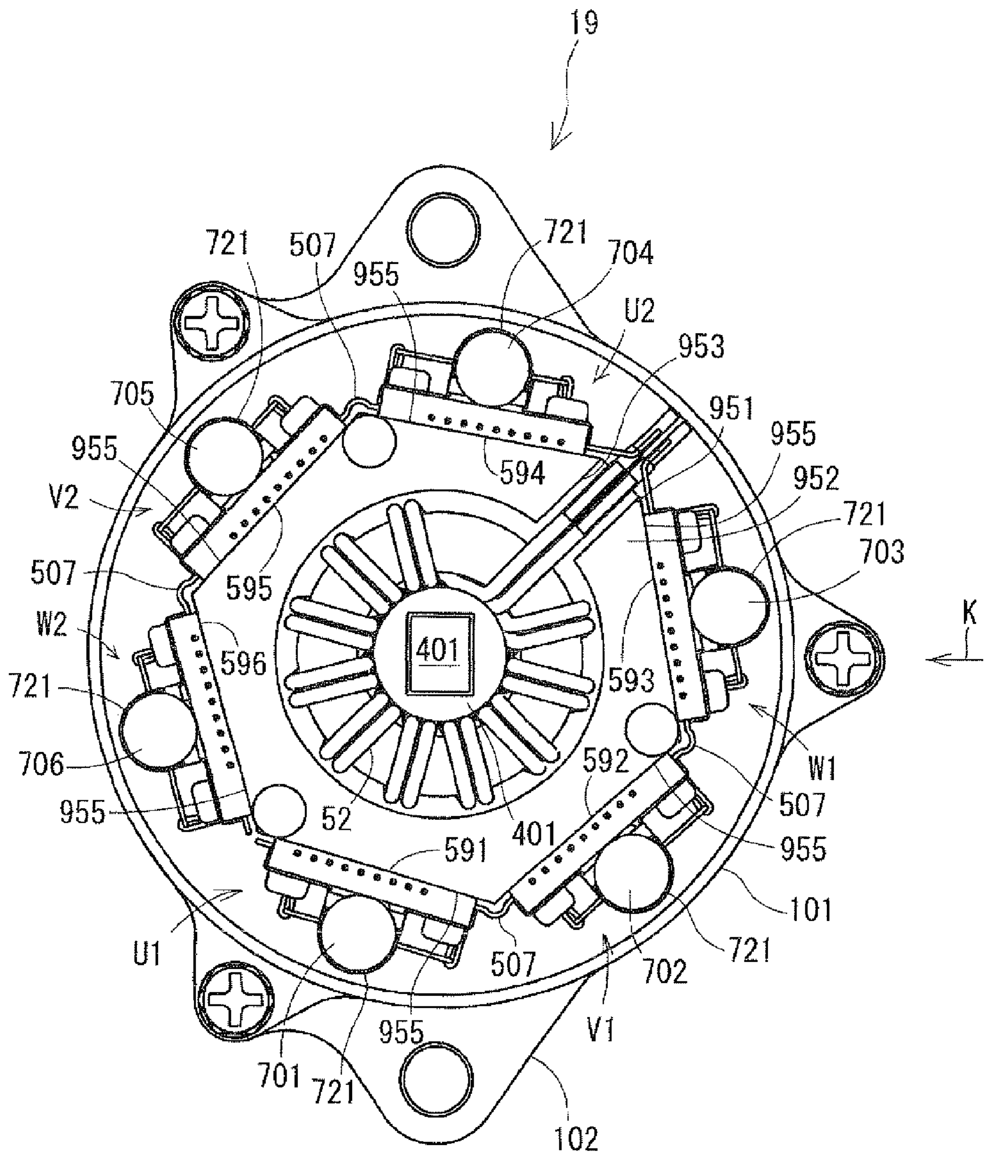
FIG. 45 is a plan view of an electronic circuit-integrated motor apparatus according to a fourteenth embodiment of the present invention.
Figure 46:
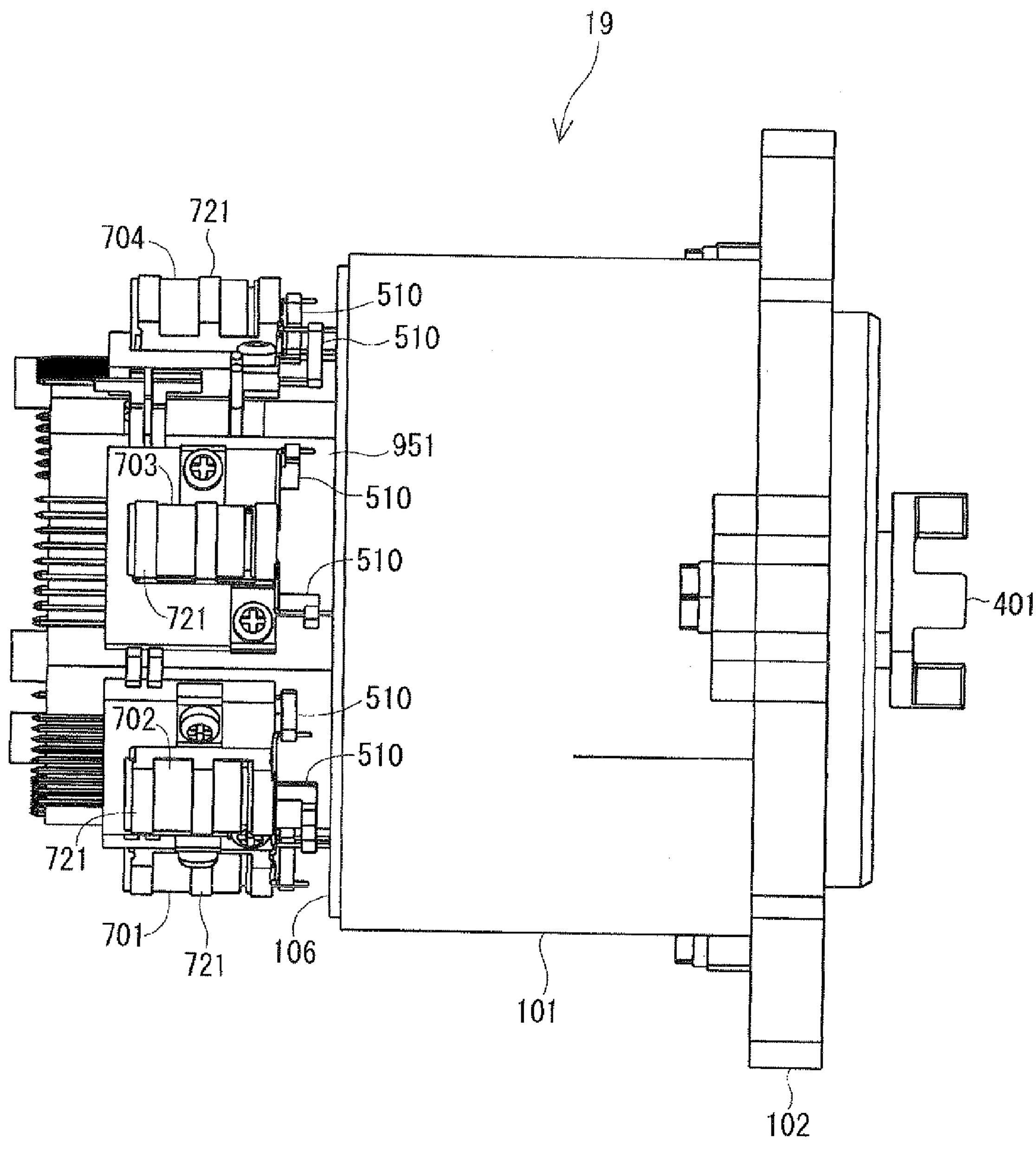
FIG. 46 is a side view of the electronic circuit-integrated motor apparatus according to the fourteenth embodiment.
Figure 47:
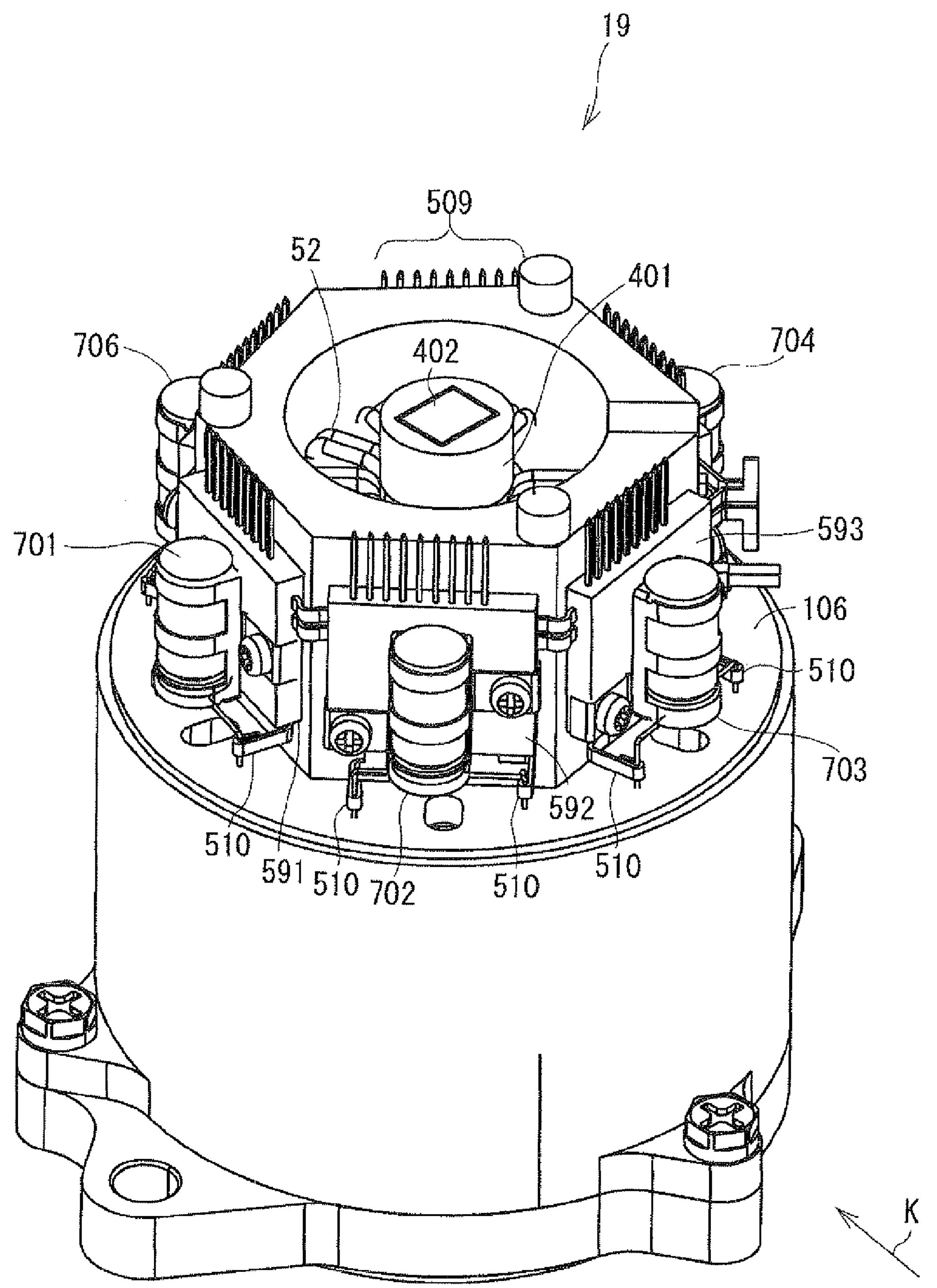
FIG. 47 is a perspective view of the electronic circuit-integrated motor apparatus according to the fourteenth embodiment.

As shown in FIGS. 45 to 47, a motor apparatus 19 according to a fourteenth embodiment of the present invention includes six semiconductor modules 591, 592, 593, 594, 595, 596. Alphabetical symbols in FIG. 45 are used to distinguish the semiconductor modules 591-596 from each other. More specifically, the semiconductor modules 591-596 are individually referred to as the U1 semiconductor module 591, the V1 semiconductor module 592, the W1 semiconductor module 593, U2 semiconductor module 594, the V2 semiconductor module 595, and the W2 semiconductor module 596.

The U1, V1, and W1 semiconductor modules 591-593 and the U2, V2, and W2 semiconductor modules 594-596 are coupled by the bus bars 507 to form a module unit. The bus bars 507 have a coupling function and operate as a power supply line, as is the case with the foregoing embodiments.

The semiconductor modules 591-596 are mounted on a heat sink 951, which is extended in the same direction as the direction of the centerline of the shaft 401 from the end wall 106 of the motor case 101.

As shown in FIG. 45, the heat sink 951 is configured so that its cross section perpendicular to the axial direction is substantially shaped like a hexagonal column. Further, a cylindrical space is formed in the heat sink 951. A side wall 952 of the heat sink 951 includes a cut-out portion 953, which forms a noncontiguous portion. Further, the side wall 952 is formed such that its cross section perpendicular to the axial direction is substantially shaped like a hexagonal column. Therefore, the side wall 952 has a total of six side wall surfaces 955, which face in a radially outward direction and are disposed in a circumferential direction.

The semiconductor modules 591-596, which are mounted on the heat sink 951, are disposed, one by one, on the side wall surfaces 955, which face in the radially outward direction. The semiconductor modules 591-596 are positioned such that the respective heat dissipation surfaces are in contact with the side wall surfaces 955. The side wall surfaces 955 are plane surfaces. Accordingly, the heat dissipation surfaces of the semiconductor modules 591-596 are also plane surfaces.

The semiconductor modules 591-596 are disposed on the side wall surfaces 955 of the heat sink 951 as described above.

Therefore, a line perpendicular to a semiconductor chip surface is perpendicular to the centerline of the shaft 401.

The semiconductor modules 591-596 have capacitor terminals 510, which are mounted on the end wall 106 of the motor case 101. Further, the semiconductor modules 591-596 have nine terminals 509, which are mounted on the end wall on the side opposite the motor case 101 (FIG. 47).

As shown, for instance, in FIG. 45, six capacitors 701, 702, 703, 704, 705, 706 are provided for the semiconductor modules 591-596 and disposed opposite the heat sink 951. The capacitors 701-706 are disposed on the radially outside of the semiconductor modules 591-596. The capacitors 701-706 are mounted with dedicated mounting brackets 721.

The capacitors 701-706 are provided for the semiconductor modules 591-596 on a one-to-one basis, and disposed near the semiconductor modules 591-596. The capacitors 701-706 are cylindrical in shape, and disposed so that the respective axes are parallel to the centerline of the shaft 401. The terminals of the capacitors 701-706 are directly connected to the capacitor terminals 510 of the semiconductor modules 591-596.

The choke coil 52 is set such that the shaft 401 is inserted through the choke coil 52. The choke coil 52 is formed by winding a coil wire around a doughnut-shaped iron core. The coil end of the choke coil 52 is routed out in a radially outward direction from the cut-out portion 953 of the heat sink 951 (FIG. 45).

The motor apparatus 19 according to the present embodiment provides the same advantages as advantages (1) to (4) and (6) to (14) described in the first embodiment.

In the motor apparatus 19, in particular, the capacitors 701-706 provided for the semiconductor modules 591-596 are disposed on the radially outside of the semiconductor modules 591-596. Therefore, the accommodation spaces for the capacitors 701-706 need not be formed on the heat sink 951.

Fifteenth Embodiment

Figure 48:
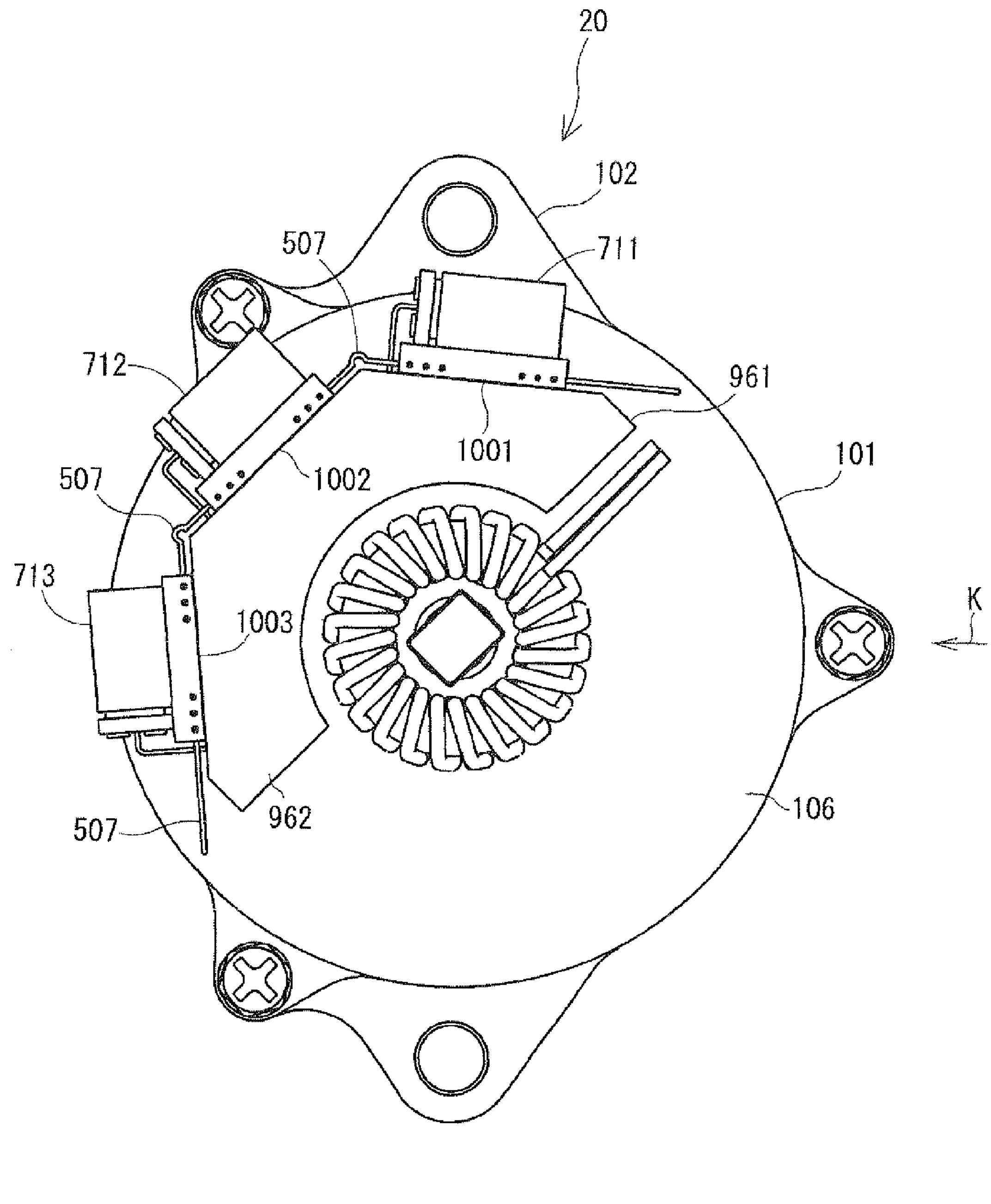
FIG. 48 is a plan view of an electronic circuit-integrated motor apparatus according to a fifteenth embodiment of the present invention.
Figure 49:
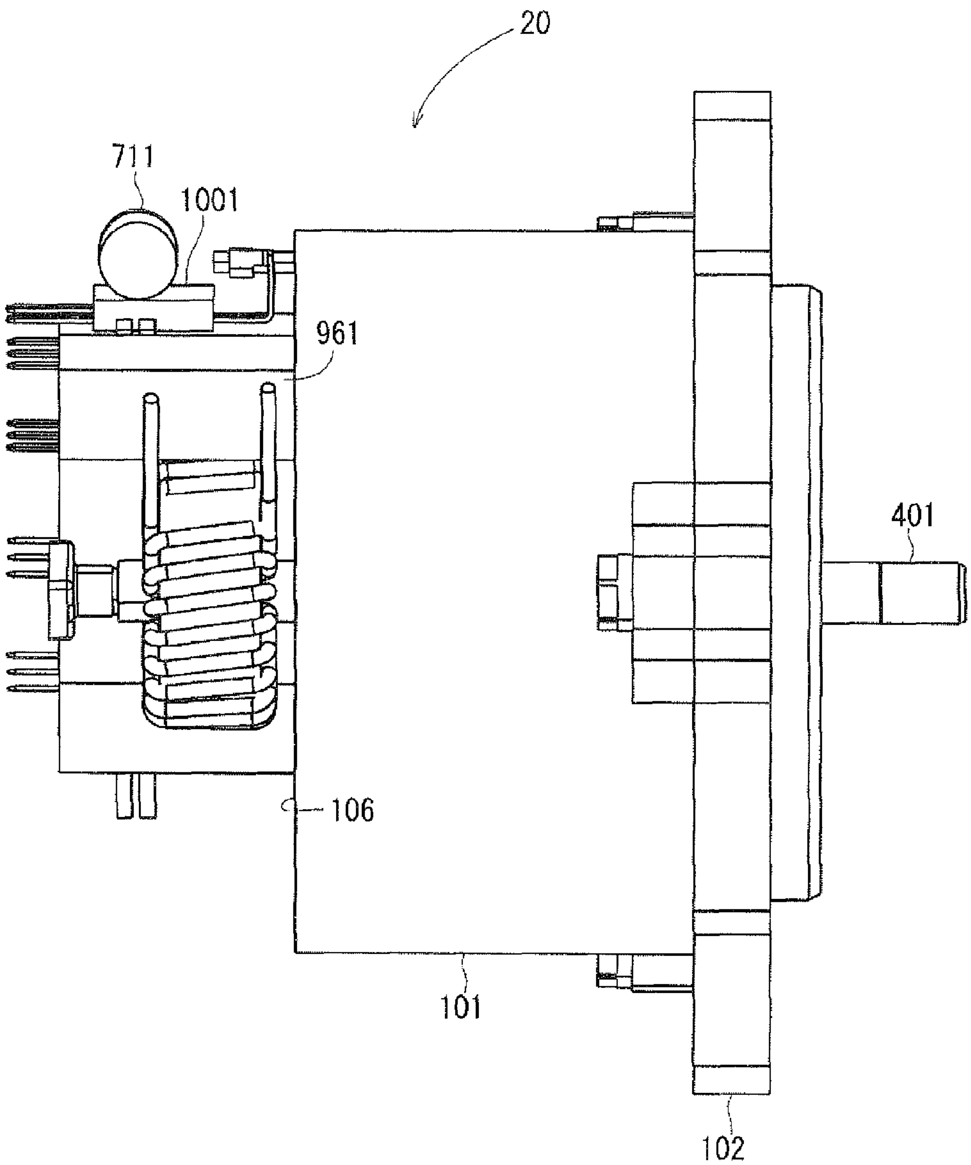
FIG. 49 is a side view of the electronic circuit-integrated motor apparatus according to the fifteenth embodiment.
Figure 50:
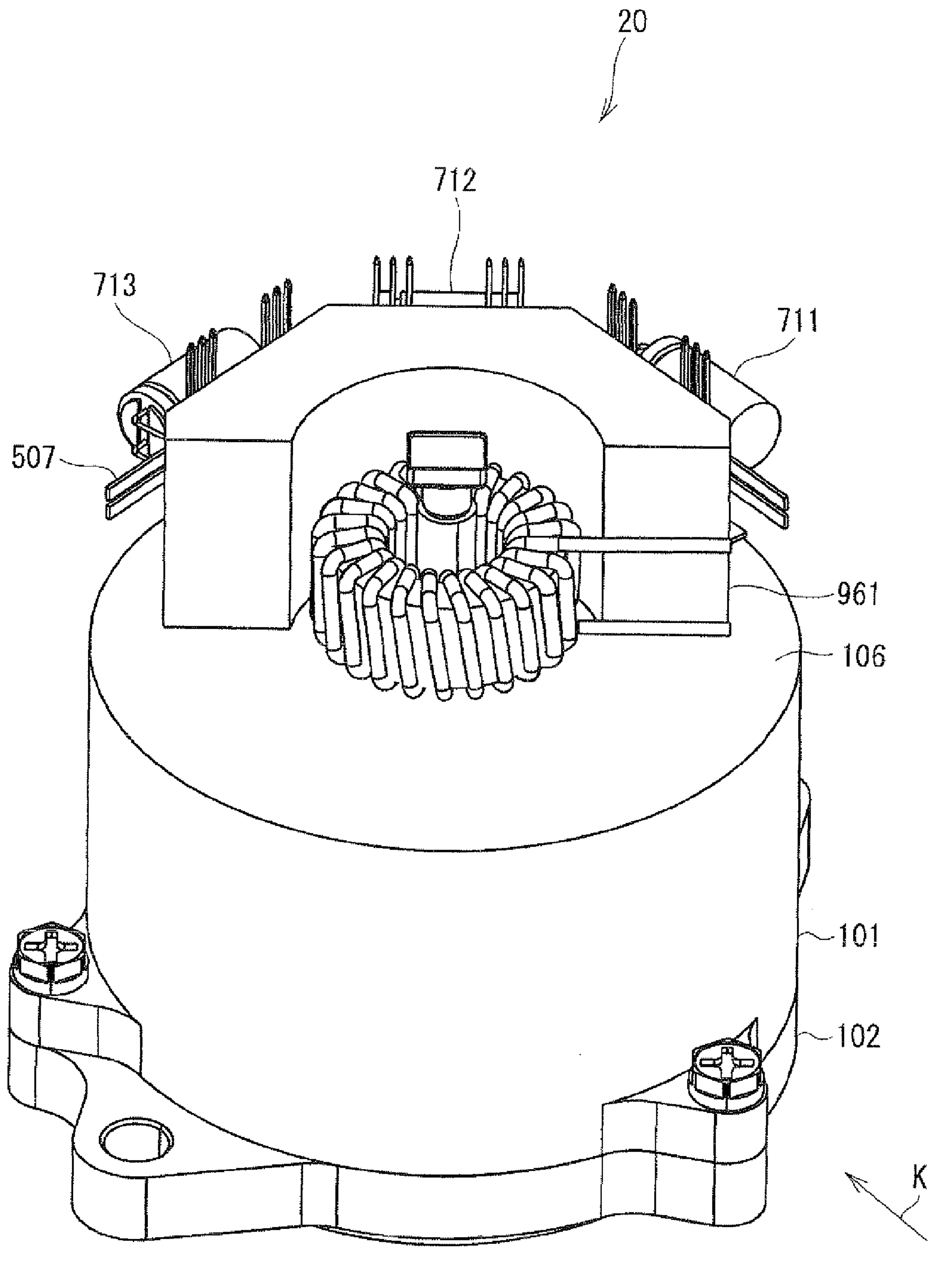
FIG. 50 is a perspective view of the electronic circuit-integrated motor apparatus according to the fifteenth embodiment.

As shown in FIGS. 48 to 50, a motor apparatus 20 according to a fifteenth embodiment of the present invention includes three semiconductor modules 1001, 1002, 1003. The three semiconductor modules 1001-1003 are coupled by the bus bars 507 to form a module.

The motor apparatus 20 differs from the motor apparatus 16 in that the capacitors 711, 712, 713 are placed transversely on the radially outside of the semiconductor modules 1001-1003. Therefore, the accommodation spaces for housing the capacitors 711-713 are not formed on a side wall 962 of a heat sink 961. The terminals of the capacitors 711-713 are directly connected to the bus bars 507, which link the semiconductor modules 1001-1003. Therefore, the semiconductor modules 1001-1003 do not have capacitor terminals.

The motor apparatus 20 according to the present embodiment provides the same advantages as advantages (1) to (14) described in the first embodiment.

Sixteenth Embodiment

Figure 51:
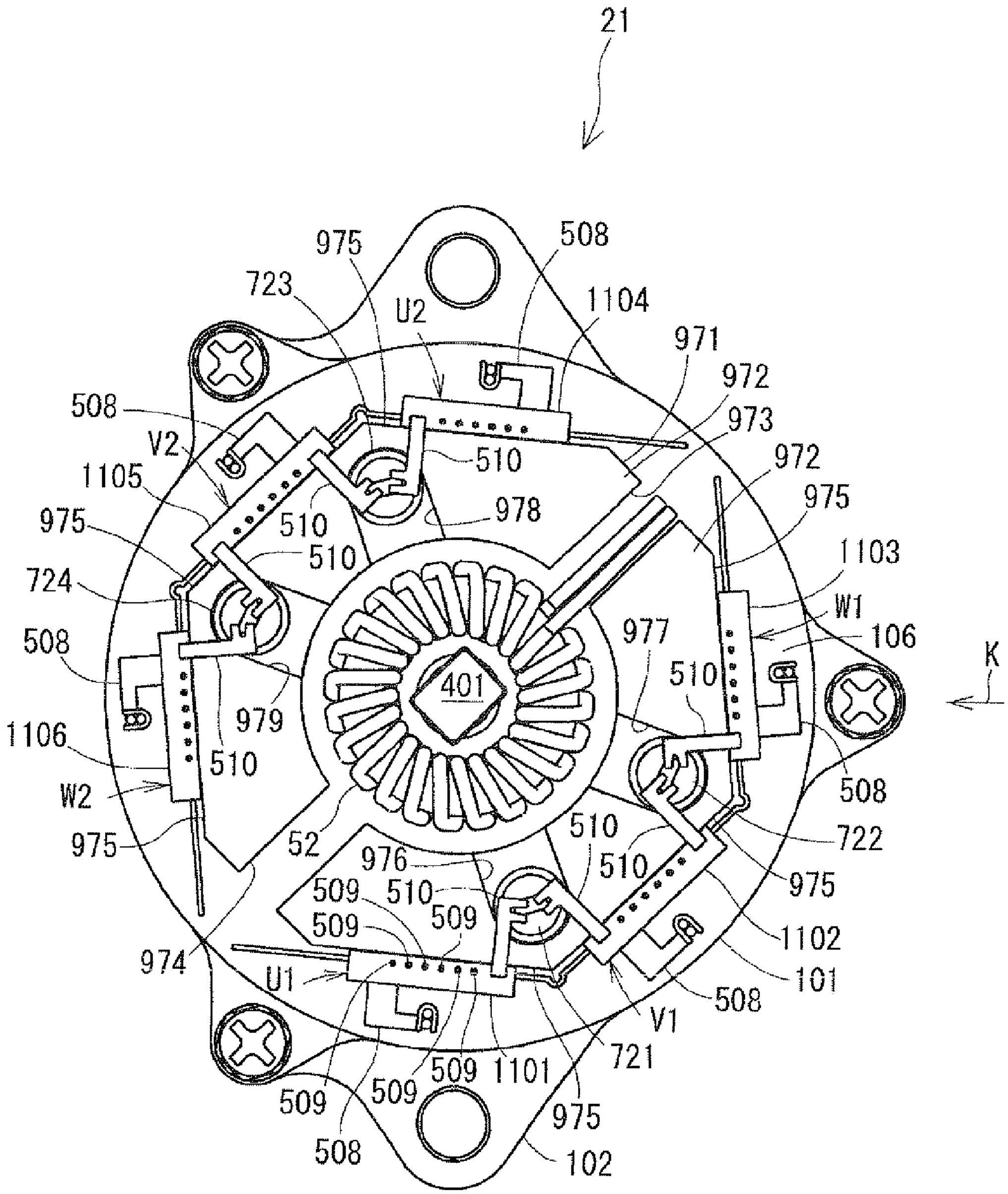
FIG. 51 is a plan view of an electronic circuit-integrated motor apparatus according to a sixteenth embodiment of the present invention.
Figure 52:
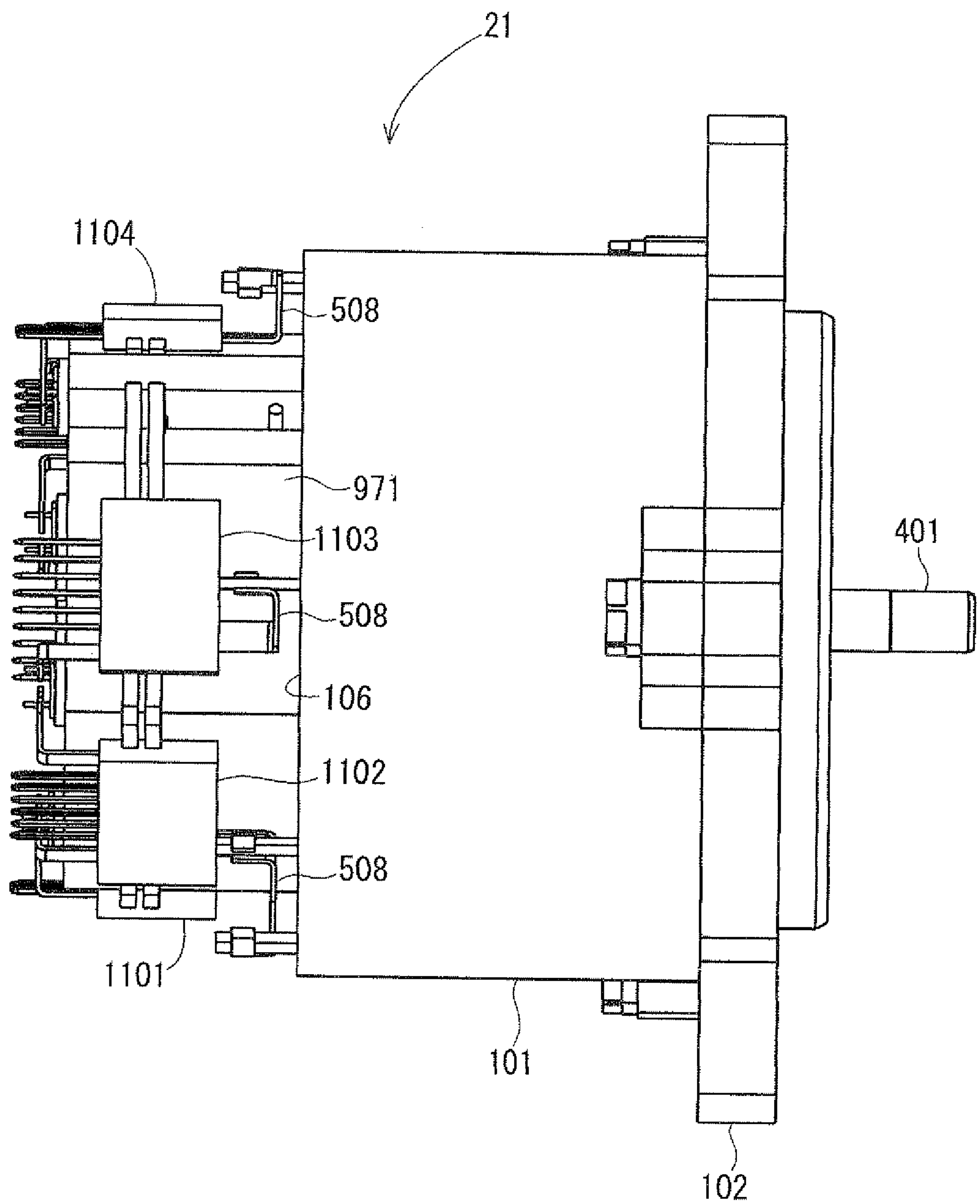
FIG. 52 is a side view of the electronic circuit-integrated motor apparatus according to the sixteenth embodiment.
Figure 53:
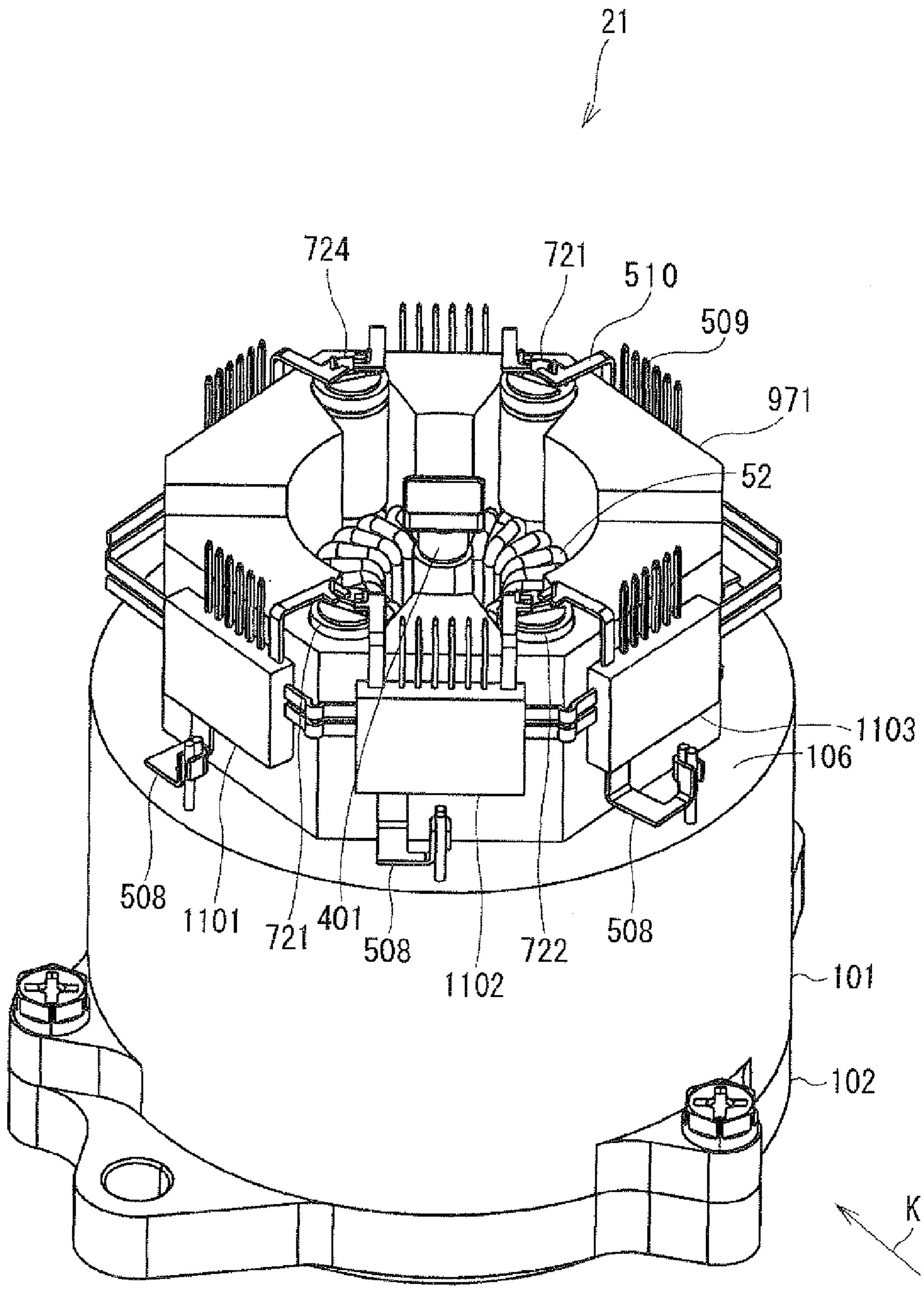
FIG. 53 is a perspective view of the electronic circuit-integrated motor apparatus according to the sixteenth embodiment.

As shown in FIGS. 51 to 53, a motor apparatus 21 according to a sixteenth embodiment of the present invention includes six semiconductor modules 1101, 1102, 1103, 1104, 1105, 1106. Alphabetical symbols in FIG. 51 are used to distinguish the semiconductor modules 1101-1106 from each other. More specifically, the semiconductor modules 1101-1106 are individually referred to as the U1 semiconductor module 1101, the V1 semiconductor module 1102, the W1 semiconductor module 1103, the U2 semiconductor module 1104, the V2 semiconductor module 1105, and the W2 semiconductor module 1106.

The semiconductor modules 1101-1106 are mounted on a heat sink 971, which is extended in the same direction as the direction of the centerline of the shaft 401 from the end wall 106 of the motor case 101.

As shown in FIG. 51, the heat sink 971 is configured so that two columnar members whose cross sections perpendicular to the axial direction are substantially trapezoidal in shape are disposed so as to sandwich the centerline of the shaft 401. Further, a predefined radial portion is cut out to form a cylindrical space at the center. The heat sink 971 has side walls 972 around the centerline of the shaft 401. The side walls 972 include two cut-out portions 973, 974, which form a noncontiguous portion.

The side walls 972 of the heat sink 971 have side wall surfaces 975, which face in a radially outward direction. The side wall surfaces 975 are plane surfaces. Four accommodation spaces 976, 977, 978, 979, which are open to a cylindrical space at the center, are formed in the radially inward direction of the side wall surfaces 975. More specifically, the side walls 972 of the heat sink 971 are two columnar members whose cross section perpendicular to the axial direction is trapezoidal in shape. Two accommodation spaces 976, 977 are formed on one columnar member, whereas the remaining two accommodation spaces 978, 979 are formed on the other columnar member. The accommodation spaces 976-979 are configured so that the respective arc-shaped inner surfaces are formed at a position corresponding to a boundary between the neighboring side wall surfaces 975.

The semiconductor modules 1101-1106, which are provided relative to the heat sink 971, are disposed on the side wall surfaces 975, which face in a radially outward direction. The semiconductor modules 1101-1106 are disposed such that the respective heat dissipation surfaces are in contact with the side wall surfaces 975. The side wall surfaces 975 are plane surfaces. Accordingly, the heat dissipation surfaces of the semiconductor modules 1101-1106 are also plane surfaces.

As the semiconductor modules 1101-1106 are disposed on the side wall surfaces 975 of the heat sink 971, the respective semiconductor chip surfaces are perpendicular to the centerline of the shaft 401.

The semiconductor modules 1101-1106 have coil terminals 508, which are mounted on the end wall 106 of the motor case 101. In addition, the semiconductor modules 1101-1106 have six control terminals 509 and one or two capacitor terminals 510, which are positioned opposite the end wall 106 of the motor case 101 (FIG. 53). The U1, U2, W1, and W2 semiconductor modules 1101, 1102, 1105, 1106 have only one capacitor terminal 510, whereas the V1 and V2 semiconductor modules 1103, 1104 have two capacitor terminals 510.

As shown, for instance, in FIG. 51, four capacitors 721, 722, 723, 724 are provided for the semiconductor modules 1101-1106 and disposed on the same side as the heat sink 971. More specifically, the capacitors 721-714 are disposed in the accommodation spaces 976-979 of the heat sink 971.

The capacitors 721-724 are disposed near the semiconductor modules 1101-1106. The capacitors 721-724 are cylindrical in shape, and disposed so that the respective axes are parallel to the centerline of the shaft 401. The capacitors 721-724 are equally distant from neighboring semiconductor modules 1101-1106. Further, the capacitor terminals 510 of the semiconductor modules 1101-1106 are bent in a radially inward direction. Therefore, the terminals of the capacitors 721-724 are directly connected to the bent capacitor terminals 510. More specifically, two capacitor terminals 510 are mounted on the widthwise ends of the central semiconductor modules 1102, 1105 out of three semiconductor modules 1101-1106 coupled by bus bars, and the control terminals 509 are mounted between the capacitor terminals 510. In addition, one capacitor terminal 510 is mounted on a widthwise end (close to a neighboring semiconductor module) of the remaining semiconductor modules 1101, 1103, 1104, 1106, which are positioned on both sides of the central semiconductor modules 1102, 1105.

The present embodiment differs from the other embodiments in electrical configuration. More specifically, the inverter circuit 60, which is shown in FIG. 1, includes three semiconductor modules and two capacitors. The capacitors can be connected in parallel between a semiconductor module power supply line and ground. Therefore, the inverter circuit 60 may include two capacitors although the respective capacitances need be adjusted. The inverter circuit 60 may alternatively include only one capacitor.

The choke coil 52 is set such that the shaft 401 is inserted through the choke coil 52 (FIG. 53). The choke coil 52 is formed by winding a coil wire around a doughnut-shaped iron core. The coil end of the choke coil 52 is routed out in a radially outward direction from the cut-out portion 973 of the heat sink 971 (FIG. 51).

The motor apparatus 21 according to the present embodiment provides the same advantages as advantages (1), (2), and (4) to (14) described in the first embodiment.

The motor apparatus 21, in particular, includes four capacitors 721-724. Therefore, the heat sink 971 needs only four accommodation spaces 976-979. This makes it possible to inhibit the heat dissipation performance of the heat sink 971 from being degraded.

Seventeenth Embodiment

As shown in FIGS. 54 to 57, a motor apparatus 22 according to a seventeenth embodiment of the present invention includes six semiconductor modules 1201, 1202, 1203, 1204, 1205, 1206. The semiconductor modules 1201-1206 are mounted on the heat sink 941, which is extended in the same direction as the direction of the centerline of the shaft 401 from the end wall 106 of the motor case 101.

Figure 54:
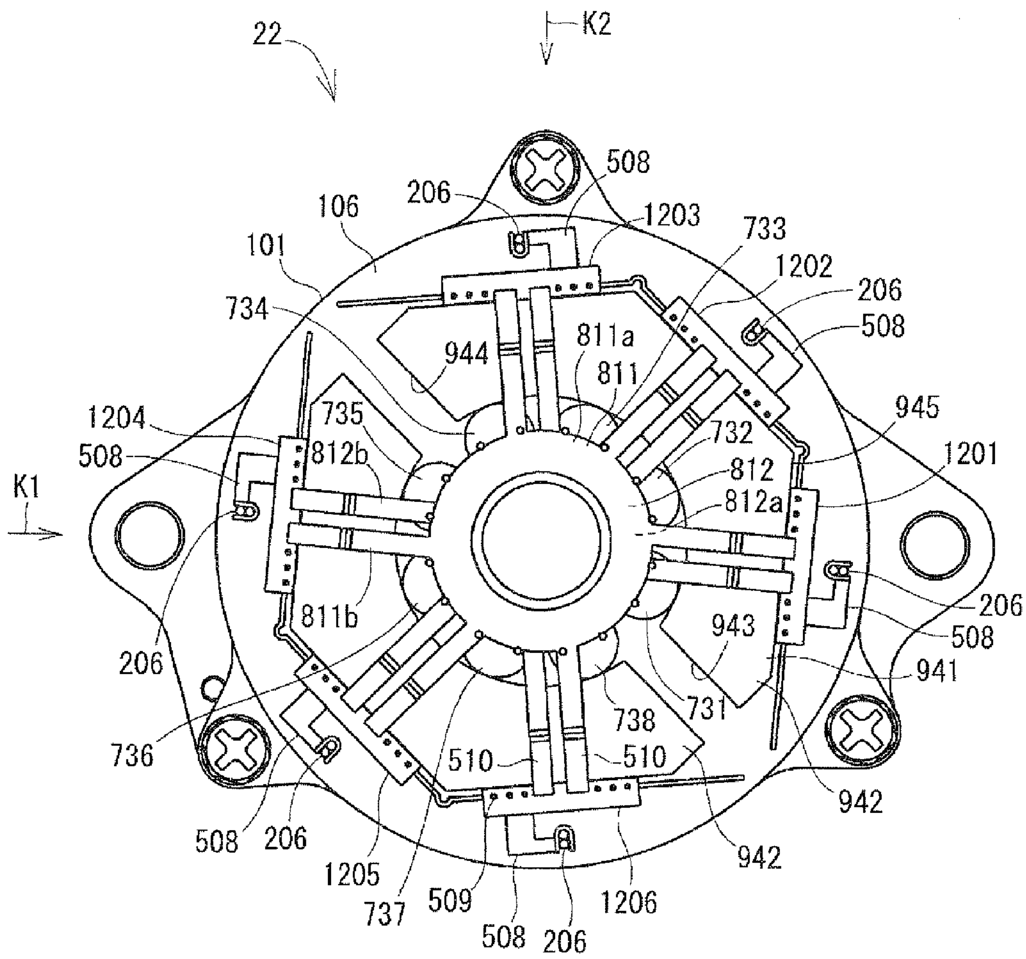
FIG. 54 is a plan view of an electronic circuit-integrated motor apparatus according to a seventeenth embodiment of the present invention.
Figure 55:
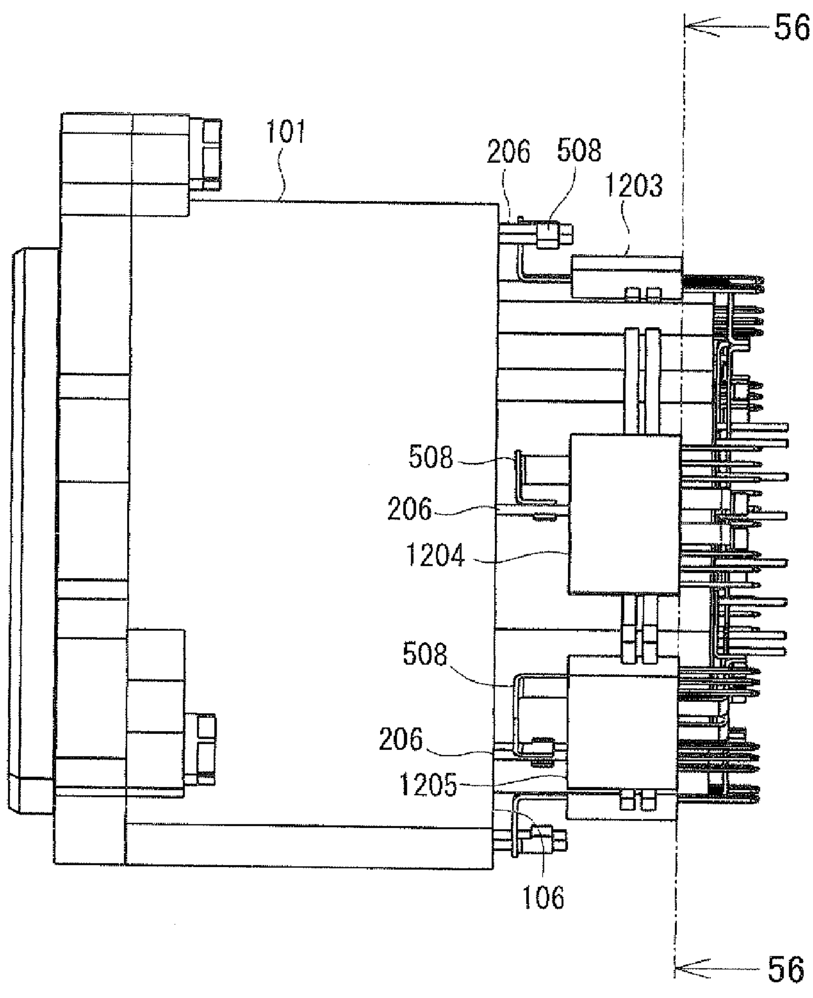
FIG. 55 is a side view of the electronic circuit-integrated motor apparatus according to the seventeenth embodiment.

As shown in FIG. 54, the heat sink 941 is configured so that two columnar members whose cross sections perpendicular to the axial direction are substantially trapezoidal in shape are disposed so as to sandwich the centerline of the shaft 401. Further, a predefined radial portion is cut out to form a cylindrical space at the center. The heat sink 941 has side walls 942 around the centerline of the shaft 401. The side walls 942 include two cut-out portions 943, 944, which form a noncontiguous portion. The side walls 942 of the heat sink 941 have side wall surfaces 945, which face in a radially outward direction. The side wall surfaces 945 are plane surfaces.

The semiconductor modules 1201-1206 provided relative to the heat sink 941, which is formed as described above, are disposed on the side wall surfaces 945, which face in a radially outward direction. The semiconductor modules 1201-1206 are disposed such that the respective heat dissipation surfaces are in contact with the side wall surfaces 945. The side wall surfaces 945 are plane surfaces. Accordingly, the heat dissipation surfaces of the semiconductor modules 1201-1206 are also plane surfaces.

As the semiconductor modules 1201-1206 are disposed on the side wall surfaces 945 of the heat sink 941 as described above, the respective semiconductor chip surfaces are perpendicular to the centerline of the shaft 401.

The semiconductor modules 1201-1206 have coil terminals 508, which are mounted on the end wall 106 of the motor case 101. In addition, the semiconductor modules 1201-1206 have six control terminals 509 and capacitor terminals 510, which are positioned opposite the end wall 106 of the motor case 101 (FIG. 54). The capacitor terminals 510 are bent in a radially inward direction and connected to conductive members 811, 812, which are disposed on the radially inside.

Figure 56:
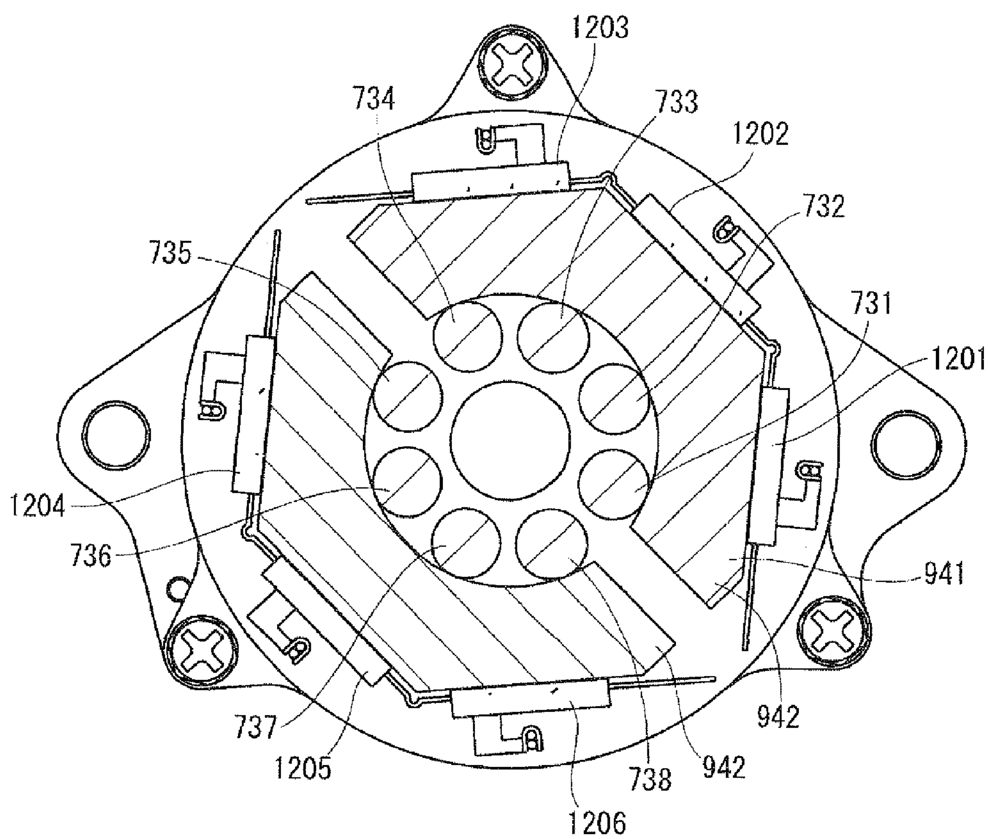
FIG. 56 is a schematic cross-sectional view taken along line 56-56 in FIG. 55.

Eight capacitors 731, 732, 733, 734, 735, 736, 737, 738 are disposed in a cylindrical space formed at the center of the heat sink 941. More specifically, the capacitors 731-738 are disposed along the inner surfaces of the side walls 942 of the heat sink 941 and placed around the shaft 401 (FIG. 56). As described above, the present embodiment is configured so that eight capacitors 731-738 are provided for the six semiconductor modules 1201-1206.

The conductive members 811, 812, which are connected to the capacitor terminals 510 as described above, include circular portions 811*a*, 812*a*, which are ring-shaped thin plates, and coupler portions 811*b*, 812*b*, which are extended in a radially outward direction from the circular portions 811*a*, 812*a*. The coupler portions 811*b*, 812*b* are extended in parallel to each other and toward the six semiconductor modules 1201-1206. The conductive members 811, 812 are disposed such that the conductive members 811, 812 are axially insulated from each other. One conductive member 811 is positioned apart from the motor case 101, whereas the other conductive member 812 is positioned close to the motor case 101.

Figure 57:
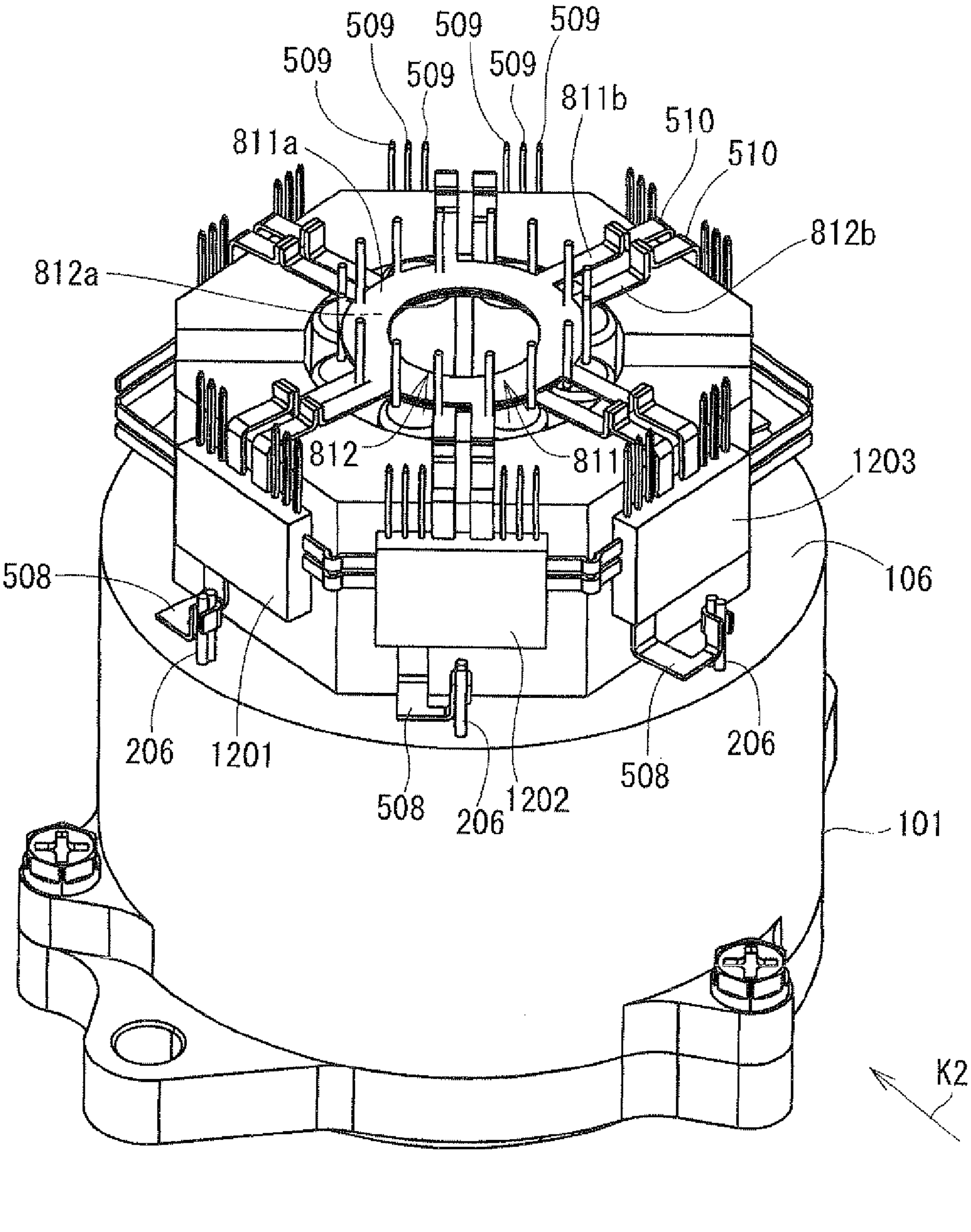
FIG. 57 is a perspective view of the electronic circuit-integrated motor apparatus according to the seventeenth embodiment.

One terminal of each capacitor 731-738 is connected to one conductive member 811, whereas the remaining terminal is connected to the other conductive member 812 (FIGS. 54 and 57). The coupler portions 811*b*, 812*b* of the conductive members 811, 812 are connected to the capacitor terminals 510 of the semiconductor modules 1201-1206. More specifically, one capacitor terminal 510 is connected to the coupler portion 811*b* of one conductive member 811, and the remaining capacitor terminal 510 is connected to the coupler portion 812*b* of the other conductive member 812. This connection scheme connects one capacitor terminal 510 for each of the six semiconductor modules 1201-1206 to one terminal for each of the eight capacitors 731-738 through one conductive member 811, and connects the other capacitor terminal 510 for each of the six semiconductor modules 1201-1206 to the other terminal for each of the eight capacitors 731-738 through the other conductive member 812.

The present embodiment differs from the other embodiments in electrical configuration. More specifically, the semiconductor modules 1201-1206 corresponding to the inverter circuits 60, 68 shown in FIG. 1 and the eight capacitors 731-738 are uniformly wired through the conductive members 811, 812. This makes the present embodiment different from the other embodiments in which the capacitors are directly connected to the semiconductor modules. Thus, uniform capacitor performance can easily be provided for the individual semiconductor modules irrespective of the number and size of capacitors. Consequently, any arbitrary number of capacitors may be employed for configuration purposes although the respective capacitances need be adjusted.

The motor apparatus 22 according the present embodiment provides the same advantages as advantages (1), (2), (4) to (7), and (10) to (14) described in the first embodiment.

The motor apparatus 21 according to the present embodiment, in particular, includes eight capacitors 731-738. Therefore, the physical size of each capacitor 731-738 can be reduced. Thus, the capacitors 731-738 can be disposed without forming accommodation spaces on the heat sink 941. This makes it possible to inhibit the heat dissipation performance of the heat sink 941 from being degraded.

Eighteenth Embodiment

As shown in FIGS. 58 to 61, a motor apparatus 23 according to an eighteenth embodiment of the present invention includes six semiconductor modules 1201, 1202, 1203, 1204, 1205, 1206. The semiconductor modules 1201-1206 are mounted on the heat sink 941, which is extended in the same direction as the direction of the centerline of the shaft 401 from the end wall 106 of the motor case 101.

The heat sink 941 and the semiconductor modules 1201-1206 are disposed in the same manner as described in connection with the motor apparatus 22 according to the seventeenth embodiment.

Figure 58:
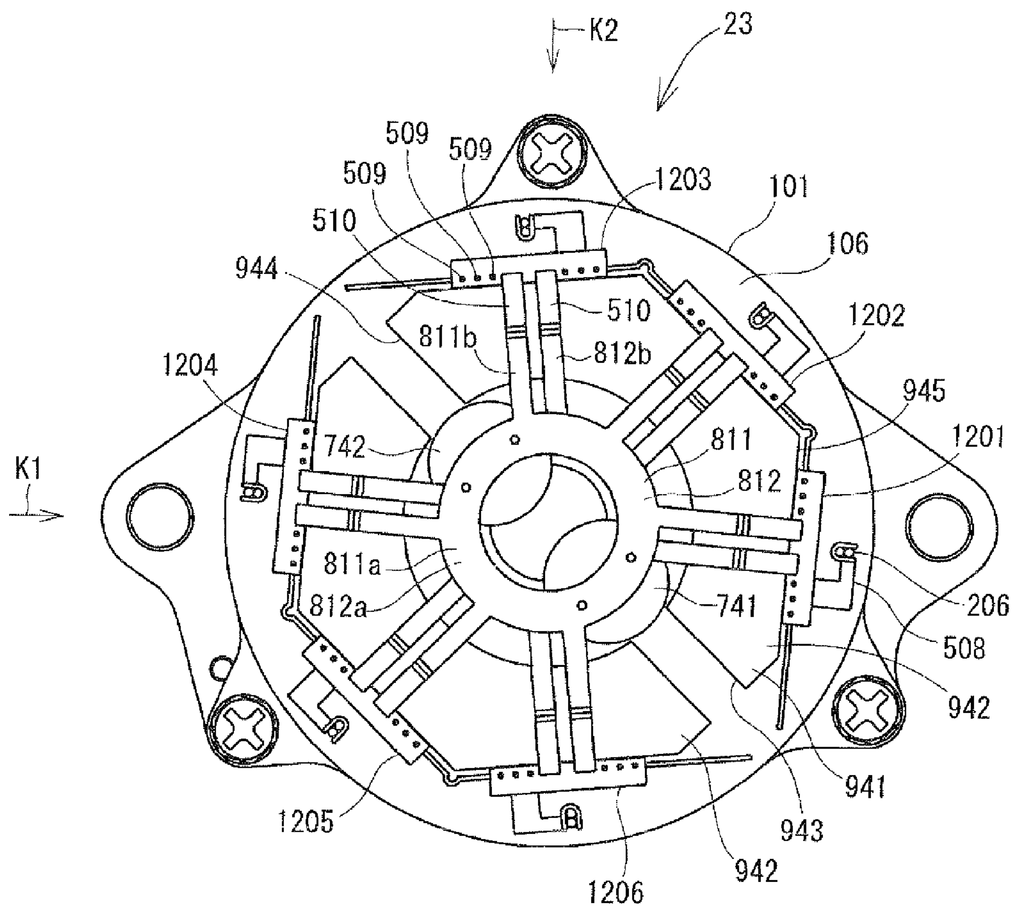
FIG. 58 is a plan view of an electronic circuit-integrated motor apparatus according to an eighteenth embodiment of the present invention.
Figure 59:
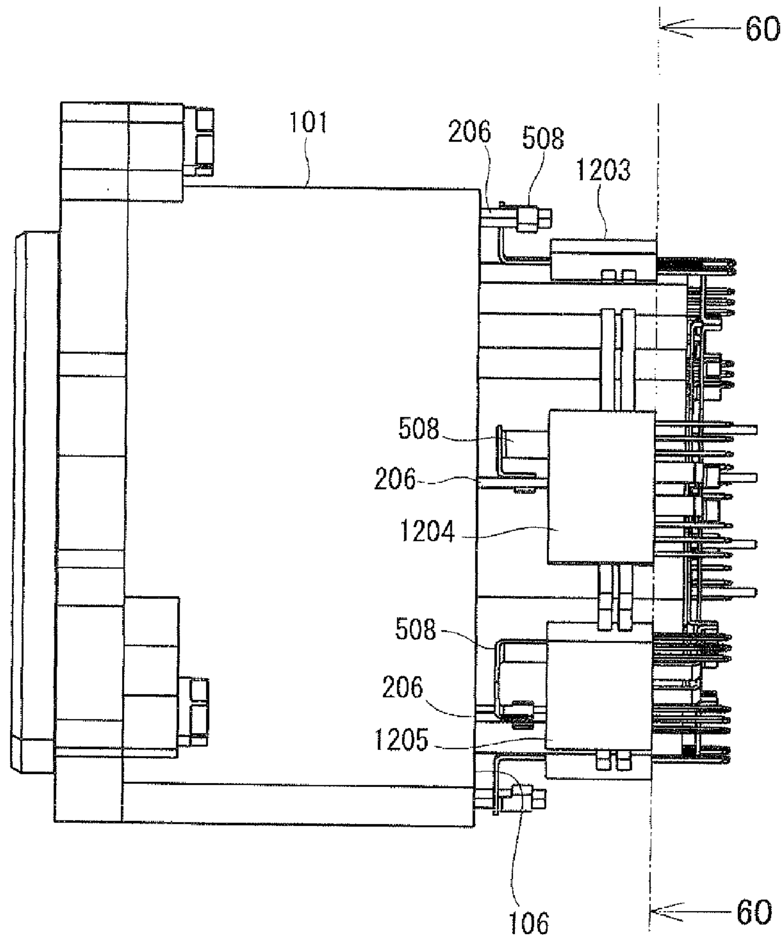
FIG. 59 is a side view of the electronic circuit-integrated motor apparatus according to the eighteenth embodiment.

The semiconductor modules 1201-1206 have coil terminals 508, which are mounted on the end wall 106 of the motor case 101. The coil terminals 508 are bent in a radially outward direction and connected to the lead-out wires 206 from the stator 201. In addition, the semiconductor modules 1201-1206 have six control terminals 509 and capacitor terminals 510, which are positioned opposite the end wall 106 of the motor case 101 (FIG. 58). The capacitor terminals 510 are bent in a radially inward direction and connected to the conductive members 811, 812, which are disposed on the radially inside.

Figure 60:
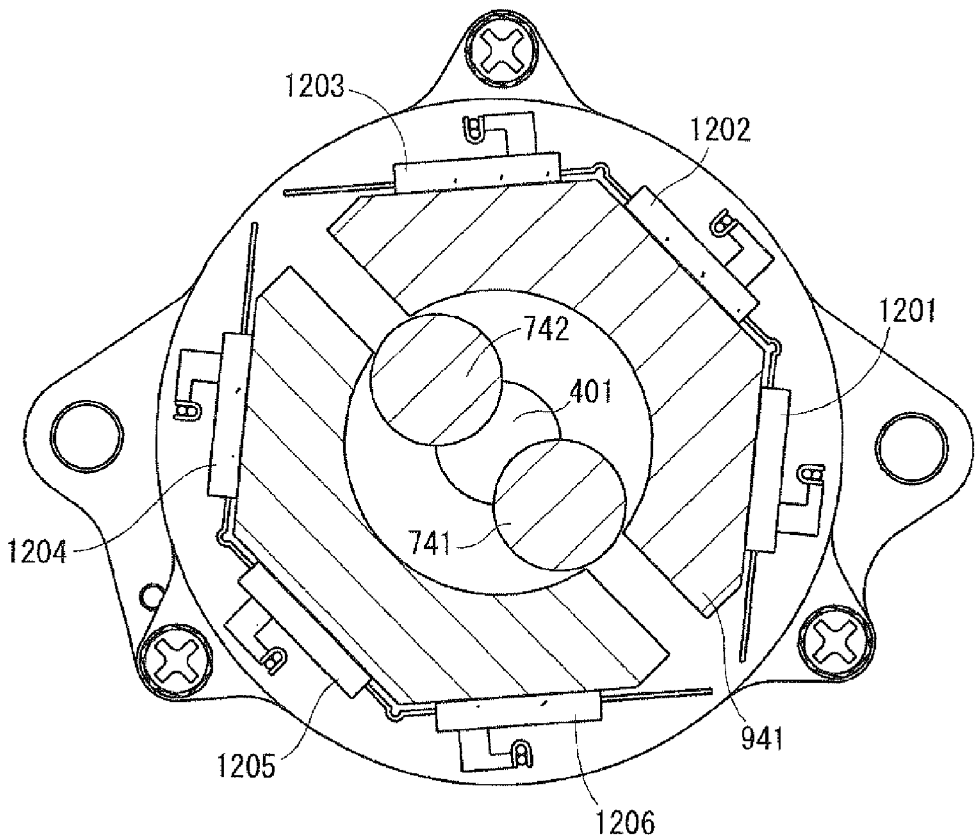
FIG. 60 is a schematic cross-sectional view taken along line 60-60 in FIG. 59.
Figure 61:
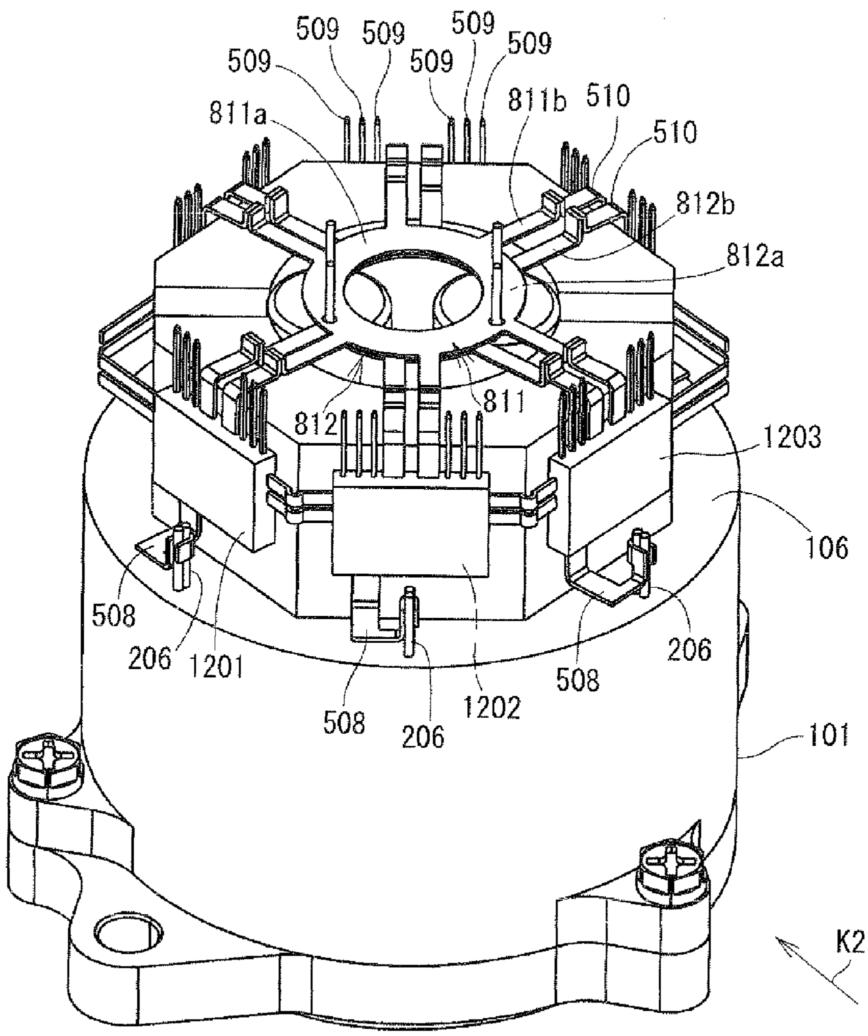
FIG. 61 is a perspective view of the electronic circuit-integrated motor apparatus according to the eighteenth embodiment.

Two capacitors 741, 742 are disposed in a cylindrical space formed at the center of the heat sink 941. More specifically, the capacitors 741, 742 are disposed around the shaft 401 so that the respective inner surfaces are in contact with the ends of the cut-out portions 943, 944 of the side walls 942 of the heat sink 941 (FIG. 60). As described above, the present embodiment is configured so that two capacitors 741, 742 are provided for the six semiconductor modules 1201-1206.

The conductive members 811, 812, which are connected to the capacitor terminals 510 as described above, include circular portions 811*a*, 812*a*, which are ring-shaped thin plates, and coupler portions 811*b*, 812*b*, which are extended in a radially outward direction from the circular portions 811*a*, 812*a*. The coupler portions 811*b*, 812*b* are extended in parallel to each other and toward the six semiconductor modules 1201-1206. The conductive members 811, 812 are disposed such that the conductive members 811, 812 are axially insulated from each other. One conductive member 811 is positioned apart from the motor case 101, whereas the other conductive member 812 is positioned close to the motor case 101.

One terminal of each capacitor 741, 742 is connected to one conductive member 811, whereas the remaining terminal is connected to the other conductive member 812 (FIG. 58). The coupler portions 811*b*, 812*b* of the conductive members 811, 812 are connected to the capacitor terminals 510 of the semiconductor modules 1201-1206. More specifically, one capacitor terminal 510 is connected to the coupler portion 811*b* of one conductive member 811, and the remaining capacitor terminal 510 is connected to the coupler portion 812*b* of the other conductive member 812. This connection scheme connects one capacitor terminal 510 for each of the six semiconductor modules 1201-1206 to one terminal for each of the two capacitors 741, 742 through one conductive member 811, and connects the other capacitor terminal 510 for each of the six semiconductor modules 1201-1206 to the other terminal for each of the two capacitors 741, 742 through the other conductive member 812.

The present embodiment differs from the other embodiments in electrical configuration. Specifically, the semiconductor modules 1201-1206 corresponding to the inverter circuits 60, 68 shown in FIG. 1 and the two capacitors 741, 742 are uniformly wired through the conductive members 811, 812. This makes the present embodiment different from the other embodiments in which the capacitors are directly connected to the semiconductor modules. Thus, uniform capacitor performance can easily be provided for the individual semiconductor modules.

The motor apparatus 23 according the present embodiment provides the same advantages as advantages (1), (2), (4) to (7), and (10) to (14) described in the first embodiment.

The motor apparatus 23 according to the present embodiment includes two capacitors 741, 742. Although the physical size of each capacitor is increased, the number of capacitors can be reduced. In addition, the capacitors can be disposed without forming accommodation spaces on the heat sink 941. This makes it possible to inhibit the heat dissipation performance of the heat sink 941 from being degraded.

Nineteenth Embodiment

As shown in FIGS. 62 to 65, a motor apparatus 24 according to a nineteenth embodiment of the present invention includes six semiconductor modules 1201, 1202, 1203, 1204, 1205, 1206. The semiconductor modules 1201-1206 are mounted on the heat sink 941, which is extended in the same direction as the direction of the centerline of the shaft 401 from the end wall 106 of the motor case 101.

The heat sink 941 and the semiconductor modules 1201-1206 are disposed in the same manner as described in connection with the motor apparatus 22 according to the seventeenth embodiment and the motor apparatus 23 according to the eighteenth embodiment.

Figure 62:
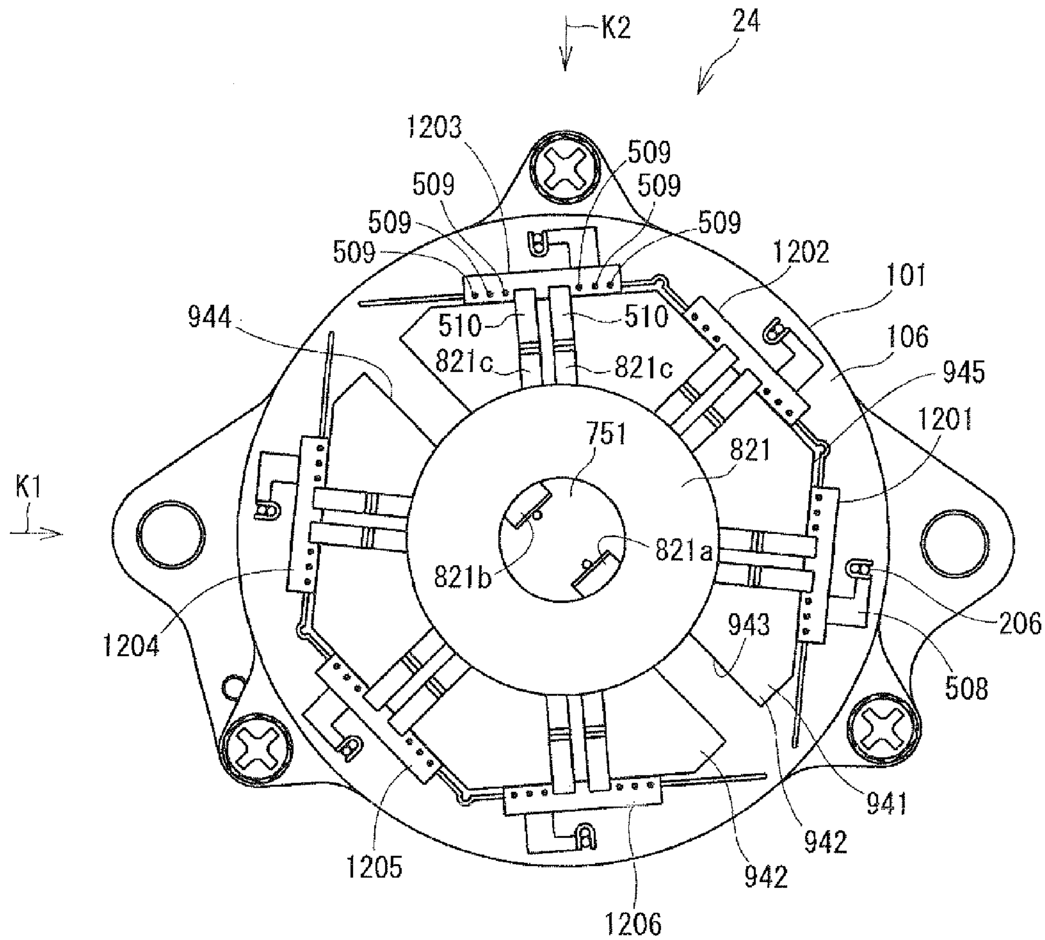
FIG. 62 is a plan view of an electronic circuit-integrated motor apparatus according to a nineteenth embodiment of the present invention.
Figure 63:
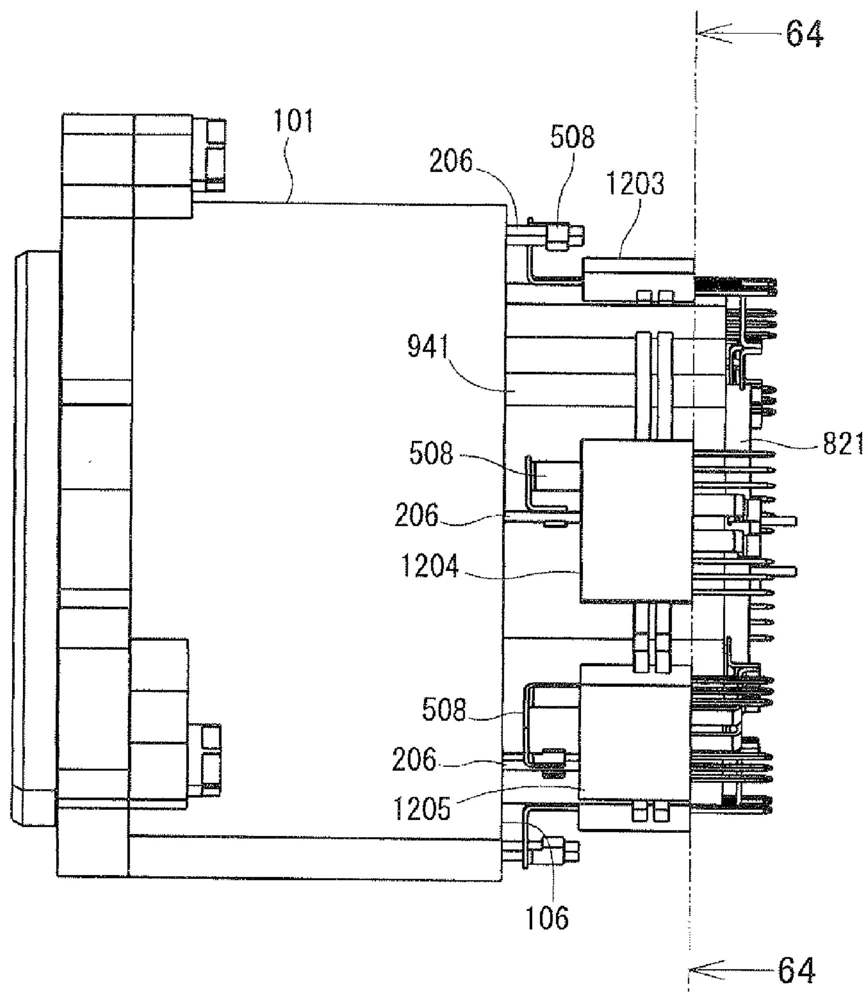
FIG. 63 is a side view of the electronic circuit-integrated motor apparatus according to the nineteenth embodiment.

The semiconductor modules 1201-1206 have coil terminals 508, which are mounted on the end wall 106 of the motor case 101. The coil terminals 508 are bent in a radially outward direction and connected to the lead-out wires 206 from the stator 201. In addition, the semiconductor modules 1201-1206 have six control terminals 509 and capacitor terminals 510, which are positioned opposite the end wall 106 of the motor case 101 (FIG. 62). The capacitor terminals 510 are bent in a radially inward direction and connected to a conductive member 821, which is placed on the radially inside.

Figure 64:
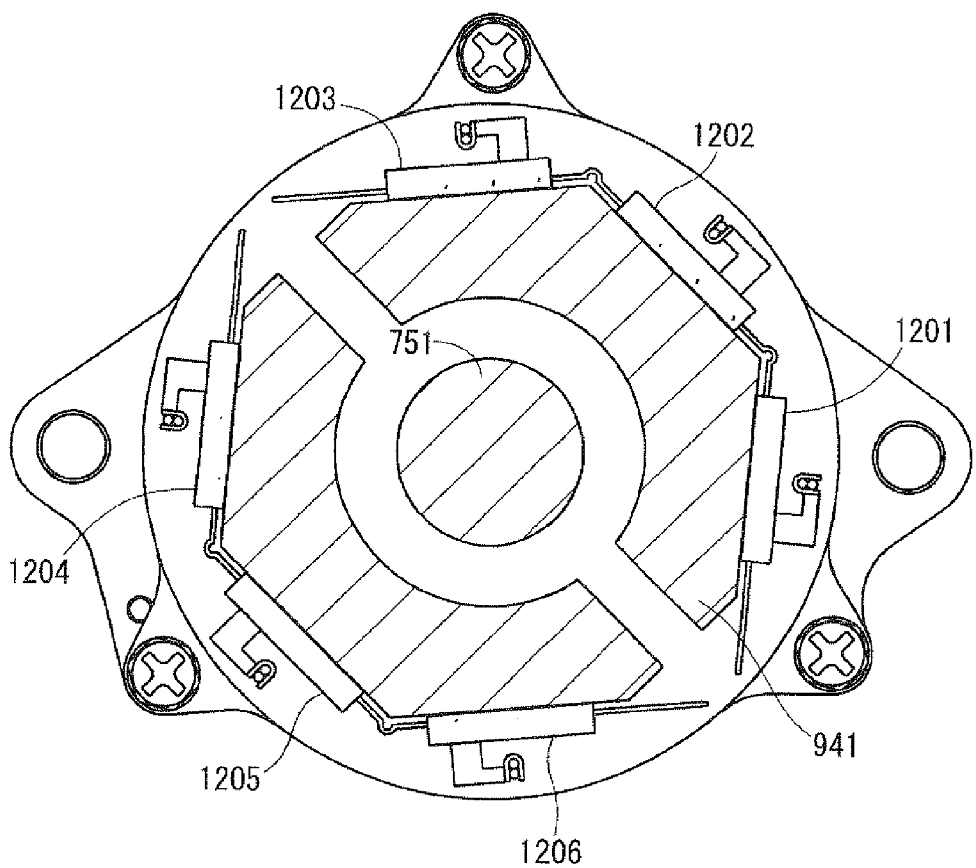
FIG. 64 is a schematic cross-sectional view taken along line 64-64 in FIG. 63.
Figure 65:
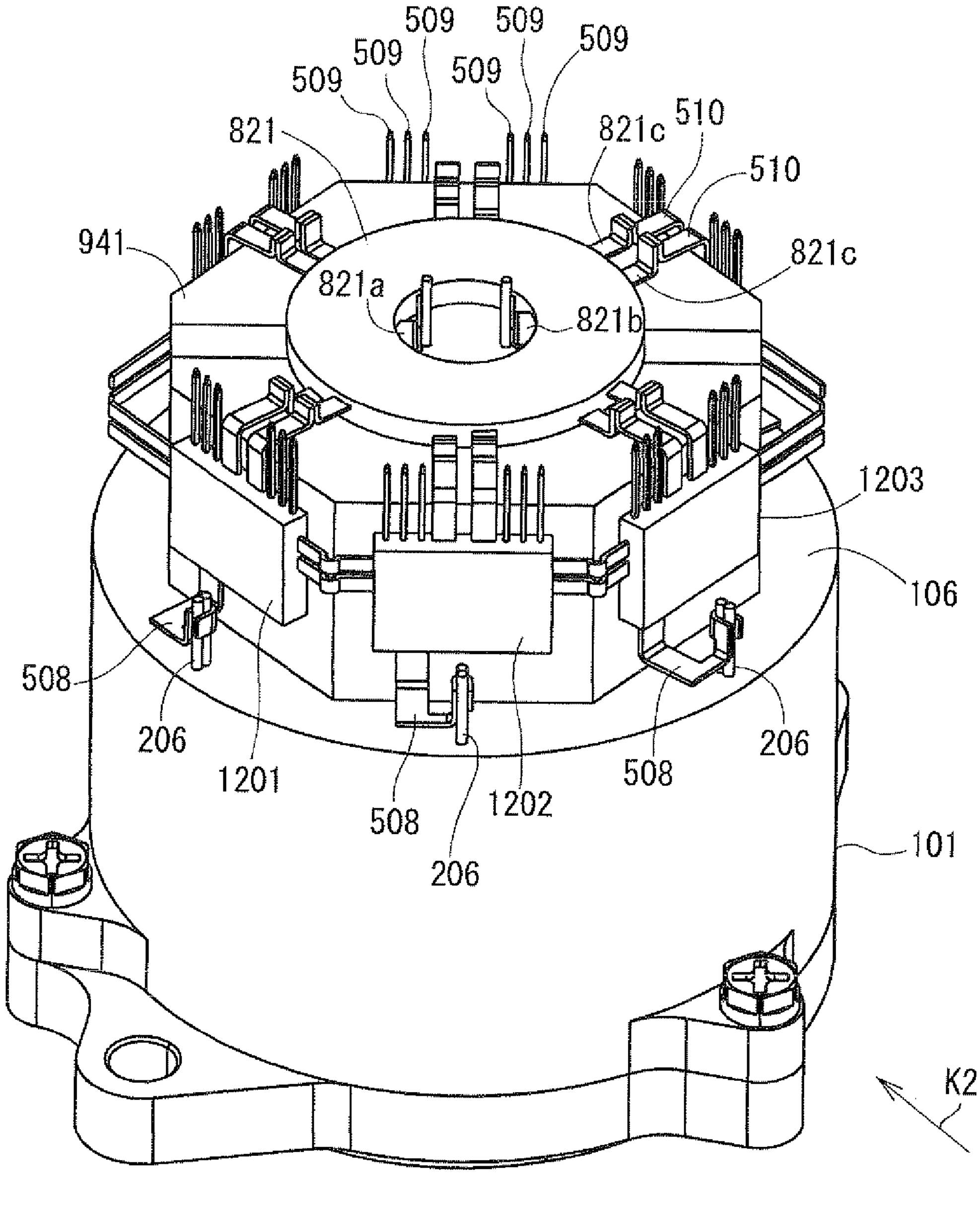
FIG. 65 is a perspective view of the electronic circuit-integrated motor according to the nineteenth embodiment.

One capacitor 751 is mounted at the center of a cylindrical space formed at the center of the heat sink 941 (FIG. 64). As described above, the present embodiment is configured so that one capacitor 751 is provided for the six semiconductor modules 1201-1206.

The capacitor terminals 510 are electrically connected to the conductive member 821, as described above. The conductive member 821 is molded with resin and circularly shaped. The conductive member 821 includes electrodes 821*a*, 821*b*, which oppose each other and protrude in a radially inward direction. The conductive member 821 also includes coupler portions 821*c*, which protrude toward the semiconductor modules 1201-1206 located on the radially outside. Two coupler portions 821*c*, which are parallel to each other, protrude toward each semiconductor module 1201-1206. One of a pair of parallel protruding coupler portions 821*c* is in conduction with one electrode 821*a*, whereas the remaining one of the pair of parallel protruding coupler portions 821*c* is in conduction with the other electrode 821*b*.

As shown in FIG. 62, one electrode 821*a* is electrically connected to one terminal of the capacitor 751, whereas the other electrode 821*b* is electrically connected to the remaining terminal of the capacitor 751. Further, one of the pair of parallel protruding coupler portions 821*c* is electrically connected to one capacitor terminal 510 of the semiconductor modules 1201-1206, and the remaining one of the pair of parallel protruding coupler portions 821*c* is electrically connected to the other capacitor terminal 510 of the semiconductor modules 1201-1206.

The above-described connection scheme connects one capacitor terminal 510 of the six semiconductor modules 1201-1206 to one terminal of the capacitor 751 through the conductive member 821 and connects the other capacitor terminal 510 of the six semiconductor modules 1201-1206 to the other terminal of the capacitor 751 through the conductive member 821.

The present embodiment differs from the other embodiments in electrical configuration. More specifically, the two inverter circuits 60, 68 shown in FIG. 1 include six semiconductor modules and one capacitor. The capacitor can be connected in parallel between a semiconductor module power supply line and ground. Therefore, the two inverter circuits 60, 68 may include only one capacitor although its capacitance need be adjusted.

The motor apparatus 24 according the present embodiment provides the same advantages as advantages (1), (2), (4) to (7), and (10) to (14) described in the first embodiment.

The motor apparatus 24 according to the present embodiment, in particular, is configured to include only one capacitor 751. The configuration involves the use of only one capacitor. In addition, the capacitor can be set without forming an accommodation space on the heat sink 941. This makes it possible to inhibit the heat dissipation performance of the heat sink 941 from being degraded.

The present invention is not limited to the disclosed embodiments but may be implemented in other different embodiments.

(A) The foregoing embodiments have been described on the assumption that the present invention is used with an EPS. However, the electronic circuit-integrated motor apparatus having the same configuration described above can also be applied to the other fields.

(B) The foregoing embodiments are configured so that the semiconductor modules are disposed on plural side wall surfaces of the heat sink. However, the semiconductor modules may alternatively be disposed on a single side wall surface of the heat sink.

(C) The foregoing embodiments are configured so that the shaft 401 is inserted through the doughnut-shaped choke coil 52. However, the choke coil 52 need not always be shaped like a doughnut. Further, the shaft 401 need not always be inserted through the choke coil 52. Instead, the choke coil 52 may be positioned around the shaft 401. In such an instance, the coil may be positioned either longitudinally or transversely.

(D) The foregoing embodiments are configured so that the surfaces of the printed circuit boards 801, 802 are perpendicular to the centerline of the shaft 401. However, the printed circuit board surfaces need not always be perpendicular to the centerline of the shaft 401. Further, the present invention may be without a printed circuit board although the foregoing embodiments include the printed circuit boards 801, 802.

(E) The foregoing embodiments include the cover 103. Alternatively, however, the present invention may be without a cover.

(F) In the foregoing embodiments, the coil terminals 508, the control terminals 509, and the capacitor terminals 510 protrude from the axial end faces of the semiconductor modules. However, an alternative configuration may be employed so that the terminals 508, 509, 510 protrude from non-axial end faces of the semiconductor modules.

(G) The foregoing embodiments detect a rotational position with the magnet 402 mounted on the shaft 401 and the position sensor 73 mounted on the printed circuit board 801. Alternatively, however, a different scheme may be used to detect the rotational position.

(H) In the foregoing embodiments, the heat sink is formed integrally with the motor case. Alternatively, however, the heat sink and the motor case may be formed with different members.

What is claimed is:

1. An electronic circuit-integrated motor apparatus comprising:

a motor that includes a tubular motor case forming a shell, a stator mounted radially inside the motor case and wound with multi-phase coils, a rotor mounted radially inside the stator, and a shaft rotating together with the rotor;

a heat sink that is extended in the same direction as a direction of a centerline of the shaft from an end wall of the motor case; and an electronic circuit that is mounted on the motor case, oriented in the direction of the centerline of the shaft, and positioned toward the heat sink to provide drive control of the motor, wherein the electronic circuit includes a plurality of semiconductor modules, each of which has a semiconductor chip for selecting a coil current flowing in the multi-phase coils and is vertically disposed in contact with a side wall surface of the heat sink such that a line perpendicular to a semiconductor chip surface is not parallel to the centerline of the shaft, the heat sink has a plurality of side wall surfaces that define different planes, the semiconductor modules are disposed, one by one, relative to the plurality of side wall surfaces in direct or indirect contact with the side wall surfaces, the heat sink includes a side wall that is installed in a standing manner around the centerline of the shaft, the electronic circuit includes a choke coil, which is positioned on a power supply line for the semiconductor modules, and the choke coil is positioned radially inside the side wall.

2. The electronic circuit-integrated motor apparatus of claim 1, wherein:

the heat sink includes a cut-out portion, which is oriented in the direction of the centerline of the shaft and used to provide a part of the side wall with a noncontiguous portion.

3. The electronic circuit-integrated motor apparatus of claim 1, wherein:

the electronic circuit includes a control circuit, which controls the semiconductor modules; and the control circuit is configured with a printed circuit board that is mounted on the motor case and oriented in the direction of the centerline of the shaft.

4. The electronic circuit-integrated motor apparatus of claim 3, wherein:

the printed circuit board is positioned such that a surface thereof is perpendicular to the centerline of the shaft.

5. The electronic circuit-integrated motor apparatus of claim 3, wherein:

the printed circuit board is positioned opposite the motor case in the direction of the centerline of the shaft relative to the semiconductor modules.

6. The electronic circuit-integrated motor apparatus of claim 5, further comprising:

a bottomed cylindrical cover, which is attached to the motor case, positioned toward the heat sink, and installed over the semiconductor modules, wherein the printed circuit board is placed in a space between the heat sink and a bottom of the cover.

7. The electronic circuit-integrated motor apparatus of claim 3, wherein:

the printed circuit board is positioned on the same side as the motor case in the direction of the centerline of the shaft relative to the semiconductor modules.

8. The electronic circuit-integrated motor apparatus of claim 3, wherein:

the semiconductor modules include a control terminal, which is positioned at one end in the direction of the centerline of the shaft; and the control terminal is connected to the printed circuit board.

9. The electronic circuit-integrated motor apparatus of claim 3, wherein:

the semiconductor modules include a coil terminal, which is mounted on an end opposite the printed circuit board; and the coil terminal is connected to a coil of the stator.

10. The electronic circuit-integrated motor apparatus of claim 9, wherein:

the coil terminal is bent in a radial direction and connected to the coil of the stator through a radial space near the semiconductor modules.

11. The electronic circuit-integrated motor apparatus of claim 10, wherein:

the space near the semiconductor modules is a space provided radially outside the semiconductor modules.

12. The electronic circuit-integrated motor apparatus of claim 3, further comprising:

rotational position detection means which detects a rotational position of the shaft.

13. The electronic circuit-integrated motor apparatus of claim 12, wherein:

the rotational position detection means includes a magnet and a detector;

the magnet is mounted on an end of the shaft that is positioned toward the printed circuit board; and the detector is mounted on the printed circuit board to detect the rotational position of the magnet.

14. The electronic circuit-integrated motor apparatus of claim 1, wherein:

the semiconductor modules are coupled by a bus bar to form a module unit.

15. The electronic circuit-integrated motor apparatus of claim 1, wherein:

the heat sink is made of same material as the motor case and formed integrally with the motor case.

16. The electronic circuit-integrated motor apparatus of claim 1, wherein:

the heat sink has the side wall surfaces that face in a radially outward direction and are positioned around the centerline of the shaft.

17. The electronic circuit-integrated motor apparatus of claim 16, wherein:

the side wall surfaces are inclined such that a distance from the centerline of the shaft decreases with an increase in a distance from the end wall of the motor case.

18. The electronic circuit-integrated motor apparatus of claim 16, wherein:

the side wall surfaces are inclined such that a distance from the centerline of the shaft increases with an increase in a distance from the end wall of the motor case.

19. The electronic circuit-integrated motor apparatus of claim 1, wherein:

the semiconductor modules are disposed such that a line perpendicular to a semiconductor chip surface is perpendicular to the centerline of the shaft.

20. The electronic circuit-integrated motor apparatus of claim 1, wherein:

the heat sink is configured such that the side wall surfaces are inclined with respect to the centerline of the shaft.

21. The electronic circuit-integrated motor apparatus of claim 1, wherein:

the semiconductor modules are disposed such that heat dissipation surfaces thereof are in contact with the side wall surfaces of the heat sink.

22. The electronic circuit-integrated motor apparatus of claim 1, wherein:

at least a part of the heat sink includes side wall surfaces whose cross sections that are linear in a plane perpendicular to the centerline of the shaft.

23. The electronic circuit-integrated motor apparatus of claim 22, wherein:

the semiconductor modules are disposed such that the heat dissipation surfaces thereof are in contact with plane surfaces of the side wall surfaces of the heat sink.

24. The electronic circuit-integrated motor apparatus of claim 23, wherein:

the heat dissipation surfaces of the semiconductor modules are plane surfaces corresponding to the side wall surfaces of the heat sink.

25. The electronic circuit-integrated motor apparatus of claim 1, wherein:

each of the semiconductor modules includes a semiconductor chip that forms a semiconductor switching element corresponding to a particular-phase coil of the multi-phase coils.

26. The electronic circuit-integrated motor apparatus of claim 1, wherein:

a particular one of the semiconductor modules includes a semiconductor chip that forms a semiconductor switching element for protection against reverse connection.

27. The electronic circuit-integrated motor apparatus of claim 1, wherein:

a particular one of the semiconductor modules includes at least a part of a control circuit that controls the semiconductor chip.

28. The electronic circuit-integrated motor apparatus of claim 1, wherein:

the heat sink has the side wall surfaces that face in a radially inward direction and are positioned around the centerline of the shaft.

29. The electronic circuit-integrated motor apparatus of claim 28, wherein:

the side wall surfaces are inclined such that a distance from the centerline of the shaft increases with an increase in the distance from the end wall of the motor case.

30. The electronic circuit-integrated motor apparatus of claim 1, wherein:

the semiconductor modules are mounted on the end wall of the motor case at one side of the end wall, the one side being opposite to another side of the end wall, at which one end of the shaft extends outward from the motor case.

31. The electronic circuit-integrated motor apparatus of claim 1, wherein:

the semiconductor modules are mounted on the end wall of the motor case at a same side of the end wall, at which one end of the shaft extends outward from the motor case.

* * * * *